United States Patent
Murakami et al.

(10) Patent No.: US 11,206,049 B2
(45) Date of Patent: Dec. 21, 2021

(54) TRANSMISSION APPARATUS INCLUDING ENCODER, RECEPTION APPARATUS INCLUDING DECODER, AND ASSOCIATED METHODS

(71) Applicant: Panasonic Corporation, Osaka (JP)

(72) Inventors: Yutaka Murakami, Kanagawa (JP); Hisao Koga, Fukuoka (JP); Nobutaka Kodama, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 16/900,528

(22) Filed: Jun. 12, 2020

(65) Prior Publication Data

US 2020/0313700 A1 Oct. 1, 2020

Related U.S. Application Data

(63) Continuation of application No. 16/250,698, filed on Jan. 17, 2019, now Pat. No. 10,727,875, which is a (Continued)

(30) Foreign Application Priority Data

Mar. 2, 2009 (JP) ................................. 2009-048535

(51) Int. Cl.
*H03M 13/00* (2006.01)
*H03M 13/03* (2006.01)
(Continued)

(52) U.S. Cl.
CPC ..... *H03M 13/6516* (2013.01); *H03M 13/036* (2013.01); *H03M 13/1111* (2013.01);
(Continued)

(58) Field of Classification Search
CPC ......... H03M 13/1154; H03M 13/1148; H03M 13/1111; H03M 13/3723; H03M 13/255;
(Continued)

(56) References Cited

U.S. PATENT DOCUMENTS 6,658,381 B1 12/2003 Hellwig et al.
7,478,314 B1 1/2009 Cheong et al.
(Continued)

FOREIGN PATENT DOCUMENTS

CN 101073205 A 11/2007
JP 2004-514326 A 5/2004
(Continued)

OTHER PUBLICATIONS

Bates et al., "Low-Density Parity-Check Convolutional Codes for Ethernet Networks," 2005 IEEE Pacific Rim Conference on Communications, Computers and Signal Processing, Victoria, BC, Canada, pp. 85-88.
(Continued)

*Primary Examiner* — Shelly A Chase
(74) *Attorney, Agent, or Firm* — Seed IP Law Group LLP

(57) ABSTRACT

An encoder and decoder using LDPC-CC which avoid lowering the transmission efficiency of information while not deteriorating error correction performance, even at termination; and an encoding method of the same. A termination sequence length determining unit determines the sequence length of a termination sequence transmitted added to the end of an information sequence, according to the information length (information size) and encoding rate of the information sequence. A parity calculation unit carries out LDPC-CC coding on the information sequence and the known-information sequence necessary for generating a termination sequence of the determined termination sequence length, and calculates a parity sequence.

8 Claims, 42 Drawing Sheets

Related U.S. Application Data continuation of application No. 15/423,259, filed on Feb. 2, 2017, now Pat. No. 10,236,918, which is a continuation of application No. 14/698,758, filed on Apr. 28, 2015, now Pat. No. 9,602,142, which is a continuation of application No. 14/316,626, filed on Jun. 26, 2014, now Pat. No. 9,048,869, which is a continuation of application No. 13/254,435, filed as application No. PCT/JP2010/001099 on Feb. 19, 2010, now Pat. No. 8,819,528.

(51) Int. Cl.
H03M 13/37 (2006.01)
H04L 1/00 (2006.01)
H03M 13/11 (2006.01)
H03M 13/25 (2006.01)

(52) U.S. Cl.
CPC .... H03M 13/1148 (2013.01); H03M 13/1154 (2013.01); H03M 13/255 (2013.01); H03M 13/3723 (2013.01); H03M 13/6393 (2013.01); H04L 1/0009 (2013.01); H04L 1/0041 (2013.01); H04L 1/0045 (2013.01); H04L 1/0057 (2013.01); H04L 1/0058 (2013.01); H04L 1/0059 (2013.01)

(58) Field of Classification Search
CPC ......... H03M 13/6393; H03M 13/6516; H03M 13/036; H04L 1/0041; H04L 1/0045; H04L 1/0057; H04L 1/0058; H04L 1/0009; H04L 1/0059
See application file for complete search history.

(56) References Cited

U.S. PATENT DOCUMENTS

| | | | |
|---|---|---|---|
| 7,702,986 B2 | 4/2010 | Bjerke et al. | |
| 7,734,983 B2 | 6/2010 | Li | |
| 7,882,418 B2 | 2/2011 | Lee et al. | |
| 8,023,530 B1 | 9/2011 | Giallorenzi et al. | |
| 8,335,283 B1 | 12/2012 | Sun | |
| 8,370,700 B2 | 2/2013 | Xu et al. | |
| 8,423,876 B2 | 4/2013 | Okamura et al. | |
| 8,458,577 B2 | 6/2013 | Okamura et al. | |
| 8,488,692 B2 | 7/2013 | Imamura et al. | |
| 8,595,588 B2 | 11/2013 | Murakami | |
| 2001/0039636 A1 | 11/2001 | Hammons et al. | |
| 2002/0170016 A1 | 11/2002 | Inoue et al. | |
| 2003/0103481 A1 | 6/2003 | Heo et al. | |
| 2003/0126551 A1 | 7/2003 | Mantha | |
| 2003/0145273 A1 | 7/2003 | Hofman | |
| 2003/0185181 A1 | 10/2003 | Balachandran et al. | |
| 2004/0223473 A1 | 11/2004 | Ha et al. | |
| 2005/0013391 A1 | 1/2005 | Boer et al. | |
| 2005/0050435 A1 | 3/2005 | Kyung et al. | |
| 2005/0063495 A1 | 3/2005 | Aue | |
| 2005/0078765 A1* | 4/2005 | Jeong | H04L 1/0057 375/267 |
| 2005/0172197 A1 | 8/2005 | Chamberlain | |
| 2005/0204273 A1 | 9/2005 | Jeong et al. | |
| 2005/0283708 A1 | 12/2005 | Kyung et al. | |
| 2006/0036923 A1 | 2/2006 | Hedberg et al. | |
| 2006/0067432 A1 | 3/2006 | Thesling et al. | |
| 2006/0104341 A1 | 5/2006 | Magee et al. | |
| 2006/0176972 A1 | 8/2006 | Kim et al. | |
| 2006/0218459 A1 | 9/2006 | Hedberg | |
| 2007/0011567 A1 | 1/2007 | Choi et al. | |
| 2007/0101229 A1 | 5/2007 | Niu et al. | |
| 2007/0192670 A1 | 8/2007 | Ikeda et al. | |
| 2007/0283219 A1 | 12/2007 | Park et al. | |
| 2007/0286188 A1 | 12/2007 | Fan et al. | |
| 2008/0008083 A1 | 1/2008 | Stolpman et al. | |
| 2008/0049707 A1 | 2/2008 | Kwon et al. | |
| 2008/0049744 A1 | 2/2008 | Kim et al. | |
| 2008/0195913 A1* | 8/2008 | Bates | H03M 13/1105 714/752 |
| 2008/0204286 A1 | 8/2008 | Kose | |
| 2008/0256425 A1 | 10/2008 | Oh et al. | |
| 2008/0273490 A1 | 11/2008 | Sayana et al. | |
| 2008/0285491 A1 | 11/2008 | Parkvall et al. | |
| 2009/0031197 A1 | 1/2009 | Lu et al. | |
| 2009/0106625 A1 | 4/2009 | Jun et al. | |
| 2009/0122903 A1 | 5/2009 | Miyazaki et al. | |
| 2009/0185638 A1 | 7/2009 | Imamura et al. | |
| 2009/0249159 A1 | 10/2009 | Lee et al. | |
| 2009/0287981 A1 | 11/2009 | Kimura et al. | |
| 2010/0100795 A1 | 4/2010 | Yuan et al. | |
| 2010/0125764 A1 | 5/2010 | Kose | |
| 2010/0199153 A1 | 8/2010 | Okamura et al. | |
| 2010/0269009 A1 | 10/2010 | Okamura et al. | |
| 2011/0087948 A1 | 4/2011 | Murakami et al. | |
| 2011/0283162 A1 | 11/2011 | Murakami | |

FOREIGN PATENT DOCUMENTS

| | | |
|---|---|---|
| JP | 2009-170952 A | 7/2009 |
| WO | 2006/062351 A1 | 6/2006 |
| WO | 2008/092040 A2 | 7/2008 |
| WO | 2009/008182 A1 | 1/2009 |

OTHER PUBLICATIONS

Bates et al., "Termination Sequence Generation Circuits for Low-Density Parity-Check Convolutional Codes," *IEEE Transactions on Circuits and Systems—1: Regular Papers* 53(9):1909-1917, Sep. 2006.

Bimberg et al., "A High-Throughput Programmable Decoder for LDPC Convolutional Codes," *IEEE*, pp. 239-246, 2007.

Chen et al., "Reduced-Complexity Decoding of LDPC Codes," IEEE Globecom, San Antonio, TX, 2001, IEEE Intl. Symp. Info. Theory, Lausanna, Switzerland, 2002, and the IEEE Globecom, Taipei, China, 2002, 31 pages.

Chen et al., "Efficient Encoding and Termination of Low-Density Parity-Check Convolutional Codes," IEEE Globecom 2006, San Francisco, CA, 5 pages.

Chen et al., "Efficient Implementation of Low-Density Parity-Check Convolutional Codes Encodes With Built-In Termination," *IEEE Transactions on Circuits and Systems—1: Regular Papers* 55(11):3628-3640, Dec. 2008.

English Translation of Chinese Search Report, dated Dec. 4, 2013, for corresponding Chinese Patent Application No. 201080010004.8, 2 pages.

Extended European Search Report, dated Jun. 4, 2013, for corresponding European Application No. 10748451.1-1906/2405583, 7 pages.

Fan, "Array Codes as Low-Density Parity-Check Codes," 2nd International Symposium on Turbo Codes & Related Topics, Brest, France, 2000, 4 pages.

Felström et al., "Time-Varying Periodic Convolutional Codes With Low-Density Parity-Check Matrix," *IEEE Transactions on Information Theory* 45(6):2181-2191, 1999.

Fossorier et al., "Reduced Complexity Iterative Decoding of Low-Density Parity Check Codes Based on Belief Propagation," *IEEE Transactions on Communications* 47(5):673-680, 1999.

Fossorier et al., "Quasi-Cyclic Low-Density Parity-Check Codes From Circulant Permutation Matrices," *IEEE Transactions on Information Theory* 50(8):1788-1793, 2004.

Gallager, "Low-Density Parity-Check Codes," *IRE Transactions on Information Theory*:21-28, 1962.

Kishigami et al., "Rate Compatible LDPC-Convolutional Codes for the Change Request to 802.16m SDD," IEEE 802.16 Broadband Wireless Access Working Group, submitted Feb. 27, 2009, 6 pages.

Kishigami et al. "LDPC-Convolutional Codes for IEEE 802.16m FEC Scheme," IEEE 802.16 Broadband Wireless Access Working Group, submitted Jan. 16, 2008, 6 pages.

(56) References Cited

OTHER PUBLICATIONS

Lin et al., *Error Control Coding—Fundamentals and Applications*, 2d ed., Pearson Education International, New Jersey, 2004, pp. 538-545. (10 pages).
MacKay, "Good Error-Correcting Codes based on Very Sparse Matrices," to appear in *IEEE Transactions on Information Theory*, Jan. 1999, revised version completed and accepted for publication Jul. 27, 1998, 55 pages.
Matsushita Electric Industrial Co. Ltd., ACN Advanced Communications Networks SA, "G.hn: Two-mode support using low density parity check—convolutional codes (LDPC-CCs)," ITU Telecommunications Standardization Sector, Study Group 15, Temporary Document 08AB-126, Antwerp, Belgium, Jun. 16-20, 2008, 8 pages.
Wadayama, "Low Density Parity Check Codes," Triceps, 2002, 9 pages. (with English Translation).
Zhang et al., "Shuffled Iterative Decoding," *IEEE Transactions On Communications* 53(2):209-213, 2005.

\* cited by examiner $$\mathbf{H}^T_{[0,n]} = \begin{pmatrix} h_1^{(0)}(0) & h_1^{(1)}(1) & \cdots & h_1^{(M)}(M) & 0 & \cdots & 0 & \cdots & 0 \\ h_2^{(0)}(0) & h_2^{(1)}(1) & \cdots & h_2^{(0)}(M) & 0 & \cdots & 0 & & \vdots \\ 0 & h_1^{(0)}(1) & \cdots & \vdots & h_1^{(M)}(M+1) & \cdots & & & h_1^{(M)}(n) \\ 0 & h_2^{(0)}(1) & \cdots & \vdots & h_2^{(M)}(M+1) & \cdots & & & h_2^{(M)}(n) \\ & 0 & \cdots & \vdots & \cdots & & & & \vdots \\ & & \ddots & \ddots & & & & & 0 \\ & & & \ddots & \ddots & & & & h_2^{(0)}(n) \end{pmatrix}$$

FIG. 1

$$H = \begin{bmatrix} 00000000 & H1 & 110000000000000000000000000000000000000000000000000000000000000000000000 \\ 000000000000 & H2 & 11000000000000000000000000000000000000000000000000000000000000000000 \\ 0000000000000000 & H3 & 110000000000000000000000000000000000000000000000000000000000000000 \\ 00000000000000000000 & H4 & 11000000000000000000000000000000000000000000000000000000000000 \\ \vdots & \vdots & \vdots \\ 000000000000000000000000 & Hm & 110000000000000000000000000000000000000000000000000000000000 \\ & & \vdots \\ \end{bmatrix}$$

FIG.3

⌈CHECK EQUATION #1⌋

$(D^2+D^1+1)X(D)+(D^2+D^1+1)P(D)=0$ $H_1=$ 11 11 11

⌈CHECK EQUATION #2⌋

$(D^5+D^1+1)X(D)+(D^5+D^1+1)P(D)=0$ $H_2=$ 11 00 00 00 11 11

⌈CHECK EQUATION #3⌋

$(D^4+D^2+1)X(D)+(D^4+D^2+1)P(D)=0$ $H_3=$ 11 00 11 00 11

H =

6510 — 11
6503 — 11 00 11
6502 — 11 11 11 11
6501 — 11 00 00 00 11 11
6507 — 11 00 11 00 11

6508 — 11 11 11
6504, 6505 — 11 00 00 00 11 11
6509 — 11 00 11 00 11
6512, 6511
6506

CHECK EQUATION #1
CHECK EQUATION #2
CHECK EQUATION #3
CHECK EQUATION #1
CHECK EQUATION #2
CHECK EQUATION #3
CHECK EQUATION #1
CHECK EQUATION #2
CHECK EQUATION #3

FIG.4A

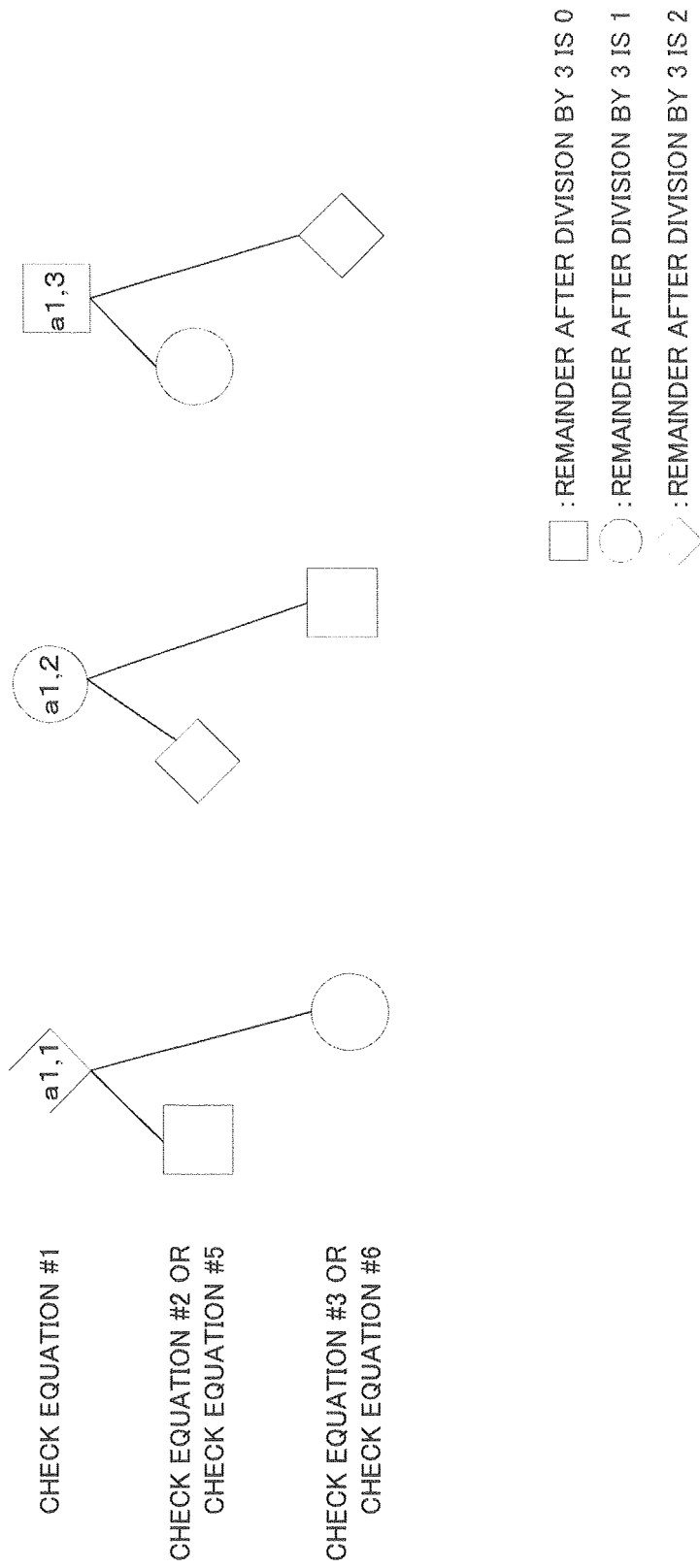

GENERATING POLYNOMIAL $$G = \begin{bmatrix} 1 & (D^2+1)/(D^2+D+1) \end{bmatrix}$$

PARITY CHECK POLYNOMIAL $$(D^2+1)X(D)+(D^2+D+1)P(D)=0$$

PARITY CHECK MATRIX H=

```
110000000000000000000000000000000...
011100000000000000000000000000000...
110111000000000000000000000000000...
001101110000000000000000000000000...
000011011100000000000000000000000...
000000110111000000000000000000000...
000000001101110000000000000000000...
000000000011011100000000000000000...
000000000000110111000000000000000...
000000000000001101110000000000000...
```

TRANSMISSION SEQUENCE $w_i = (x_i, p_i)$

TRANSMISSION VECTOR $w = (x1, p1, x2, p2, x3, p3, x4, p4, x5, p5, \ldots, x_i, p_i, \ldots)^T$ $Hw = 0$

| CODING RATE $R=(n-1)/n$ | Termination number (Information size=512bits) | Termination number (Information size=1024bits) | Termination number (Information size=2048bits) | Termination number (Information size=4096bits) | Termination number (Information size=6144bits) | Termination number (Information size=8192bits) |
|---|---|---|---|---|---|---|
| 1/2 | 380 (Real R=0.3646) | 340 (Real R=0.4288) | 340 (Real R=0.4616) | 340 (Real R=0.4800) | 340 (Real R=0.4865) | 340 (Real R=0.4898) |
| 2/3 | 460 (Real R=0.4169) | 500 (Real R=0.5029) | 420 (Real R=0.5864) | 340 (Real R=0.6317) | 340 (Real R=0.6429) | 340 (Real R=0.6487) |
| 3/4 | 400 (Real R=0.4729) | 420 (Real R=0.5735) | 420 (Real R=0.6500) | 340 (Real R=0.7060) | 340 (Real R=0.7201) | 340 (Real R=0.7273) |
| 4/5 | 400 (Real R=0.4923) | 540 (Real R=0.5626) | 540 (Real R=0.6606) | 470 (Real R=0.7327) | 340 (Real R=0.7660) | 340 (Real R=0.7743) |

FIG.21

| CODING RATE R=(n-1)/n | Termination number (Information size=2048bits) | Termination number (Information size=2304bits) | Termination number (Information size=2560bits) | Termination number (Information size=3072bits) | Termination number (Information size=4096bits) | Termination number (Information size=4608bits) | Termination number (Information size=5120bits) | Termination number (Information size=6144bits) |
|---|---|---|---|---|---|---|---|---|
| 1/2 | 440 Real R=0.4514 | 440 Real R=0.4564 | 440 Real R=0.4604 | 440 Real R=0.4665 | 440 Real R=0.4745 | 440 Real R=0.4772 | 440 Real R=0.4794 | 440 Real R=0.4827 |
| 2/3 | 540 Real R=0.5669 | 420 Real R=0.5944 | 380 Real R=0.6066 | 380 Real R=0.6158 | 380 Real R=0.6278 | 380 Real R=0.6319 | 380 Real R=0.6352 | 380 Real R=0.6402 |
| 3/4 | 540 Real R=0.6261 | 460 Real R=0.6523 | 380 Real R=0.6748 | 380 Real R=0.6863 | 380 Real R=0.7012 | 380 Real R=0.7063 | 380 Real R=0.7104 | 380 Real R=0.7167 |
| 4/5 | 680 Real R=0.6320 | 620 Real R=0.6582 | 620 Real R=0.6701 | 620 Real R=0.6887 | 620 Real R=0.7135 | 560 Real R=0.7291 | 380 Real R=0.7551 | 380 Real R=0.7622 |

FIG.22

| Coding rate | Number of Transmission Bits for Tail - bit Coding | |
|---|---|---|
| 1/2 | $m_t = 440$ bits | |
| 2/3 | $I_s \leq 2303$ | : $m_t = 540$ bits |
| | $2304 \leq I_s \leq 2559$ | : $m_t = 420$ bits |
| | $2560 \leq I_s$ | : $m_t = 380$ bits |
| 3/4 | $I_s \leq 2303$ | : $m_t = 540$ bits |
| | $2304 \leq I_s \leq 2559$ | : $m_t = 460$ bits |
| | $2560 \leq I_s$ | : $m_t = 380$ bits |
| 4/5 | $I_s \leq 2303$ | : $m_t = 680$ bits |
| | $2304 \leq I_s \leq 4607$ | : $m_t = 620$ bits |
| | $4608 \leq I_s \leq 5119$ | : $m_t = 560$ bits |
| | $5120 \leq I_s$ | : $m_t = 380$ bits |

FIG.23

| CODING RATE R=(n-1)/n | Termination number (Information size=512bits) | Termination number (Information size=1024bits) | Termination number (Information size=2048bits) | Termination number (Information size=4096bits) | Termination number (Information size=6144bits) | Termination number (Information size=8192bits) |
|---|---|---|---|---|---|---|
| 1/2 | 380 (Real R=0.3646) | 340 (Real R=0.4288) | 340 (Real R=0.4616) | 340 (Real R=0.4800) | 340 (Real R=0.4865) | 340 (Real R=0.4898) |
| 2/3 | 460 (Real R=0.4169) | 500 (Real R=0.5029) | 420 (Real R=0.5864) | 340 (Real R=0.6317) | 340 (Real R=0.6429) | 340 (Real R=0.6487) |
| 3/4 | 400 (Real R=0.4729) | 420 (Real R=0.5735) | 420 (Real R=0.6500) | 340 (Real R=0.7060) | 340 (Real R=0.7201) | 340 (Real R=0.7273) |
| 4/5 | 400 (Real R=0.4923) | 540 (Real R=0.5626) | 540 (Real R=0.6606) | 470 (Real R=0.7327) | 340 (Real R=0.7660) | 340 (Real R=0.7743) |

FIG.31

| CODING RATE $R=(n-1)/n$ | Information size=512bits | Information size=1024bits | Information size=2048bits | Information size=4096bits | Information size=6144bits | Information size=8192bits |
|---|---|---|---|---|---|---|
| 1/2 | UNSUPPORTED, ADJUST TO R=2/3 | SUPPORTED | SUPPORTED | SUPPORTED | SUPPORTED | SUPPORTED |
| 2/3 | SUPPORTED | SUPPORTED | SUPPORTED | SUPPORTED | SUPPORTED | SUPPORTED |
| 3/4 | SUPPORTED | SUPPORTED | SUPPORTED | SUPPORTED | SUPPORTED | SUPPORTED |
| 4/5 | UNSUPPORTED, ADJUST TO R=3/4 | UNSUPPORTED, ADJUST TO R=3/4 | UNSUPPORTED, ADJUST TO R=3/4 | SUPPORTED | SUPPORTED | SUPPORTED |

FIG.33

TRANSMISSION APPARATUS INCLUDING ENCODER, RECEPTION APPARATUS INCLUDING DECODER, AND ASSOCIATED METHODS

BACKGROUND

Technical Field

The present invention relates to an encoder, decoder and encoding method using a low-density parity-check convolutional code (LDPC-CC) supporting a plurality of coding rates.

Description of the Related Art

In recent years, attention has been attracted to a low-density parity-check (LDPC) code as an error correction code that provides high error correction capability with a feasible circuit scale. Because of its high error correction capability and ease of implementation, an LDPC code has been adopted in an error correction coding scheme for IEEE802.11n high-speed wireless LAN systems, digital broadcasting systems, and so forth.

An LDPC code is an error correction code defined by low-density parity check matrix H. An LDPC code is a block code having a block length equal to number of columns N of parity check matrix H. For example, Non-Patent Literature 1, Non-Patent Literature 2, Non-Patent Literature 3 and Non-Patent Literature 4 propose a random LDPC code, array LDPC code and QC-LDPC code (QC: Quasi-Cyclic).

However, a characteristic of many current communication systems is that transmission information is collectively transmitted per variable-length packet or frame, as in the case of Ethernet (registered trademark). A problem with applying an LDPC code, which is a block code, to a system of this kind is, for example, how to make a fixed-length LDPC code block correspond to a variable-length Ethernet (registered trademark) frame. With IEEE802.11n, the length of a transmission information sequence and an LDPC code block length are adjusted by executing padding processing or puncturing processing on a transmission information sequence, but it is difficult to avoid a change in the coding rate and redundant sequence transmission due to padding or puncturing.

In contrast to this kind of LDPC code of block code (hereinafter referred to as "LDPC-BC: Low-Density Parity-Check Block Code"), LDPC-CC (Low-Density Parity-Check Convolutional Code) allowing encoding and decoding of information sequences of arbitrary length have been investigated (see Non-Patent Literature 1 and Non-Patent Literature 2, for example).

An LDPC-CC is a convolutional code defined by a low-density parity-check matrix, and, as an example, parity check matrix $H^T[0,n]$ of an LDPC-CC in a coding rate of R=1/2 (=b/c) is shown in FIG. 1. Here, element $h_1^{(m)}(t)$ of $H^T[0,n]$ has a value of 0 or 1. All elements other than $h_1^{(m)}(t)$ are 0. M represents the LDPC-CC memory length, and n represents the length of an LDPC-CC codeword. As shown in FIG. 1, a characteristic of an LDPC-CC parity check matrix is that it is a parallelogram-shaped matrix in which 1 is placed only in diagonal terms of the matrix and neighboring elements, and the bottom-left and top-right elements of the matrix are zero.

An LDPC-CC encoder defined by parity check matrix $H^T[0,n]$ when $h_1^{(0)}(t)=1$ and $h_2^{(0)}(t)=1$ here is represented by FIG. 2. As shown in FIG. 2, an LDPC-CC encoder is composed of M+1 shift registers of bit-length c and a modulo 2 adder (exclusive OR calculator). Consequently, a characteristic of an LDPC-CC encoder is that it can be implemented with extremely simple circuitry in comparison with a circuit that performs generator matrix multiplication or an LDPC-BC encoder that performs computation based on backward (forward) substitution. Also, since the encoder in FIG. 2 is a convolutional code encoder, it is not necessary to divide an information sequence into fixed-length blocks when encoding, and an information sequence of any length can be encoded.

CITATION LIST

Non-Patent Literature

NPL 1 R. G. Gallager, "Low-density parity check codes," IRE Trans. Inform. Theory, IT-8, pp-21-28, 1962.

NPL 2 D. J. C. Mackay, "Good error-correcting codes based on very sparse matrices," IEEE Trans. Inform. Theory, vol. 45, no. 2, pp 399-431, March 1999.

NPL 3 J. L. Fan, "Array codes as low-density parity-check codes," proc. of 2nd Int. Symp. on Turbo Codes, pp. 543-546, September 2000.

NPL 4 M. P. C. Fossorier, "Quasi-cyclic low-density parity-check codes from circulant permutation matrices," IEEE Trans. Inform. Theory, vol. 50, no. 8, pp. 1788-1793, November 2001.

NPL 5 M. P. C. Fossorier, M. Mihaljevic, and H. Imai, "Reduced complexity iterative decoding of low density parity check codes based on belief propagation," IEEE Trans. Commun., vol. 47, no. 5, pp. 673-680, May 1999.

NPL 6 J. Chen, A. Dholakia, E. Eleftheriou, M. P. C. Fossorier, and X.-Yu Hu, "Reduced-complexity decoding of LDPC codes," IEEE Trans. Commun., vol. 53, no. 8, pp. 1288-1299, August 2005.

NPL 7 J. Zhang, and M. P. C. Fossorier, "Shuffled iterative decoding," IEEE Trans. Commun., vol. 53, no. 2, pp. 209-213, February 2005.

NPL 8 S. Lin, D. J. Jr., Costello, "Error control coding: Fundamentals and applications," Prentice-Hall.

NPL 9 Tadashi Wadayama, "Low-Density Parity-Check Code and the decoding method", Triceps

BRIEF SUMMARY

Technical Problem

However, an LDPC-CC, LDPC-CC encoder and LDPC-CC decoder for supporting a plurality of coding rates in a low computational complexity and providing data of good received quality have not been sufficiently investigated.

For example, Non-Patent Literature 8 discloses using puncturing to support a plurality of coding rates. To support a plurality of coding rates using puncturing, first, a basic code (i.e. mother code) is prepared to generate a coding sequence in the mother code and then select non-transmission bits (i.e. puncturing bits) from the coding sequence. Further, by changing the number of non-transmission bits, a plurality of coding rates are supported. By this means, it is possible to support all coding rates by the encoder and decoder (i.e. mother code encoder and decoder), so that it is possible to provide an advantage of reducing the computational complexity (i.e. circuit scale).

In contrast, as a method of supporting a plurality of coding rates, there is a method of providing different codes (i.e. distributed codes) every coding rate. Especially, as disclosed in Non-Patent Literature 8, an LDPC code has a flexibility of being able to provide various code lengths and coding rates easily, and therefore it is a general method to support a plurality of coding rates by a plurality of codes. In this case, although a use of a plurality of codes has a disadvantage of providing a large computational complexity (i.e. circuit scale), compared to a case where a plurality of coding rates are supported by puncturing, there is an advantage of providing data of excellent received quality.

In view of the above, there are few documents that argue a method of generating an LDPC code that can maintain the received quality of data by preparing a plurality of codes to support a plurality of coding rates, while reducing the computational complexity of the encoder and decoder. If a method of providing an LDPC code to realize this is established, it is possible to improve the received quality of data and reduce the computational complexity at the same time, which has been difficult to realize.

Furthermore, an LDPC-CC is a class of a convolutional code, and therefore requires, for example, termination or tail-biting to secure belief in decoding of information bits. However, studies on an LDPC-CC capable of minimizing the number of terminations while securing receiving quality of data, and an encoder and decoder thereof have not been carried out sufficiently.

It is therefore an object of the present invention to provide an encoder, decoder and encoding method that can prevent, even when performing termination with the encoder and decoder using an LDPC-CC, error correction capability from deteriorating and prevent information transmission efficiency from deteriorating.

Solution to Problem

The encoder of the present invention is an encoder that performs LDPC-CC coding and adopts a configuration including a determining section that determines a sequence length of a termination sequence transmitted by being added at a rear end of an information sequence according to an information length and coding rate of the information sequence and a computing section that applies LDPC-CC coding to the information sequence and a known information sequence necessary to generate the termination sequence of the determined sequence length, and computes a parity sequence.

The decoder of the present invention is a decoder that decodes an LDPC-CC using belief propagation and adopts a configuration including an acquiring section that acquires a coding rate and a sequence length of a termination sequence transmitted by being added at a rear end of an information sequence and a decoding section that performs belief propagation decoding on the information sequence based on the coding rate and the termination sequence length.

The encoding method of the present invention determines a sequence length of a termination sequence transmitted by being added at a rear end of an information sequence according to an information length and coding rate of the information sequence, applies LDPC-CC coding to the information sequence and a known information sequence necessary to generate the termination sequence of the determined sequence length, and computes a parity sequence.

Advantageous Effects of Invention

The encoder, decoder and encoding method of the present invention can prevent, even when performing termination, error correction capability from deteriorating and prevent information transmission efficiency from deteriorating.

BRIEF DESCRIPTION OF THE SEVERAL VIEWS OF THE DRAWINGS

FIG. 1 shows an LDPC-CC parity check matrix;

FIG. 3 shows an example of the configuration of an LDPC-CC parity check matrix of a time varying period of 4;

FIG. 4A shows parity check polynomials of an LDPC-CC of a time varying period of 3 and the configuration of parity check matrix H of this LDPC-CC;

FIG. 4C shows the belief propagation relationship of terms relating to X(D) of "check equation #1" to "check equation #6";

FIG. 5 shows a parity check matrix of a (7, 5) convolutional code;

FIG. 6 shows an example of the configuration of parity check matrix H about an LDPC-CC of a coding rate of 2/3 and a time varying period of 2;

FIG. 21 is a diagram showing an example of the relationship between the information size and the termination number;

FIG. 22 is a diagram showing another example of the relationship between the information size and the termination number;

FIG. 23 is a diagram showing an example of the relationship between the information size and the termination number;

FIG. 31 is a diagram showing an example of the table of correspondence between the information size and the termination number;

FIG. 33 is a diagram showing a table of correspondence between the information size and supported coding rates;

DETAILED DESCRIPTION

Figure 2:
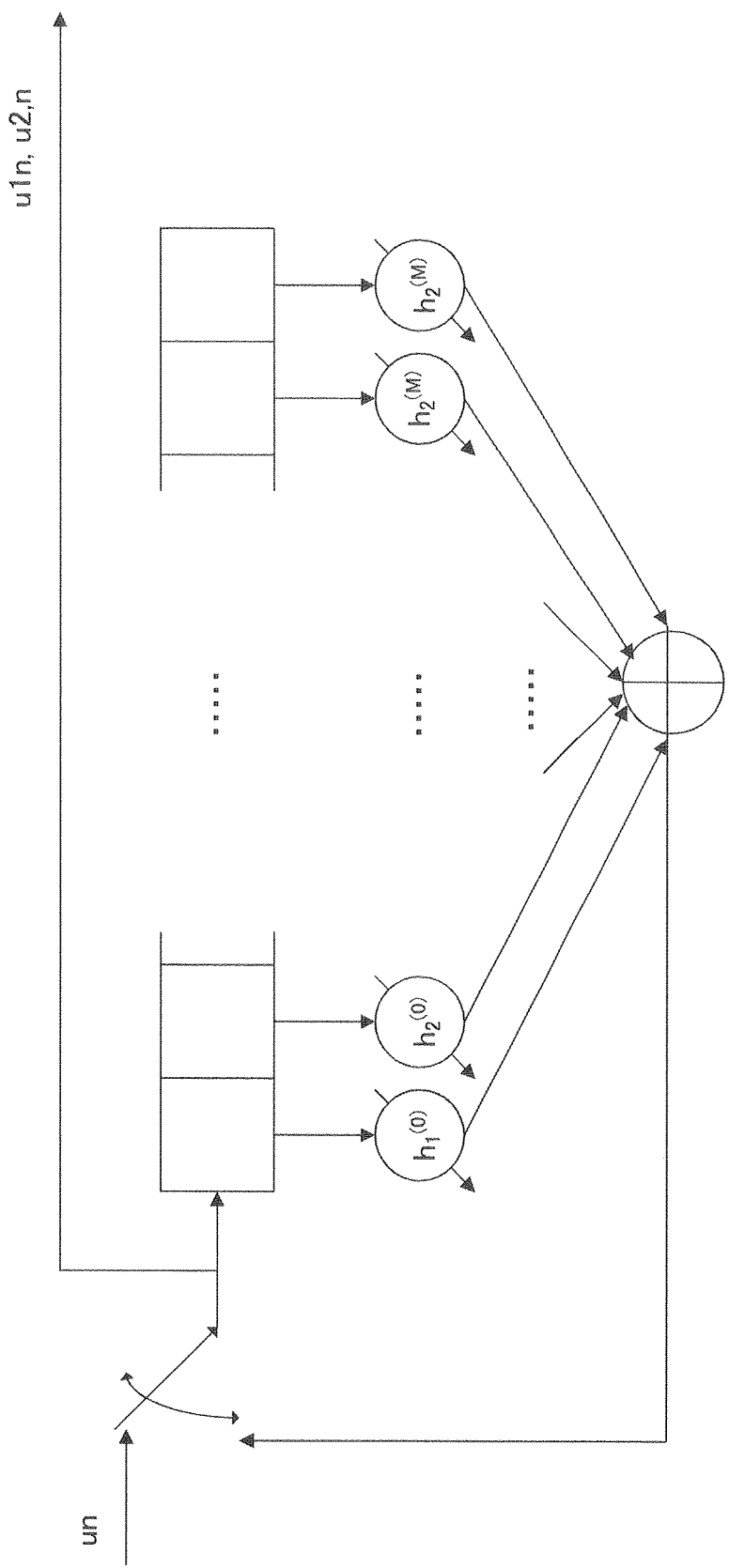
FIG. 2 shows a configuration of an LDPC-CC encoder.

Now, embodiments of the present invention will be described in detail with reference to the accompanying drawings

Embodiment 1

First, the present embodiment will describe an LDPC-CC with good characteristics.

(LDPC-CC of Good Characteristics)

An LDPC-CC of a time varying period of g with good characteristics is described below.

First, an LDPC-CC of a time varying period of 4 with good characteristics will be described. A case in which the coding rate is 1/2 is described below as an example.

Consider equations 1-1 to 1-4 as parity check polynomials of an LDPC-CC for which the time varying period is 4. At this time, $X(D)$ is a polynomial representation of data (information) and $P(D)$ is a parity polynomial representation. Here, in equations 1-1 to 1-4, parity check polynomials have been assumed in which there are four terms in $X(D)$ and $P(D)$ respectively, the reason being that four terms are desirable from the standpoint of obtaining good received quality.

[1]

$$(D^{a1}+D^{a2}+D^{a3}+D^{a4})X(D)+(D^{b1}+D^{b2}+D^{b3}+D^{b4})P(D)=0 \quad \text{(Equation 1-1)}$$

$$(D^{A1}+D^{A2}+D^{A3}+D^{A4})X(D)+(D^{B1}+D^{B2}+D^{B3}+D^{B4})P(D)=0 \quad \text{(Equation 1-2)}$$

$$(D^{\alpha1}+D^{\alpha2}+D^{\alpha3}+D^{\alpha4})X(D)+(D^{\beta1}+D^{\beta2}+D^{\beta3}+D^{\beta4})P(D)=0 \quad \text{(Equation 1-3)}$$

$$(D^{E1}+D^{E2}+D^{E3}+D^{E4})X(D)+(D^{F1}+D^{F2}+D^{F3}+D^{F4})P(D)=0 \quad \text{(Equation 1-4)}$$

In equation 1-1, it is assumed that a1, a2, a3 and a4 are integers (where a1≠a2≠a3≠a4, and a1 to a4 are all mutually different). Use of the notation "X≠Y≠ . . . ≠Z" is assumed to express the fact that X, Y, . . . , Z are all mutually different. Also, it is assumed that b1, b2, b3 and b4 are integers (where b1≠b2≠b3≠b4). A parity check polynomial of equation 1-1 is called "check equation #1," and a sub-matrix based on the parity check polynomial of equation 1-1 is designated first sub-matrix H1.

In equation 1-2, it is assumed that A1, A2, A3, and A4 are integers (where A1≠A2≠A3≠A4). Also, it is assumed that B1, B2, B3, and B4 are integers (where B1≠B2≠B3≠B4). A parity check polynomial of equation 1-2 is called "check equation #2," and a sub-matrix based on the parity check polynomial of equation 1-2 is designated second sub-matrix $H_2$.

In equation 1-3, it is assumed that α1, α2, α3, and α4 are integers (where α1≠α2≠α3≠α4). Also, it is assumed that β1, β2, β3, and β4 are integers (where β1≠β2≠β4). A parity check polynomial of equation 1-3 is called "check equation #3," and a sub-matrix based on the parity check polynomial of equation 1-3 is designated third sub-matrix $H_3$.

In equation 1-4, it is assumed that E1, E2, E3, and E4 are integers (where E1≠E2≠E3≠E4). Also, it is assumed that F1, F2, F3, and F4 are integers (where F1≠F2≠F3≠F4). A parity check polynomial of equation 1-4 is called "check equation #4," and a sub-matrix based on the parity check polynomial of equation 1-4 is designated fourth sub-matrix H4.

Next, an LDPC-CC of a time varying period of 4 is considered that generates a parity check matrix such as shown in FIG. 3 from first sub-matrix $H_1$, second sub-matrix $H_2$, third sub-matrix $H_3$, and fourth sub-matrix $H_4$.

At this time, if k is designated as a remainder after dividing the values of combinations of orders of X(D) and P(D), (a1, a2, a3, a4), (b1, b2, b3, b4), (A1, A2, A3, A4), (B1, B2, B3, B4), (α1, α2, α3, α4), (β1, β2, β3, β4), (E1, E2, E3, E4), (F1, F2, F3, F4), in equations 1-1 to 1-4 by 4, provision is made for one each of remainders 0, 1, 2, and 3 to be included in four-coefficient sets represented as shown above (for example, (a1, a2, a3, a4)), and to hold true for all the above four-coefficient sets.

For example, if orders (a1, a2, a3, a4) of X(D) of "check equation #1" are set as (a1, a2, a3, a4)=(8, 7, 6, 5), remainders k after dividing orders (a1, a2, a3, a4) by 4 are (0, 3, 2, 1), and one each of 0, 1, 2 and 3 are included in the four-coefficient set as remainders k. Similarly, if orders (b1, b2, b3, b4) of P(D) of "check equation #1" are set as (b1, b2, b3, b4)=(4, 3, 2, 1), remainders k after dividing orders (b1, b2, b3, b4) by 4 are (0, 3, 2, 1), and one each of 0, 1, 2 and 3 are included in the four-coefficient set as remainders k. It is assumed that the above condition about "remainder" also holds true for the four-coefficient sets of X(D) and P(D) of the other parity check equations ("check equation #2," "check equation #3" and "check equation #4").

By this means, the column weight of parity check matrix H configured from equations 1-1 to 1-4 becomes 4 for all columns, which enables a regular LDPC code to be formed. Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is 4, an LDPC-CC offering good reception performance can be obtained by generating an LDPC-CC as described above.

Table 1 shows examples of LDPC-CCs (LDPC-CCs #1 to #3) of a time varying period of 4 and a coding rate of 1/2 for which the above condition about "remainder" holds true. In table 1, LDPC-CCs of a time varying period of 4 are defined by four parity check polynomials: "check polynomial #1," "check polynomial #2," "check polynomial #3," and "check polynomial #4."

TABLE 1

| Code | Parity check polynomial |
| --- | --- |
| LDPC-CC #1 of a time varying period of 4 and a coding rate of 1/2 | Check polynomial #1:<br>$(D^{458} + D^{435} + D^{341} + 1)X(D) + (D^{598} + D^{373} + D^{67} + 1)P(D) = 0$<br>Check polynomial #2:<br>$(D^{287} + D^{213} + D^{130} + 1)X(D) + (D^{545} + D^{542} + D^{103} + 1)P(D) = 0$<br>Check polynomial #3:<br>$(D^{557} + D^{495} + D^{326} + 1)X(D) + (D^{561} + D^{502} + D^{351} + 1)P(D) = 0$<br>Check polynomial #4:<br>$(D^{426} + D^{329} + D^{99} + 1)X(D) + (D^{321} + D^{55} + D^{42} + 1)P(D) = 0$ |
| LDPC-CC #2 of a time varying period of 4 and a coding rate of 1/2 | Check polynomial #1:<br>$(D^{503} + D^{454} + D^{49} + 1)X(D) + (D^{569} + D^{467} + D^{402} + 1)P(D) = 0$<br>Check polynomial #2:<br>$(D^{518} + D^{473} + D^{203} + 1)X(D) + (D^{598} + D^{499} + D^{145} + 1)P(D) = 0$<br>Check polynomial #3:<br>$(D^{403} + D^{397} + D^{62} + 1)X(D) + (D^{294} + D^{267} + D^{69} + 1)P(D) = 0$<br>Check polynomial #4:<br>$(D^{483} + D^{385} + D^{94} + 1)X(D) + (D^{426} + D^{415} + D^{413} + 1)P(D) = 0$ |
| LDPC-CC #3 of a time varying period of 4 and a coding rate of 1/2 | Check polynomial #1:<br>$(D^{454} + D^{447} + D^{17} + 1)X(D) + (D^{494} + D^{237} + D^{7} + 1)P(D) = 0$<br>Check polynomial #2:<br>$(D^{583} + D^{545} + D^{506} + 1)X(D) + (D^{325} + D^{71} + D^{66} + 1)P(D) = 0$<br>Check polynomial #3:<br>$(D^{430} + D^{425} + D^{407} + 1)X(D) + (D^{582} + D^{47} + D^{45} + 1)P(D) = 0$<br>Check polynomial #4:<br>$(D^{434} + D^{353} + D^{127} + 1)X(D) + (D^{345} + D^{207} + D^{38} + 1)P(D) = 0$ |

In the above description, a case in which the coding rate is 1/2 has been described as an example, but a regular LDPC code is also formed and good received quality can be obtained when the coding rate is (n−1)/n if the above condition about "remainder" holds true for four-coefficient sets in information X1(D), X2(D), . . . , Xn−1(D).

In the case of a time varying period of 2, also, it has been confirmed that a code with good characteristics can be found if the above condition about "remainder" is applied. An LDPC-CC of a time varying period of 2 with good characteristics is described below. A case in which the coding rate is 1/2 is described below as an example.

Consider equations 2-1 and 2-2 as parity check polynomials of an LDPC-CC for which the time varying period is 2. At this time, X(D) is a polynomial representation of data (information) and P(D) is a parity polynomial representation. Here, in equations 2-1 and 2-2, parity check polynomials have been assumed in which there are four terms in X(D) and P(D) respectively, the reason being that four terms are desirable from the standpoint of obtaining good received quality.

[2]

$$(D^{a1}+D^{a2}+D^{a3}+D^{a4})X(D)+(D^{b1}+D^{b2}+D^{b3}+D^{b4})P(D)=0 \quad \text{(Equation 2-1)}$$

$$(D^{A1}+D^{A2}+D^{A3}+D^{A4})X(D)+(D^{B1}+D^{B2}+D^{B3}+D^{B4})P(D)=0 \quad \text{(Equation 2-2)}$$

In equation 2-1, it is assumed that a1, a2, a3, and a4 are integers (where a1≠a2≠a3≠a4). Also, it is assumed that b1, b2, b3, and b4 are integers (where b1≠b2≠b3≠b4). A parity check polynomial of equation 2-1 is called "check equation #1," and a sub-matrix based on the parity check polynomial of equation 2-1 is designated first sub-matrix $H_1$.

In equation 2-2, it is assumed that A1, A2, A3, and A4 are integers (where A1≠A2≠A3≠A4). Also, it is assumed that B1, B2, B3, and B4 are integers (where B1≠B2≠B3≠B4). A parity check polynomial of equation 2-2 is called "check equation #2," and a sub-matrix based on the parity check polynomial of equation 2-2 is designated second sub-matrix $H_2$.

Next, an LDPC-CC of a time varying period of 2 generated from first sub-matrix $H_1$ and second sub-matrix $H_2$ is considered.

At this time, if k is designated as a remainder after dividing the values of combinations of orders of X(D) and P(D), (a1, a2, a3, a4), (b1, b2, b3, b4), (A1, A2, A3, A4), (B1, B2, B3, B4), in equations 2-1 and 2-2 by 4, provision is made for one each of remainders 0, 1, 2, and 3 to be included in four-coefficient sets represented as shown above (for example, (a1, a2, a3, a4)), and to hold true for all the above four-coefficient sets.

For example, if orders (a1, a2, a3, a4) of X(D) of "check equation #1" are set as (a1, a2, a3, a4)=(8, 7, 6, 5), remainders k after dividing orders (a1, a2, a3, a4) by 4 are (0, 3, 2, 1), and one each of 0, 1, 2 and 3 are included in the four-coefficient set as remainders k. Similarly, if orders (b1, b2, b3, b4) of P(D) of "check equation #1" are set as (b1, b2, b3, b4)=(4, 3, 2, 1), remainders k after dividing orders (b1, b2, b3, b4) by 4 are (0, 3, 2, 1), and one each of 0, 1, 2 and 3 are included in the four-coefficient set as remainders k. It is assumed that the above condition about "remainder" also holds true for the four-coefficient sets of X(D) and P(D) of "check equation #2."

By this means, the column weight of parity check matrix H configured from equations 2-1 and 2-2 becomes 4 for all columns, which enables a regular LDPC code to be formed.

Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is 8, an LDPC-CC enabling reception performance to be further improved can be obtained by generating an LDPC-CC as described above.

Table 2 shows examples of LDPC-CCs (LDPC-CCs #1 and #2) of a time varying period of 2 and a coding rate of 1/2 for which the above condition about "remainder" holds true. In table 2, LDPC-CCs of a time varying period of 2 are defined by two parity check polynomials: "check polynomial #1" and "check polynomial #2."

TABLE 2

| Code | Parity check polynomial |
| --- | --- |
| LDPC-CC #1 of a time varying period of 2 and a coding rate of 1/2 | Check polynomial #1: $(D^{551} + D^{465} + D^{98} + 1)X(D) + (D^{407} + D^{386} + D^{373} + 1)P(D) = 0$<br>Check polynomial #2: $(D^{443} + D^{433} + D^{54} + 1)X(D) + (D^{559} + D^{557} + D^{546} + 1)P(D) = 0$ |
| LDPC-CC #2 of a time varying period of 2 and a coding rate of 1/2 | Check polynomial #1: $(D^{265} + D^{190} + D^{99} + 1)X(D) + (D^{295} + D^{246} + D^{69} + 1)P(D) = 0$<br>Check polynomial #2: $(D^{275} + D^{226} + D^{213} + 1)X(D) + (D^{298} + D^{147} + D^{45} + 1)P(D) = 0$ |

In the above description (LDPC-CCs of a time varying period of 2), a case in which the coding rate is 1/2 has been described as an example, but a regular LDPC code is also formed and good received quality can be obtained when the coding rate is (n−1)/n if the above condition about "remainder" holds true for four-coefficient sets in information X1(D), X2(D), . . . , Xn−1(D).

In the case of a time varying period of 3, also, it has been confirmed that a code with good characteristics can be found if the following condition about "remainder" is applied. An LDPC-CC of a time varying period of 3 with good characteristics is described below. A case in which the coding rate is 1/2 is described below as an example.

Consider equations 3-1 to 3-3 as parity check polynomials of an LDPC-CC for which the time varying period is 3. At this time, X(D) is a polynomial representation of data (information) and P(D) is a parity polynomial representation. Here, in equations 3-1 to 3-3, parity check polynomials are assumed such that there are three terms in X(D) and P(D) respectively.

[3]

$$(D^{a1}+D^{a2}+D^{a3})X(D)+(D^{b1}+D^{b2}+D^{b3})P(D)=0 \quad \text{(Equation 3-1)}$$

$$(D^{A1}+D^{A2}+D^{A3})X(D)+(D^{B1}+D^{B3}+D^{B3})P(D)=0 \quad \text{(Equation 3-2)}$$

$$(D^{\alpha1}+D^{\alpha2}+D^{\alpha3})X(D)+(D^{\beta1}+D^{\beta3}+D^{\beta3})P(D)=0 \quad \text{(Equation 3-3)}$$

In equation 3-1, it is assumed that a1, a2, and a3 are integers (where a1≠a2≠a3). Also, it is assumed that b1, b2 and b3 are integers (where b1≠b2≠b3). A parity check polynomial of equation 3-1 is called "check equation #1," and a sub-matrix based on the parity check polynomial of equation 3-1 is designated first sub-matrix $H_1$.

In equation 3-2, it is assumed that A1, A2 and A3 are integers (where A1≠A2≠A3). Also, it is assumed that B1, B2 and B3 are integers (where B1≠B2≠B3). A parity check polynomial of equation 3-2 is called "check equation #2," and a sub-matrix based on the parity check polynomial of equation 3-2 is designated second sub-matrix $H_2$.

In equation 3-3, it is assumed that α1, α2 and α3 are integers (where α1≠α2≠α3). Also, it is assumed that β1, β2 and β3 are integers (where β1≠β2≠β3). A parity check polynomial of equation 3-3 is called "check equation #3," and a sub-matrix based on the parity check polynomial of equation 3-3 is designated third sub-matrix H3.

Next, an LDPC-CC of a time varying period of 3 generated from first sub-matrix $H_1$, second sub-matrix $H_2$ and third sub-matrix H3 is considered.

At this time, if k is designated as a remainder after dividing the values of combinations of orders of X(D) and P(D), (a1, a2, a3), (b1, b2, b3), (A1, A2, A3), (B1, B2, B3), (α1, α2, α3), (β1, β2, β3), in equations 3-1 to 3-3 by 3, provision is made for one each of remainders 0, 1, and 2 to be included in three-coefficient sets represented as shown above (for example, (a1, a2, a3)), and to hold true for all the above three-coefficient sets.

For example, if orders (a1, a2, a3) of X(D) of "check equation #1" are set as (a1, a2, a3)=(6, 5, 4), remainders k after dividing orders (a1, a2, a3) by 3 are (0, 2, 1), and one each of 0, 1, 2 are included in the three-coefficient set as remainders k. Similarly, if orders (b1, b2, b3) of P(D) of "check equation #1" are set as (b1, b2, b3)=(3, 2, 1), remainders k after dividing orders (b1, b2, b3) by 3 are (0, 2, 1), and one each of 0, 1, 2 are included in the three-coefficient set as remainders k. It is assumed that the above condition about "remainder" also holds true for the three-coefficient sets of X(D) and P(D) of "check equation #2" and "check equation #3."

By generating an LDPC-CC as above, it is possible to generate a regular LDPC-CC code in which the row weight is equal in all rows and the column weight is equal in all columns, without some exceptions. Here, "exceptions" refer to part in the beginning of a parity check matrix and part in the end of the parity check matrix, where the row weights and columns weights are not the same as row weights and column weights of the other part. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be obtained. This is because, when considered in column units, positions at which "1" is present are arranged so as to propagate belief accurately, as described above.

The above belief propagation will be described below using accompanying drawings. FIG. 4A shows parity check polynomials of an LDPC-CC of a time varying period of 3 and the configuration of parity check matrix H of this LDPC-CC.

"Check equation #1" illustrates a case in which (a1, a2, a3)=(2, 1, 0) and (b1, b2, b3)=(2, 1, 0) in a parity check polynomial of equation 3-1, and remainders after dividing the coefficients by 3 are as follows: (a1%3, a2%3, a3%3)= (2, 1, 0), (b1%3, b2%3, b3%3)=(2, 1, 0), where "Z %3" represents a remainder after dividing Z by 3 (the same applies hereinafter).

"Check equation #2" illustrates a case in which (A1, A2, A3)=(5, 1, 0) and (B1, B2, B3)=(5, 1, 0) in a parity check polynomial of equation 3-2, and remainders after dividing the coefficients by 3 are as follows: (A1%3, A2%3, A3%3)= (2, 1, 0), (B1%3, B2%3, B3%3)=(2, 1, 0).

"Check equation #3" illustrates a case in which (α1, α2, α3)=(4, 2, 0) and (β1, β2, β3)=(4, 2, 0) in a parity check polynomial of equation 3-3, and remainders after dividing the coefficients by 3 are as follows: (a1%3, a2%3, a3%3)= (1, 2, 0), (β1%3, β2%3, β3%3)=(1, 2, 0).

Therefore, the example of LDPC-CC of a time varying period of 3 shown in FIG. 4A satisfies the above condition about "remainder", that is, a condition that (a1%3, a2%3, a3%3), (b1%3, b2%3, b3%3), (A1%3, A2%3, A3%3), (B1%3, B2%3, B3%3), (α1%3, α2%3, α3%3) and (β1%3, β2%3, β3%3) are any of the following: (0, 1, 2), (0, 2, 1), (1, 0, 2), (1, 2, 0), (2, 0, 1), (2, 1, 0).

Returning to FIG. 4A again, belief propagation will now be explained. By column computation of column 6506 in BP decoding, for "1" of area 6501 of "check equation #1," belief is propagated from "1" of area 6504 of "check equation #2" and from "1" of area 6505 of "check equation #3." As described above, "1" of area 6501 of "check equation #1" is a coefficient for which a remainder after division by 3 is 0 (a3%3=0 (a3=0) or b3%3=0 (b3=0)). Also, "1" of area 6504 of "check equation #2" is a coefficient for which a remainder after division by 3 is 1 (A2%3=1 (A2=1) or B2%3=1 (B2=1)). Furthermore, "1" of area 6505 of "check equation #3" is a coefficient for which a remainder after division by 3 is 2 (a2%3=2 (a2=2) or β2%3=2 ((32=2)).

Thus, for "1" of area 6501 for which a remainder is 0 in the coefficients of "check equation #1," in column computation of column 6506 in BP decoding, belief is propagated from "1" of area 6504 for which a remainder is 1 in the coefficients of "check equation #2" and from "1" of area 6505 for which a remainder is 2 in the coefficients of "check equation #3."

Similarly, for "1" of area 6502 for which a remainder is 1 in the coefficients of "check equation #1," in column computation of column 6509 in BP decoding, belief is propagated from "1" of area 6507 for which a remainder is 2 in the coefficients of "check equation #2" and from "1" of area 6508 for which a remainder is 0 in the coefficients of "check equation #3."

Similarly, for "1" of area 6503 for which a remainder is 2 in the coefficients of "check equation #1," in column computation of column 6512 in BP decoding, belief is propagated from "1" of area 6510 for which a remainder is 0 in the coefficients of "check equation #2" and from "1" of area 6511 for which a remainder is 1 in the coefficients of "check equation #3."

Figure 4B:
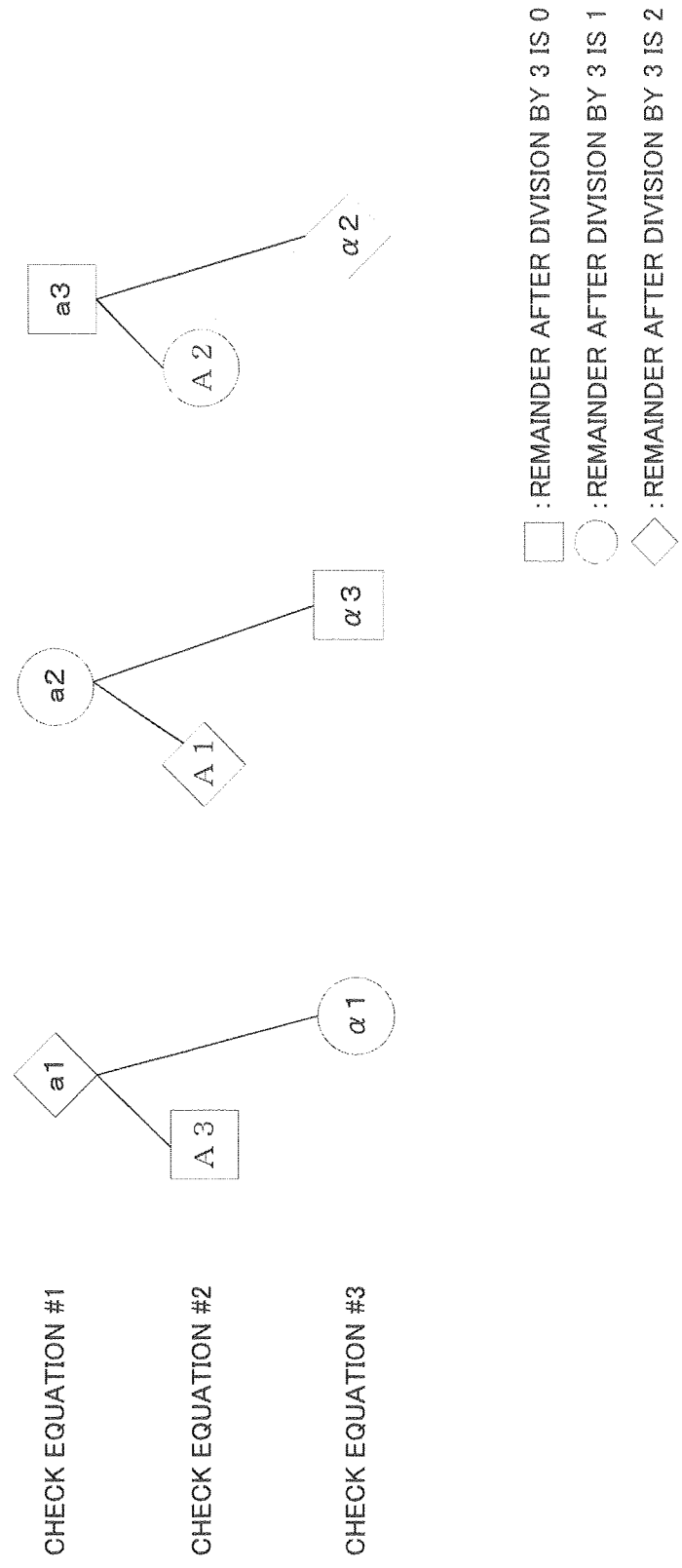
FIG. 4B shows the belief propagation relationship of terms relating to X(D) of "check equation #1" to "check equation #3" in FIG. 4A.

A supplementary explanation of belief propagation will now be given using FIG. 4B. FIG. 4B shows the belief propagation relationship of terms relating to X(D) of "check equation #1" to "check equation #3" in FIG. 4A. "Check equation #1" to "check equation #3" in FIG. 4A illustrate cases in which (a1, a2, a3)=(2, 1, 0), (A1, A2, A3)=(5, 1, 0), and (α1, α2, α3)=(4, 2, 0), in terms relating to X(D) of equations 3-1 to 3-3.

In FIG. 4B, terms (a3, A3, α3) inside squares indicate coefficients for which a remainder after division by 3 is 0, terms (a2, A2, α2) inside circles indicate coefficients for which a remainder after division by 3 is 1, and terms (a1, A1, α1) inside diamond-shaped boxes indicate coefficients for which a remainder after division by 3 is 2.

As can be seen from FIG. 4B, for a1 of "check equation #1," belief is propagated from A3 of "check equation #2" and from α1 of "check equation #3" for which remainders after division by 3 differ; for a2 of "check equation #1," belief is propagated from A1 of "check equation #2" and from α3 of "check equation #3" for which remainders after division by 3 differ; and, for α3 of "check equation #1," belief is propagated from A2 of "check equation #2" and from a2 of "check equation #3" for which remainders after division by 3 differ. While FIG. 4B shows the belief propagation relationship of terms relating to X(D) of "check equation #1" to "check equation #3," the same applies to terms relating to P(D).

Thus, for "check equation #1," belief is propagated from coefficients for which remainders after division by 3 are 0, 1, and 2 among coefficients of "check equation #2." That is to say, for "check equation #1," belief is propagated from coefficients for which remainders after division by 3 are all different among coefficients of "check equation #2." Therefore, beliefs with low correlation are all propagated to "check equation #1."

Similarly, for "check equation #2," belief is propagated from coefficients for which remainders after division by 3 are 0, 1, and 2 among coefficients of "check equation #1." That is to say, for "check equation #2," belief is propagated from coefficients for which remainders after division by 3 are all different among coefficients of "check equation #1." Also, for "check equation #2," belief is propagated from coefficients for which remainders after division by 3 are 0, 1, and 2 among coefficients of "check equation #3." That is to say, for "check equation #2," belief is propagated from coefficients for which remainders after division by 3 are all different among coefficients of "check equation #3."

Similarly, for "check equation #3," belief is propagated from coefficients for which remainders after division by 3 are 0, 1, and 2 among coefficients of "check equation #1." That is to say, for "check equation #3," belief is propagated from coefficients for which remainders after division by 3 are all different among coefficients of "check equation #1." Also, for "check equation #3," belief is propagated from coefficients for which remainders after division by 3 are 0, 1, and 2 among coefficients of "check equation #2." That is to say, for "check equation #3," belief is propagated from coefficients for which remainders after division by 3 are all different among coefficients of "check equation #2."

By providing for the orders of parity check polynomials of equations 3-1 to 3-3 to satisfy the above condition about "remainder" in this way, belief is necessarily propagated in all column computations, so that it is possible to perform belief propagation efficiently in all check equations and further increase error correction capability.

A case in which the coding rate is 1/2 has been described above for an LDPC-CC of a time varying period of 3, but the coding rate is not limited to 1/2. A regular LDPC code is also formed and good received quality can be obtained when the coding rate is (n−1)/n (where n is an integer equal to or greater than 2) if the above condition about "remainder" holds true for three-coefficient sets in information X1(D), X2(D), . . . , Xn−1(D).

A case in which the coding rate is (n−1)/n (where n is an integer equal to or greater than 2) is described below.

Consider equations 4-1 to 4-3 as parity check polynomials of an LDPC-CC for which the time varying period is 3. At this time, $X_1(D)$, $X_2(D)$, $X_{n-1}(D)$ are polynomial representations of data (information) $X_1, X_2, \ldots, X_{n-1}$, and P(D) is a polynomial representation of parity. Here, in equations 4-1 to 4-3, parity check polynomials are assumed such that there are three terms in $X_1(D)$, $X_2(D)$, $X_{n-1}(D)$, and P(D) respectively.

[4]

$$(D^{a1,1}+D^{a1,2}+D^{a1,3})X_1(D)+(D^{a2,1}+D^{a2,2}+D^{a2,3})X_2(D)+\ldots+(D^{an-1,1}+D^{an-1,2}+D^{an-1,3})X_{n-1}(D)+(D^{b1}+D^{b2}+D^{b3})P(D)=0 \quad \text{(Equation 4-1)}$$

$$(D^{A1,1}+D^{A1,2}+D^{A1,3})X_1(D)+(D^{A2,1}+D^{A2,2}+D^{A2,3})X_2(D)+\ldots+(D^{An-1,1}+D^{An-1,2}+D^{An-1,3})X_{n-1}(D)+(D^{B1}+D^{B2}+D^{B3})P(D)=0 \quad \text{(Equation 4-2)}$$

$$(D^{\alpha 1,1}+D^{\alpha 1,2}+D^{\alpha 1,3})X_1(D)+(D^{\alpha 2,1}+D^{\alpha 2,2}+D^{\alpha 2,3})X_2(D)+\ldots+(D^{\alpha n-1,1}+D^{\alpha n-1,2}+D^{\alpha n-1,3})X_{n-1}(D)+(D^{\beta 1}+D^{\beta 2}+D^{\beta 3})P(D)=0 \quad \text{(Equation 4-3)}$$

In equation 4-1, it is assumed that $a_{i,1}$, $a_{i,2}$, and $a_{i,3}$ (where i=1, 2, . . . , n−1) are integers (where $a_{i,1} \ne a_{i,2} \ne a_{i,3}$). Also, it is assumed that b1, b2 and b3 are integers (where b1≠b2≠b3). A parity check polynomial of equation 4-1 is called "check equation #1," and a sub-matrix based on the parity check polynomial of equation 4-1 is designated first sub-matrix $H_1$.

In equation 4-2, it is assumed that $A_{i,1}$, $A_{i,2}$, and $A_{i,3}$ (where i=1, 2, . . . , n−1) are integers (where $A_{1,1} \ne A_{i,2} \ne A_{i,3}$). Also, it is assumed that B1, B2 and B3 are integers (where B1≠B2≠B3). A parity check polynomial of equation 4-2 is called "check equation #2," and a sub-matrix based on the parity check polynomial of equation 4-2 is designated second sub-matrix $H_2$.

In equation 4-3, it is assumed that $\alpha_{i,1}$, $\alpha_{i,2}$, and $\alpha_{i,3}$ (where i=1, 2, . . . , n−1) are integers (where $\alpha_{i,1} \ne \alpha_{i,2} \ne \alpha_{i,3}$). Also, it is assumed that β1, β2 and β3 are integers (where β1≠β2≠β3). A parity check polynomial of equation 4-3 is called "check equation #3," and a sub-matrix based on the parity check polynomial of equation 4-3 is designated third sub-matrix $H_3$.

Next, an LDPC-CC of a time varying period of 3 generated from first sub-matrix $H_1$, second sub-matrix $H_2$ and third sub-matrix $H_3$ is considered.

At this time, if k is designated as a remainder after dividing the values of combinations of orders of $X_1(D)$, $X_2(D)$, $X_{n-1}(D)$, and P(D), ($a_{1,1}$, $a_{1,2}$, $a_{1,3}$),
($a_{2,1}$, $a_{2,2}$, $a_{2,3}$), . . . ,
($a_{n-1,1}$, $a_{n-1,2}$, $a_{n-1,3}$),
(b1, b2, b3),
($A_{1,1}$, $A_{1,2}$, $A_{1,3}$),
($A_{2,1}$, $A_{2,2}$, $A_{2,3}$), . . . ,
($A_{n-1,1}$, $A_{n-1,2}$, $A_{n-1,3}$),
(B1, B2, B3),
($\alpha_{1,1}$, $\alpha_{1,2}$, $\alpha_{1,3}$),
($\alpha_{2,1}$, $\alpha_{2,2}$, $\alpha_{2,3}$), . . . ,
($\alpha_{n-1,1}$, $\alpha_{n-1,2}$, $\alpha_{n-1,3}$),
(β1, β2, β3), in equations 4-1 to 4-3 by 3, provision is made for one each of remainders 0, 1, and 2 to be included in three-coefficient sets represented as shown above (for example, ($a_{1,1}$, $a_{1,2}$, $a_{1,3}$)), and to hold true for all the above three-coefficient sets.

That is to say, provision is made for
($a_{1,1}$%3, $a_{1,2}$%3, $a_{1,3}$%3),
($a_{2,1}$%3, $a_{2,2}$%3, $a_{2,3}$%3), . . . ,
($a_{n-1,1}$%3, $a_{n-1,2}$%3, $a_{n-1,3}$%3),
(b1%3, b2%3, b3%3),
($A_{1,1}$%3, $A_{1,2}$%3, $A_{1,3}$%3),
($A_{2,1}$%3, $A_{2,2}$%3, $A_{2,3}$%3), . . . ,
($A_{n-1,1}$%3, $A_{n-1,2}$%3, $A_{n-1,3}$%3),
(B1%3, B2%3, B3%3),
($\alpha_{1,1}$%3, $\alpha_{1,2}$%3, $\alpha_{1,3}$%3),
($\alpha 2,1$%3, $\alpha_{2,2}$%3, $\alpha_{2,3}$%3), . . . ,
($\alpha_{n-1,1}$%3, $\alpha_{n-1,2}$%3, $\alpha_{n-1,3}$%3) and
(β1%3, β2%3, β3%3) to be any of the following: (0, 1, 2), (0, 2, 1), (1, 0, 2), (1, 2, 0), (2, 0, 1), (2, 1, 0).

Generating an LDPC-CC in this way enables a regular LDPC-CC code to be generated. Furthermore, when BP decoding is performed, belief in "check equation #2" and belief in "check equation #3" are propagated accurately to "check equation #1," belief in "check equation #1" and belief in "check equation #3" are propagated accurately to "check equation #2," and belief in "check equation #1" and belief in "check equation #2" are propagated accurately to "check equation #3." Consequently, an LDPC-CC with better received quality can be obtained in the same way as in the case of a coding rate of 1/2.

Table 3 shows examples of LDPC-CCs (LDPC-CCs #1, #2, #3, #4, #5 and #6) of a time varying period of 3 and a coding rate of 1/2 for which the above "remainder" related condition holds true. In table 3, LDPC-CCs of a time varying period of 3 are defined by three parity check polynomials: "check (polynomial) equation #1," "check (polynomial) equation #2" and "check (polynomial) equation #3."

TABLE 3

| Code | Parity check polynomial |
|---|---|
| LDPC-CC #1 of a time varying period of 3 and a coding rate of 1/2 | Check polynomial #1: $(D^{428} + D^{325} + 1)X(D) + (D^{538} + D^{332} + 1)P(D) = 0$<br>Check polynomial #2: $(D^{538} + D^{380} + 1)X(D) + (D^{449} + D^{1} + 1)P(D) = 0$<br>Check polynomial #3: $(D^{583} + D^{170} + 1)X(D) + (D^{364} + D^{242} + 1)P(D) = 0$ |
| LDPC-CC #2 of a time varying period of 3 and a coding rate of 1/2 | Check polynomial #1: $(D^{562} + D^{71} + 1)X(D) + (D^{325} + D^{155} + 1)P(D) = 0$<br>Check polynomial #2: $(D^{215} + D^{106} + 1)X(D) + (D^{566} + D^{142} + 1)P(D) = 0$<br>Check polynomial #3: $(D^{590} + D^{559} + 1)X(D) + (D^{127} + D^{110} + 1)P(D) = 0$ |
| LDPC-CC #3 of a time varying period of 3 and a coding rate of 1/2 | Check polynomial #1: $(D^{112} + D^{53} + 1)X(D) + (D^{110} + D^{88} + 1)P(D) = 0$<br>Check polynomial #2: $(D^{103} + D^{47} + 1)X(D) + (D^{85} + D^{83} + 1)P(D) = 0$<br>Check polynomial #3: $(D^{148} + D^{89} + 1)X(D) + (D^{146} + D^{49} + 1)P(D) = 0$ |
| LDPC-CC #4 of a time varying period of 3 and a coding rate of 1/2 | Check polynomial #1: $(D^{350} + D^{322} + 1)X(D) + (D^{448} + D^{338} + 1)P(D) = 0$<br>Check polynomial #2: $(D^{529} + D^{32} + 1)X(D) + (D^{238} + D^{188} + 1)P(D) = 0$<br>Check polynomial #3: $(D^{592} + D^{572} + 1)X(D) + (D^{578} + D^{568} + 1)P(D) = 0$ |
| LDPC-CC #5 of a time varying period of 3 and a coding rate of 1/2 | Check polynomial #1: $(D^{410} + D^{82} + 1)X(D) + (D^{835} + D^{47} + 1)P(D) = 0$<br>Check polynomial #2: $(D^{875} + D^{796} + 1)X(D) + (D^{962} + D^{871} + 1)P(D) = 0$<br>Check polynomial #3: $(D^{605} + D^{547} + 1)X(D) + (D^{950} + D^{439} + 1)P(D) = 0$ |
| LDPC-CC #6 of a time varying period of 3 and a coding rate of 1/2 | Check polynomial #1: $(D^{373} + D^{56} + 1)X(D) + (D^{406} + D^{218} + 1)P(D) = 0$<br>Check polynomial #2: $(D^{457} + D^{197} + 1)X(D) + (D^{491} + D^{22} + 1)P(D) = 0$<br>Check polynomial #3: $(D^{485} + D^{70} + 1)X(D) + (D^{236} + D^{181} + 1)P(D) = 0$ |

It has been confirmed that, as in the case of a time varying period of 3, a code with good characteristics can be found if the condition about "remainder" below is applied to an LDPC-CC for which the time varying period is a multiple of 3 (for example, 6, 9, 12, . . . ). An LDPC-CC of a multiple of a time varying period of 3 with good characteristics is described below. The case of an LDPC-CC of a coding rate of 1/2 and a time varying period of 6 is described below as an example.

Consider equations 5-1 to 5-6 as parity check polynomials of an LDPC-CC for which the time varying period is 6.

[5]

$$(D^{a1,1}+D^{a1,2}+D^{a1,3})X(D)+(D^{b1,1}+D^{b1,2}+D^{b1,3})P(D)=0 \quad \text{(Equation 5-1)}$$

$$(D^{a2,1}+D^{a2,2}+D^{a2,3})X(D)+(D^{b2,1}+D^{b2,2}+D^{b2,3})P(D)=0 \quad \text{(Equation 5-2)}$$

$$(D^{a3,1}+D^{a3,2}+D^{a3,3})X(D)+(D^{b3,1}+D^{b3,2}+D^{b3,3})P(D)=0 \quad \text{(Equation 5-3)}$$

$$(D^{a4,1}+D^{a4,2}+D^{a4,3})X(D)+(D^{b4,1}+D^{b4,2}+D^{b4,3})P(D)=0 \quad \text{(Equation 5-4)}$$

$$(D^{a5,1}+D^{a5,2}+D^{a5,3})X(D)+(D^{b5,1}+D^{b5,2}+D^{b5,3})P(D)=0 \quad \text{(Equation 5-5)}$$

$$(D^{a6,1}+D^{a6,2}+D^{a6,3})X(D)+(D^{b6,1}+D^{b6,2}+D^{b6,3})P(D)=0 \quad \text{(Equation 5-6)}$$

At this time, X(D) is a polynomial representation of data (information) and P(D) is a parity polynomial representation. With an LDPC-CC of a time varying period of 6, if i %6=k (where k=0, 1, 2, 3, 4, 5) is assumed for parity Pi and information Xi at time i, a parity check polynomial of equation 5−(k+1) holds true. For example, if i=1, i %6=1 (k=1), and therefore equation 6 holds true.

[6]

$$(D^{a2,1}+D^{a2,2}+D^{a2,3})X_1+(D^{b2,1}+D^{b2,2}+D^{b2,3})P_1=0 \quad \text{(Equation 6)}$$

Here, in equations 5-1 to 5-6, parity check polynomials are assumed such that there are three terms in X(D) and P(D) respectively.

In equation 5-1, it is assumed that a1,1, a1,2, a1,3 are integers (where a1,1≠a1,2≠a1,3). Also, it is assumed that b1,1, b1,2, and b1,3 are integers (where b1,1≠b1,2≠b1,3). A parity check polynomial of equation 5-1 is called "check equation #1," and a sub-matrix based on the parity check polynomial of equation 5-1 is designated first sub-matrix $H_1$.

In equation 5-2, it is assumed that a2,1, a2,2, and a2,3 are integers (where a2,1≠a2,2≠a2,3). Also, it is assumed that b2,1, b2,2, b2,3 are integers (where b2,1≠b2,2≠b2,3). A parity check polynomial of equation 5-2 is called "check equation #2," and a sub-matrix based on the parity check polynomial of equation 5-2 is designated second sub-matrix $H_2$.

In equation 5-3, it is assumed that a3,1, a3,2, and a3,3 are integers (where a3,1≠a3,2≠a3,3). Also, it is assumed that b3,1, b3,2, and b3,3 are integers (where b3,1≠b3,2≠b3,3). A parity check polynomial of equation 5-3 is called "check equation #3," and a sub-matrix based on the parity check polynomial of equation 5-3 is designated third sub-matrix $H_3$.

In equation 5-4, it is assumed that a4,1, a4,2, and a4,3 are integers (where a4,1≠a4,2≠a4,3). Also, it is assumed that b4,1, b4,2, and b4,3 are integers (where b4,1≠b4,2≠b4,3). A parity check polynomial of equation 5-4 is called "check equation #4," and a sub-matrix based on the parity check polynomial of equation 5-4 is designated fourth sub-matrix H4.

In equation 5-5, it is assumed that a5,1, a5,2, and a5,3 are integers (where a5,1≠a5,2≠a5,3). Also, it is assumed that b5,1, b5,2, and b5,3 are integers (where b5,1≠b5,2≠b5,3). A parity check polynomial of equation 5-5 is called "check equation #5," and a sub-matrix based on the parity check polynomial of equation 5-5 is designated fifth sub-matrix $H_5$.

In equation 5-6, it is assumed that a6,1, a6,2, and a6,3 are integers (where a6,1≠a6,2≠a6,3). Also, it is assumed that b6,1, b6,2, and b6,3 are integers (where b6,1≠b6,2≠b6,3). A parity check polynomial of equation 5-6 is called "check equation #6," and a sub-matrix based on the parity check polynomial of equation 5-6 is designated sixth sub-matrix H6.

Next, an LDPC-CC of a time varying period of 6 is considered that is generated from first sub-matrix $H_1$, second sub-matrix $H_2$, third sub-matrix $H_3$, fourth sub-matrix $H_4$, fifth sub-matrix $H_5$ and sixth sub-matrix $H_6$.

At this time, if k is designated as a remainder after dividing the values of combinations of orders of X(D) and P(D), (a1,1, a1,2, a1,3),
(b1,1, b1,2, b1,3),
(a2,1, a2,2, a2,3),
(b2,1, b2,2, b2,3),
(a3,1, a3,2, a3,3),
(b3,1, b3,2, b3,3),
(a4,1, a4,2, a4,3),
(b4,1, b4,2, b4,3),
(a5,1, a5,2, a5,3),
(b5,1, b5,2, b5,3),
(a6,1, a6,2, a6,3),
(b6,1, b6,2, b6,3), in equations 5-1 to 5-6 by 3, provision is made for one each of remainders 0, 1, and 2 to be included in three-coefficient sets represented as shown above (for example, (a1,1, a1,2, a1,3)), and to hold true for all the above three-coefficient sets. That is to say, provision is made for
(a1,1%3, a1,2%3, a1,3%3),
(b1,1%3, b1,2%3, b1,3%3),
(a2,1%3, a2,2%3, a2,3%3),
(b2,1%3, b2,2%3, b2,3%3),
(a3,1%3, a3,2%3, a3,3%3),
(b3,1%3, b3,2%3, b3,3%3),
(a4,1%3, a4,2%3, a4,3%3),
(b4,1%3, b4,2%3, b4,3%3),
(a5,1%3, a5,2%3, a5,3%3),
(b5,1%3, b5,2%3, b5,3%3),
(a6,1%3, a6,2%3, a6,3%3) and
(b6,1%3, b6,2%3, b6,3%3) to be any of the following: (0, 1, 2), (0, 2, 1), (1, 0, 2), (1, 2, 0), (2, 0, 1), (2, 1, 0).

By generating an LDPC-CC in this way, if an edge is present when a Tanner graph is drawn for "check equation #1," belief in "check equation #2 or check equation #5" and belief in "check equation #3 or check equation #6" are propagated accurately.

Also, if an edge is present when a Tanner graph is drawn for "check equation #2," belief in "check equation #1 or check equation #4" and belief in "check equation #3 or check equation #6" are propagated accurately.

If an edge is present when a Tanner graph is drawn for "check equation #3," belief in "check equation #1 or check equation #4" and belief in "check equation #2 or check equation #5" are propagated accurately. If an edge is present when a Tanner graph is drawn for "check equation #4," belief in "check equation #2 or check equation #5" and belief in "check equation #3 or check equation #6" are propagated accurately.

If an edge is present when a Tanner graph is drawn for "check equation #5," belief in "check equation #1 or check equation #4" and belief in "check equation #3 or check equation #6" are propagated accurately. If an edge is present when a Tanner graph is drawn for "check equation #6," belief in "check equation #1 or check equation #4" and belief in "check equation #2 or check equation #5" are propagated accurately.

Consequently, an LDPC-CC of a time varying period of 6 can maintain better error correction capability in the same way as when the time varying period is 3.

In this regard, belief propagation will be described using FIG. 4C. FIG. 4C shows the belief propagation relationship of terms relating to X(D) of "check equation #1" to "check equation #6." In FIG. 4C, a square indicates a coefficient for which a remainder after division by 3 in ax,y (where x=1, 2, 3, 4, 5, 6, and y=1, 2, 3) is 0.

A circle indicates a coefficient for which a remainder after division by 3 in ax,y (where x=1, 2, 3, 4, 5, 6, and y=1, 2, 3) is 1. A diamond-shaped box indicates a coefficient for which a remainder after division by 3 in ax,y (where x=1, 2, 3, 4, 5, 6, and y=1, 2, 3) is 2.

As can be seen from FIG. 4C, if an edge is present when a Tanner graph is drawn, for a1,1 of "check equation #1," belief is propagated from "check equation #2 or #5" and "check equation #3 or #6" for which remainders after division by 3 differ. Similarly, if an edge is present when a Tanner graph is drawn, for a1,2 of "check equation #1," belief is propagated from "check equation #2 or #5" and "check equation #3 or #6" for which remainders after division by 3 differ.

Similarly, if an edge is present when a Tanner graph is drawn, for a1,3 of "check equation #1," belief is propagated from "check equation #2 or #5" and "check equation #3 or #6" for which remainders after division by 3 differ. While FIG. 4C shows the belief propagation relationship of terms relating to X(D) of "check equation #1" to "check equation #6," the same applies to terms relating to P(D).

Thus, belief is propagated to each node in a Tanner graph of "check equation #1" from coefficient nodes of other than "check equation #1." Therefore, beliefs with low correlation are all propagated to "check equation #1," enabling an improvement in error correction capability to be expected.

In FIG. 4C, "check equation #1" has been focused upon, but a Tanner graph can be drawn in a similar way for "check equation #2" to "check equation #6," and belief is propagated to each node in a Tanner graph of "check equation #K" from coefficient nodes of other than "check equation #K." Therefore, beliefs with low correlation are all propagated to "check equation #K" (where K=2, 3, 4, 5, 6), enabling an improvement in error correction capability to be expected.

By providing for the orders of parity check polynomials of equations 5-1 to 5-6 to satisfy the above condition about "remainder" in this way, belief can be propagated efficiently in all check equations, and the possibility of being able to further improve error correction capability is increased.

A case in which the coding rate is 1/2 has been described above for an LDPC-CC of a time varying period of 6, but the coding rate is not limited to 1/2. The possibility of obtaining good received quality can be increased when the coding rate is (n−1)/n (where n is an integer equal to or greater than 2) if the above condition about "remainder" holds true for three-coefficient sets in information $X_1(D), X_2(D), \ldots, X_{n-1}(D)$.

A case in which the coding rate is (n−1)/n (where n is an integer equal to or greater than 2) is described below.

Consider equations 7-1 to 7-6 as parity check polynomials of an LDPC-CC for which the time varying period is 6.

[7]

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+ \ldots +(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Equation 7-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+ \ldots +(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Equation 7-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+ \ldots +(D^{a\#3,n-1,1}+D^{a\#3,n-1,2}+D^{a\#1,n-1,3})X_{n-1}(D)+(D^{b\#1,1}+D^{b\#1,2}+D^{b\#1,3})P(D)=0 \quad \text{(Equation 7-3)}$$

$$(D^{a\#4,1,1}+D^{a\#4,1,2}+D^{a\#4,1,3})X_1(D)+(D^{a\#4,2,1}+D^{a\#4,2,2}+D^{a\#4,2,3})X_2(D)+ \ldots +(D^{a\#4,n-1,1}+D^{a\#4,n-1,2}+D^{a\#4,n-1,3})X_{n-1}(D)+(D^{b\#4,1}+D^{b\#4,2}+D^{b\#4,3})P(D)=0 \quad \text{(Equation 7-4)}$$

$$(D^{a\#5,1,1}+D^{a\#5,1,2}+D^{a\#5,1,3})X_1(D)+(D^{a\#5,2,1}+D^{a\#5,2,2}+D^{a\#5,2,3})X_2(D)+ \ldots +(D^{a\#5,n-1,1}+D^{a\#5,n-1,2}+D^{a\#5,n-1,3})X_{n-1}(D)+(D^{b\#5,1}+D^{b\#5,2}+D^{b\#5,3})P(D)=0 \quad \text{(Equation 7-5)}$$

$$(D^{a\#6,1,1}+D^{a\#6,1,2}+D^{a\#6,1,3})X_1(D)+(D^{a\#6,2,1}+D^{a\#6,2,2}+D^{a\#6,2,3})X_2(D)+ \ldots +(D^{a\#6,n-1,1}+D^{a\#6,n-1,2}+D^{a\#6,n-1,3})X_{n-1}(D)+(D^{b\#6,1}+D^{b\#6,2}+D^{b\#6,3})P(D)=0 \quad \text{(Equation 7-6)}$$

At this time, $X_1(D), X_2(D), \ldots, X_{n-1}(D)$ are polynomial representations of data (information) $X1, X2, \ldots, Xn-1$, and P(D) is a polynomial representation of parity. Here, in equations 7-1 to 7-6, parity check polynomials are assumed such that there are three terms in $X_1(D), X_2(D), \ldots, X_{n-1}(D)$, and P(D) respectively. As in the case of the above coding rate of 1/2, and in the case of a time varying period of 3, the possibility of being able to obtain higher error correction capability is increased if the condition below (<Condition #1>) is satisfied in an LDPC-CC of a time varying period of 6 and a coding rate of (n−1)/n (where n is an integer equal to or greater than 2) represented by parity check polynomials of equations 7-1 to 7-6.

In an LDPC-CC of a time varying period of 6 and a coding rate of (n−1)/n (where n is an integer equal to or greater than 2), parity and information at time i are represented by Pi and $X_{i,1}, X_{i,2}, \ldots, X_{i,n-1}$ respectively. If i %6=k (where k=0, 1, 2, 3, 4, 5) is assumed at this time, a parity check polynomial of equation 7−(k+1) holds true. For example, if i=8, i %6=2 (k=2), and therefore equation 8 holds true.

[8]

$$(D^{a\#3,1,1}+D^{a\#3,1,2}+D^{a\#3,1,3})X_{8,1}+(D^{a\#3,2,1}+D^{a\#3,2,2}+D^{a\#3,2,3})X_{8,2}+ \ldots +(D^{a\#3,n-1,1}+D^{a\#3,n-1,2}+D^{a\#3,n-1,3})X_{8,n-1}+(D^{b\#3,1}+D^{b\#3,2}+D^{b\#3,3})P_8=0 \quad \text{(Equation 8)}$$

<Condition #1>

In equations 7-1 to 7-6, combinations of orders of $X_1(D), X_2(D), \ldots, X_{n-1}(D)$, and P(D) satisfy the following condition:

$(a_{\#1,1,1}\%3, a_{\#1,1,2}\%3, a_{\#1,1,3}\%3)$,
$(a_{\#1,2,1}\%3, a_{\#1,2,2}\%3, a_{\#1,2,3}\%3), \ldots,$
$(a_{\#1,k,1}\%3, a_{\#1,k,2}\%3, a_{\#1,k,3}\%3), \ldots,$
$(a_{\#1,n-1,1}\%3, a_{\#1,n-1,2}\%3, a_{\#1,n-1,3}\%3)$ and
$(b_{\#1,1}\%3, b_{\#1,2}\%3, b_{\#1,3}\%3)$ are any of (0, 1, 2), (0, 2, 1), (1, 0, 2), (1, 2, 0), (2, 0, 1), or (2, 1, 0) (where k=1, 2, 3, …, n−1);
$(a_{\#2,1,1}\%3, a_{\#2,1,2}\%3, a_{\#2,1,3}\%3)$,
$(a_{\#2,2,1}\%3, a_{\#2,2,2}\%3, a_{\#2,2,3}\%3), \ldots,$
$(a_{\#2,k,1}\%3, a_{\#2,k,2}\%3, a_{\#2,k,3}\%3), \ldots,$
$(a_{\#2,n-1,1}\%3, a_{\#2,n-1,2}\%3, a_{\#2,n-1,3}\%3)$ and
$(b_{\#2,1}\%3, b_{\#2,2}\%3, b_{\#2,3}\%3)$ are any of (0, 1, 2), (0, 2, 1), (1, 0, 2), (1, 2, 0), (2, 0, 1), or (2, 1, 0) (where k=1, 2, 3, …, n−1),
$(a_{\#3,1,1}\%3, a_{\#3,1,2}\%3, a_{\#3,1,3}\%3)$,
$(a_{\#3,2,1}\%3, a_{\#3,2,2}\%3, a_{\#3,2,3}\%3), \ldots,$
$(a_{\#3,k,1}\%3, a_{\#3,k,2}\%3, a_{\#3,k,3}\%3), \ldots,$ ($a_{\#3,n-1,1}$%3, $a_{\#3,n-1,2}$%3, $a_{\#3,n-1,3}$%3) and
($b_{\#3,1}$%3, $b_{\#3,2}$%3, $b_{\#3,3}$%3) are any of (0, 1, 2), (0, 2, 1), (1, 0, 2), (1, 2, 0), (2, 0, 1), or (2, 1, 0) (where k=1, 2, 3, ..., n−1);

($a_{\#3,p,1,1}$%3, $a_{\#3,p,1,2}$%3, $a_{\#3,p,1,3}$%3),
($a_{\#3,p,2,1}$%3, $a_{\#3,p,2,2}$%3, $a_{\#3,p,2,3}$%3), ...,
($a_{\#3,p,k,1}$%3, $a_{\#3,p,k,2}$%3, $a_{\#3,p,k,3}$%3), ...,
($a_{\#3,p,n-1,1}$%3, $a_{\#3,p,n-1,2}$%3, $a_{\#3,p,n-1,3}$%3) and
($b_{\#4,1}$%3, $b_{\#4,2}$%3, $b_{\#4,3}$%3) are any of (0, 1, 2), (0, 2, 1), (1, 0, 2), (1, 2, 0), (2, 0, 1), or (2, 1, 0) (where k=1, 2, 3, ..., n−1), ($a_{\#5,1,1}$%3, $a_{\#5,1,2}$%3, $a_{\#5,1,3}$%3),
($a_{\#5,2,1}$%3, $a_{\#5,2,2}$%3, $a_{\#5,2,3}$%3), ...,
($a_{\#5,k,1}$%3, $a_{\#5,k,2}$%3, $a_{\#5,k,3}$%3), ...,
($a_{\#5,n-1,1}$%3, $a_{\#5,n-1,2}$%3, $a_{\#5,n-1,3}$%3) and
($b_{\#5,1}$%3, $b_{\#5,2}$%3, $b_{\#5,3}$%3) are any of (0, 1, 2), (0, 2, 1), (1, 0, 2), (1, 2, 0), (2, 0, 1), or (2, 1, 0) (where k=1, 2, 3, ..., n−1); and ($a_{\#6,1,1}$%3, $a_{\#6,1,2}$%3, $a_{\#6,1,3}$%3),
$a_{\#6,2,1}$%3, $a_{\#6,2,2}$%3, $a_{\#6,2,3}$%3), ...,
($a_{\#6,k,1}$%3, $a_{\#6,k,2}$%3, $a_{\#6,k,3}$%3), ...,
($a_{\#6,n-1,1}$%3, $a_{\#6,n-1,2}$%3, $a_{\#6,n-1,3}$%3) and
($b_{\#6,1}$%3, $b_{\#6,2}$%3, $b_{\#6,3}$%3) are any of (0, 1, 2), (0, 2, 1), (1, 0, 2), (1, 2, 0), (2, 0, 1), or (2, 1, 0) (where k=1, 2, 3, ..., n−1).

In the above description, a code having high error correction capability has been described for an LDPC-CC of a time varying period of 6, but a code having high error correction capability can also be generated when an LDPC-CC of a time varying period of 3g (where g=1, 2, 3, 4, ...) (that is, an LDPC-CC for which the time varying period is a multiple of 3) is created in the same way as with the design method for an LDPC-CC of a time varying period of 3 or 6. A configuration method for this code is described in detail below.

Consider equations 9-1 to 9-3g as parity check polynomials of an LDPC-CC for which the time varying period is 3g (where g=1, 2, 3, 4, ...) and the coding rate is (n−1)/n (where n is an integer equal to or greater than 2).

[9]

$(Da\#1, 1, 1 + Da\#1, 1, 2 + Da\#1, 1, 3)X_1(D) +$   (Equation 9-1)
$(Da\#1, 2, 1 + Da\#1, 2, 2 + Da\#, 1, 2, 3)X_2(D) +$
$... + (Da\#1, n − 1, 1 + Da\#1, n − 1,$
$2 + Da\#1, n − 1, 3)X_{n-1}(D) +$
$(Db\#1, 1 + Db\#1, 2 + Db\#1, 3)P(D) = 0$ $(Da\#2, 1, 1 + Da\#2, 1, 2 + Da\#2, 1, 3)X_1(D) +$   (Equation 9-2)
$(Da\#2, 2, 1 + Da\#2, 2, 2 + Da\#2, 2, 3)X_2(D) +$
$... + (Da\#2, n − 1, 1 + Da\#2, n − 1,$
$2 + Da\#2, n − 1, 3)X_{n-1}(D) +$
$(Db\#2, 1 + Db\#2, 2 + Db\#2, 3)P(D) = 0$ $(Da\#3, 1, 1 + Da\#3, 1, 2 + Da\#3, 1, 3)X_1(D) +$   (Equation 9-3)
$(Da\#3, 2, 1 + Da\#3, 2, 2 + Da\#3, 2, 3)X_2(D) +$
$... + (Da\#3, n − 1, 1 + Da\#3, n − 1,$
$2 + Da\#3, n − 1, 3)X_{n-1}(D) +$
$(Db\#3, 1 + Db\#3, 2 + Db\#3, 3)P(D) = 0$

⋮

$(Da\#k, 1, 1 + Da\#k, 1, 2 + Da\#k, 1, 3)X_1(D) +$   (Equation 9-k)
$(Da\#k, 2, 1 + Da\#k, 2, 2 + Da\#k, 2, 3)X_2(D) +$
$... + (Da\#k, n − 1, 1 + Da\#k, n − 1,$
$2 + Da\#k, n − 1, 3)X_{n-1}(D) +$
$(Db\#k, 1 + DB\#k, 2 + Db\#k, 3)P(D) = 0$

⋮

$(Da\#3g − 2, 1, 1 + Da\#3g − 2,$   (Equation 9-(3g − 2))
$1, 2 + Da\#3g − 2, 1, 3)X_1(D) +$
$(Da\#3g − 2, 2, 1 + Da\#3g − 2, 2,$
$2 + Da\#3g − 2, 2, 3)X_2(D) + ... +$
$(Da\#3g − 2, n − 1, 1 + Da\#3g − 2, n − 1,$
$2 + Da\#3g − 2, n − 1, 3)X_{n-1}(D) +$
$(Db\#3g − 2, 1 + Db\#3g − 2, 2 + Db\#3g − 2, 3)$
$P(D) = 0$ $(Da\#3g − 1, 1, 1 + Da\#3g − 1, 1,$   (Equation 9-(3g − 1))
$2 + Da\#3g − 1, 1, 3)X_1(D) + (Da\#3g − 1, 2,$
$1 + Da\#3g − 1, 2, 2 + Da\#3g − 1, 2, 3)X_2(D) +$
$... + (Da\#3g − 1, n − 1, n + Da\#3g − 1,$
$n − 1, 2 + Da\#3g − 1, n − 1, 3)X_{n-1}(D) +$
$(Db\#3g − 1, 1 + Db\#3g − 1,$
$2 + Db\#3g − 1, 3)P(D) = 0$ $(Da\#3g, 1, 1 + Da\#3g, 1, 2 + Da\#3g, 1, 3)X_1(D) +$   (Equation 9 − 3g)
$(Da\#3g, 2, 1 + Da\#, 3g, 2, 2 + Da\#3g, 2, 3)$
$X_2(D) + ... + (Da\#3g, n − 1, 1 + Da\#3g,$
$n − 1, 2 + Da\#3g, n − 1, 3)X_{n-1}(D) +$
$(Db\#3g, 1 + Db\#3g, 2 + Db\#3g, 3)P(D) = 0$ At this time, $X_1(D)$, $X_2(D)$, $X_{n-1}(D)$ are polynomial representations of data (information) $X_1, X_2, ..., X_{n-1}$, and $P(D)$ is a polynomial representation of parity. Here, in equations 9-1 to 9-3g, parity check polynomials are assumed such that there are three terms in $X_1(D)$, $X_2(D)$, ..., $X_{n-1}(D)$, and $P(D)$ respectively.

As in the case of an LDPC-CC of a time varying period of 3 and an LDPC-CC of a time varying period of 6, the possibility of being able to obtain higher error correction capability is increased if the condition below (Condition #2>) is satisfied in an LDPC-CC of a time varying period of 3g and a coding rate of (n−1)/n (where n is an integer equal to or greater than 2) represented by parity check polynomials of equations 9-1 to 9-3g.

In an LDPC-CC of a time varying period of 3g and a coding rate of (n−1)/n (where n is an integer equal to or greater than 2), parity and information at time i are represented by $P_i$ and $X_{i,1}$, $X_{i,2}$, ..., $X_{i,n-1}$ respectively. If i %3g=k (where k=0, 1, 2, ..., 3g−1) is assumed at this time, a parity check polynomial of equation 9-(k+1) holds true. For example, if i=2, i %3g=2 (k=2), and therefore equation 10 holds true.

[10]

$(Da\#3,1,1+Da\#3,1,2+Da\#3,1,3)X_{2,1}+(Da\#3,2,1+Da\#3,2,2+Da\#3,2,3)X_{2,2}+ ... +(Da\#3,n−1,1+Da\#3,n−1,2+Da\#3,n−1,3)X_{2,n-1}+(Db\#3,1+Db\#3,2+Db\#3,3)P_2=0$   (Equation 10)

In equations 9-1 to 9-3g, it is assumed that $a_{\#k,p,1}$, $a_{\#k,p,2}$ and $a_{\#k,p,3}$ are integers (where $a_{\#k,p,1} \neq a_{\#k,p,2} \neq a_{\#k,p,3}$) (where k=1, 2, 3, ..., 3g, and p=1, 2, 3, ..., n−1). Also, it is assumed that $b_{\#k,1}$, $b_{\#k,2}$ and $b_{\#k,3}$ are integers (where $b_{\#k,1}$ $b_{\#k,2} b_{\#k,3}$). A parity check polynomial of equation 9-k (where k=1, 2, 3, ..., 3g) is called "check equation #k," and a sub-matrix based on the parity check polynomial of equation 9-k is designated k-th sub-matrix $H_k$. Next, an LDPC-CC of a time varying period of 3g is considered that is generated from first sub-matrix $H_1$, second sub-matrix $H_2$, third sub-matrix $H_3$, ..., and 3g-th sub-matrix $H_{3g}$.

<Condition #2>

In equations 9-1 to 9-3g, combinations of orders of $X_1(D)$, $X_2(D)$, ..., $X_{n-1}(D)$, and $P(D)$ satisfy the following condition:

$(a_{\#1,1,1}\%3, a_{\#1,1,2}\%3, a_{\#1,1,3}\%3),$
$(a_{\#121}\%3, a_{\#122}\%3, a_{\#123}\%3), ...,$
$(a_{\#1,p,1}\%3, a_{\#1,p,2}\%3, a_{\#1,p,3}\%3), ...,$
$(a\#1,n-1,1\%3, a\#1,n-1,2\%3, a\#1,n-1,3\%3)$ and
$(b_{\#1,1}\%3, b_{\#1,2}\%3, b_{\#1,3}\%3)$ are any of (0, 1, 2), (0, 2, 1), (1, 0, 2), (1, 2, 0), (2, 0, 1), or (2, 1, 0) (where p=1, 2, 3, ..., n−1);

$(a_{\#2,1,1}\%3, a_{\#2,1,2}\%3, a_{\#2,1,3}\%3),$
$(a_{\#2,2,1}\%3, a_{\#2,2,2}\%3, a_{\#2,2,3}\%3), ...,$
$(a_{\#2,p,1}\%3, a_{\#2,p,2}\%3, a_{\#2,p,3}\%3), ...,$
$(a\#2,n-1,1\%3, a\#2,n-1,2\%3, a\#2,n-1,3\%3)$ and
$(b_{\#2,1}\%3, b_{\#2,2}\%3, b_{\#2,3}\%3)$ are any of (0, 1, 2), (0, 2, 1), (1, 0, 2), (1, 2, 0), (2, 0, 1), or (2, 1, 0) (where p=1, 2, 3, ..., n−1);

$(a_{\#3,1,1}\%3, a_{\#3,1,2}\%3, a_{\#3,1,3}\%3),$
$(a_{\#3,2,1}\%3, a_{\#3,2,2}\%3, a_{\#3,2,3}\%3), ...,$
$(a_{\#3,p,1}\%3, a_{\#3,p,2}\%3, a_{\#3,p,3}\%3), ...,$
$(a\#3,n-1,1\%3, a\#3,n-1,2\%3, a\#3,n-1,3\%3)$ and
$(b_{\#3,1}\%3, b_{\#3,2,1}\%3, b_{\#3,3}\%3)$ are any of (0, 1, 2), (0, 2, 1), (1, 0, 2), (1, 2, 0), (2, 0, 1), or (2, 1, 0) (where p=1, 2, 3, ..., n−1);

⋮

$(a_{\#k,1,1}\%3, a_{\#k,1,2}\%3, a_{\#k,1,3}\%3),$
$(a_{\#k,2,1}\%3, a_{\#k,2,2}\%3, a_{\#k,2,3}\%3), ...,$
$(a_{190\ k,p,1}\%3, a_{\#k,p,2}\%3, a_{\#k,p,3}\%3), ...,$
$(a\#k,n-1,1\%3, a\#k,n-1,2\%3, a\#k,n-1,3\%3)$ and
$(b_{\#k,1}\%3, b_{\#k,2}\%3, b_{\#k,3}\%3)$ are any of (0, 1, 2), (0, 2, 1), (1, 0, 2), (1, 2, 0), (2, 0, 1), or (2, 1, 0) (where p=1, 2, 3, ..., n−1) (where, k=1, 2, 3, ..., 3g);

⋮

$(a\#3g-2,1,1\%3, a\#3g-2,1,2\%3, a\#3g-2,1,3\%3),$
$(a\#3g-2,2,1\%3, a\#3g-2,2,2\%3, a\#3g-2,2,3\%3), ...,$
$(a\#3g-2,p,1\%3, a\#3g-2,p,2\%3, a\#3g-2,p,3\%3), ...,$
$(a\#3g-2,n-1,1\%3, a\#3g-2,n-1,2\%3, a\#3g-2,n-1,3\%3),$ and
$(b_{\#3g-2,1}\%3, b\#_{3g-2,2}\%3, b_{\#3g-2,3}\%3)$ are any of (0, 1, 2), (0, 2, 1), (1, 0, 2), (1, 2, 0), (2, 0, 1), or (2, 1, 0) (where p=1, 2, 3, ..., n−1);

$(a\#3g-1,1,1\%3, a\#3g-1,1,2\%3, a\#3g-1,1,3\%3),$
$(a\#3g-1,2,1\%3, a\#3g-1,2,2\%3, a\#3g-1,2,3\%3), ...,$
$(a\#3g-1,p,1\%3, a\#3g-1,p,2\%3, a\#3g-1,p,3\%3), ...,$
$(a\#3g-1,n-1,1\%3, a\#3g-1,n-1,2\%3, a\#3g-1,n-1,3\%3)$ and
$(b_{\#3g-1,1}\%3, b_{\#3g-1,2}\%3, b_{\#3g-1,3}\%3)$ are any of (0, 1, 2), (0, 2, 1), (1, 0, 2), (1, 2, 0), (2, 0, 1), or (2, 1, 0) (where p=1, 2, 3, ..., n−1); and $(a\#3g,1,1\%3, a\#3g,1,2\%3, a\#3g,1,3\%3),$
$(a_{\#3g,2,1}\%3, a_{\#3g22}\%3, a_{\#3g23}\%3), ...,$
$(a_{\#3g,p,1}\%3, a_{\#3g,p,2}\%3, a_{\#3g,p,3}\%3), ...,$
$(a\#3g,n-1,1\%3, a\#3g,n-1,2\%3, a\#3g,n-1,3\%3)$ and
$(b_{\#30}\%3, b_{\#3g2}\%3, b_{\#30}\%3)$ are any of (0, 1, 2), (0, 2, 1), (1, 0, 2), (1, 2, 0), (2, 0, 1), or (2, 1, 0) (where p=1, 2, 3, ..., n−1).

Taking ease of performing encoding into consideration, it is desirable for one "0" to be present among the three items $(b_{\#10}\%3, b_{\#k,2}\%3, b_{\#k,3}\%3)$ (where k=1, 2, ..., 3g) in equations 9-1 to 9-3g. This is because of a feature that, if $D^0=1$ holds true and $b_{\#k,2}$ and $b_{\#k,3}$ are integers equal to or greater than 0 at this time, parity P can be found sequentially.

Also, in order to provide relevancy between parity bits and data bits of the same point in time, and to facilitate a search for a code having high correction capability, it is desirable for:

one "0" to be present among the three items $(a_{\#10,1}\%3, a_{\#10,2}\%3, a_{\#10,3}\%3)$;

one "0" to be present among the three items $(a_{\#k,2,1}\%3, a_{\#k,2,2}\%3, a_{\#k,2,3}\%3)$;

⋮ one "0" to be present among the three items $(a_{\#k,p,1}\%3, a_{\#k,p,2}\%3, a_{\#k,p,3}\%3)$;

⋮ one "0" to be present among the three items $(a_{\#k,n-1,1}\%3, a_{\#k,n-1,2}\%3, a_{\#k,n-1,3}\%3)$, (where k=1, 2, ..., 3g).

Next, an LDPC-CC of a time varying period of 3g (where g=2, 3, 4, 5, ...) that takes ease of encoding into account is considered. At this time, if the coding rate is (n−1)/n (where n is an integer equal to or greater than 2), LDPC-CC parity check polynomials can be represented as shown below.

[11]

$$(D^{a\#1,1,1} + D^{a\#1,1,2} + D^{a\#1,1,3})X_1(D) + \\ (D^{a\#1,2,1} + D^{a\#1,2,2} + D^{a\#1,2,3})X_2(D) + \\ ... + (D^{a\#1,n-1,1} + D^{a\#1,n-1,2} + D^{a\#1,n-1,3})X_{n-1}(D) + \\ (D^{b\#1,1} + D^{b\#1,2} + 1)P(D) = 0$$ (Equation 11-1)

$$(D^{a\#2,1,1} + D^{a\#2,1,2} + D^{a\#2,1,3})X_1(D) + \\ (D^{a\#2,2,1} + D^{a\#2,2,2} + D^{a\#2,2,3}) \\ X_2(D) + ... + (D^{a\#2,n-1,1} + D^{a\#2,n-1,2} + D^{a\#2,n-1,3})X_{n-1}(D) + \\ (D^{b\#2,1} + D^{b\#2,2} + 1)P(D) = 0$$ (Equation 11-2)

$$(D^{a\#3,1,1} + D^{a\#3,1,2} + D^{a\#3,1,3})X_1(D) + \\ (D^{a\#,3,2,1} + D^{a\#3,2,2} + D^{a\#3,2,3}) \\ X_2(D) + ... + (D^{a\#3,n-1,1} + D^{a\#3,n-1,2} + D^{a\#3,n-1,3})X_{n-1}(D) + \\ (D^{b\#3,1} + D^{b\#3,2} + 1)P(D) = 0$$ (Equation 11-3)

⋮

$$(D^{a\#k,1,1} + D^{a\#k,1,2} + D^{a\#k,1,3})X_1(D) + \\ (D^{a\#k,2,1} + D^{a\#k,2,2} + D^{a\#k,2,3})X_2(D) + \\ ... + (D^{a\#k,n-1,1} + D^{a\#k,n-1,2} + D^{a\#k,n-1,3})X_{n-1}(D) + \\ (D^{b\#k,1} + D^{b\#k,2} + 1)P(D) = 0$$ (Equation 11-k)

⋮

$$(D^{a\#3g-2,1,1} + D^{a\#3g-2,1,2} + D^{a\#3g-2,1,3})X_1(D) + \\ (D^{a\#3g-2,2,1} + D^{a\#3g-2,2,2} + D^{a\#3g-2,2,3})X_2(D) + ... + \\ (D^{a\#3g-2,n-1,1} + D^{a\#3g-2,n-1,2} + D^{\#3g-2,n-1,3})X_{n-1}(D) + \\ (D^{b\#3g-2,1} + D^{b\#3g-2,2} + 1)P(D) = 0$$ (Equation 11-(3g−2))

$$(D^{a\#3g-1,1,1} + D^{a\#3g-1,1,2} + D^{a\#3g-1,1,3})X_1(D) + \\ (D^{a\#3g-1,2,1} + D^{a\#3g-1,2,2} + D^{a\#3g-1,2,3})X_2(D) + ... + \\ (D^{a\#3g-1,n-1,1} + D^{a\#3g-1,n-1,2} + D^{a\#3g-1,n-1,3})X_{n-1}(D) + \\ (D^{b\#3g-1,1} + D^{b\#3g-1,2} + 1)P(D) = 0$$ (Equation 11-(3g−1))

-continued $$(Da\#3g, 1, 1 + Da\#3g, 1, 2 + Da\#3g, 1, 3)X_1(D) + \\ (Da\#3g, 2, 1 + Da\#3g, 2, 2 + Da\#3g, 2, 3) \\ X_2(D) + \ldots + (Da\#3g, n-1, 1 + Da\#3g, \\ n-1, 2 + Da\#3g, n-1, 3)X_{n-1}(D) + \\ (Db\#3g, 1 + Db\#3g, 2 + 1)P(D) = 0$$ (Equation 11 – 3g)

At this time, $X_1(D)$, $X_2(D)$, $X_{n-1}(D)$ are polynomial representations of data (information) $X_1, X_2, \ldots, X_{n-1}$, and $P(D)$ is a polynomial representation of parity. Here, in equations 11-1 to 11-3g, parity check polynomials are assumed such that there are three terms in $X_1(D)$, $X_2(D)$, $X_{n-1}(D)$, and $P(D)$ respectively. In an LDPC-CC of a time varying period of 3g and a coding rate of (n−1)/n (where n is an integer equal to or greater than 2), parity and information at time i are represented by Pi and $X_{i,1}, X_{i,2}, \ldots, X_{i,n-1}$ respectively. If $i \%3g=k$ (where $k=0, 1, 2, \ldots, 3g-1$) is assumed at this time, a parity check polynomial of equation 11−(k+1) holds true. For example, if i=2, i %3=2 (k=2), and therefore equation 12 holds true.

[12]

$$(Da\#3,1,1+Da\#3,1,2+Da\#3,1,3)X_{2,1}+(Da\#3,2,1+ \\ Da\#3,2,2+Da\#3,2,3)X_{2,2}+ \ldots +(Da\#3,n-1,1+ \\ Da\#3,n-1,2+Da\#3,n-1,3)X_{2n-1}+(Db\#3,1+Db\#3, \\ 2+1)P_2=0$$ (Equation 12)

If <Condition #3> and <Condition #4> are satisfied at this time, the possibility of being able to create a code having higher error correction capability is increased.

<Condition #3>

In equations 11-1 to 11-3g, combinations of orders of $X_1(D), X_2(D), \ldots, X_{n-1}(D)$, and $P(D)$ satisfy the following condition:

$(a_{\#1,1,1}\%3, a_{\#1,1,2}\%3, a_{\#1,1,3}\%3)$,
$(a_{\#1,2,1}\%3, a_{\#122}\%3, a_{\#123}\%3), \ldots$,
$(a_{\#1,p,1}\%3, a_{\#1,p,2}\%3, a_{\#1,p,3}\%3), \ldots$, and
$(a_{\#1,n-1,1}\%3, a_{\#1,n-1,2}\%3, a_{\#1,n-1,3}\%3)$ are any of (0, 1, 2), (0, 2, 1), (1, 0, 2), (1, 2, 0), (2, 0, 1), or (2, 1, 0) (where p=1, 2, 3, ..., n−1);
$(a_{\#2,1,1}\%3, a_{\#2,1,2}\%3, a_{\#2,1,3}\%3)$,
$(a_{\#2,2,1}\%3, a_{\#2,2,2}\%3, a_{\#2,2,3}\%3), \ldots$,
$(a_{\#2,p,1}\%3, a_{\#2,p,2}\%3, a_{\#2,p,3}\%3), \ldots$, and
$(a_{\#2,n-1,1}\%3, a_{\#2,n-1,2}\%3, a_{\#2,n-1,3}\%3)$ are any of (0, 1, 2), (0, 2, 1), (1, 0, 2), (1, 2, 0), (2, 0, 1), or (2, 1, 0) (where p=1, 2, 3, ..., n−1);
$(a_{\#3,1,1}\%3, a_{\#3,1,2}\%3, a_{\#3,1,3}\%3)$,
$(a_{\#3,2,1}\%3, a_{\#3,2,2}\%3, a_{\#3,2,3}\%3), \ldots$,
$(a_{\#3,p,1}\%3, a_{\#3,p,2}\%3, a_{\#3,p,3}\%3), \ldots$, and
$(a_{\#3,n-1,1}\%3, a_{\#3,n-1,2}\%3, a_{\#3,n-1,3}\%3)$ are any of (0, 1, 2), (0, 2, 1), (1, 0, 2), (1, 2, 0), (2, 0, 1), or (2, 1, 0) (where p=1, 2, 3, ..., n−1);

$\vdots$ $(a_{\#k,1,1}\%3, a_{\#k,1,2}\%3, a_{\#k,1,3}\%3)$,
$(a_{\#k,2,1}\%3, a_{\#k,2,2}\%3, a_{\#k,2,3}\%3), \ldots$,
$(a_{\#k,p,1}\%3, a_{\#k,p,2}\%3, a_{\#k,p,3}\%3), \ldots$, and
$(a_{\#k,n-1,1}\%3, a_{\#k,n-1,2}\%3, a_{\#k,n-1,3}\%3)$ are any of (0, 1, 2), (0, 2, 1), (1, 0, 2), (1, 2, 0), (2, 0, 1), or (2, 1, 0) (where p=1, 2, 3, ..., n−1, and k=1, 2, 3, ..., 3g);

$\vdots$ $(a\#3g-2,1,1\%3, a\#3g-2,1,2\%3, a\#3g-2,1,3\%3)$,
$(a\#3g-2,2,1\%3, a\#3g-2,2,2\%3, a\#3g-2,2,3\%3)$,
$(a_{\#3g-2,p,1}\%3, a_{\#3g-2,p,2}\%3, a_{\#3g-4,3}\%3), \ldots$, and
$(a_{\#3g-2,n-1,1}\%3, a_{\#3g-2,n-1,2}\%3, a_{\#3g-2,n-1,3}\%3)$ are any of (0, 1, 2), (0, 2, 1), (1, 0, 2), (1, 2, 0), (2, 0, 1), or (2, 1, 0) (where p=1, 2, 3, ..., n−1);
$(a\#3g-1,1,1\%3, a\#3g-1,1,2\%3, a\#3g-1,1,3\%3)$,
$(a\#3g-1,2,1\%3, a\#3g-1,2,2\%3, a\#3g-1,2,3\%3)$,
$(a_{\#3g-1,p,1}\%3, a_{\#3g-1,p,2}\%3, a_{\#3g-1,p,3}\%3), \ldots$, and
$(a_{\#3g-1,n-1,1}\%3, a_{\#3g-1,n-1,2}\%3, a_{\#3g-1,n-1,3}\%3)$ are any of (0, 1, 2), (0, 2, 1), (1, 0, 2), (1, 2, 0), (2, 0, 1), or (2, 1, 0) (where p=1, 2, 3, ..., n−1); and
$(a\#3g,1,1\%3, a\#3g,1,2\%3, a\#3g,1,3\%3)$,
$(a_{\#3g,2,1}\%3, a_{\#3g22}\%3, a_{\#3g23}\%3), \ldots$,
$(a_{\#3g,p,1}\%3, a_{\#3g,p,2}\%3, a_{\#3g,p,3}\%3), \ldots$, and
$(a_{\#3g,n-1,1}\%3, a_{\#3g,n-1,2}\%3, a_{\#3g,n-1,3}\%3)$ are any of (0, 1, 2), (0, 2, 1), (1, 0, 2), (1, 2, 0), (2, 0, 1), or (2, 1, 0) (where p=1, 2, 3, ..., n−1).

In addition, in equations 11-1 to 11-3g, combinations of orders of P(D) satisfy the following condition:

$(b_{\#1,1}\%3, b\#_{1,2}\%3)$,
$(b_{\#2,1}\%3, b\#_{2,2}\%3)$,
$(b_{\#3,1}\%3, b_{\#3,2}\%3), \ldots$,
$(b_{\#k,1}\%3, b_{\#k,2}\%3), \ldots$,
$(b_{\#3g-2,1}\%3, b_{\#3g-2,2}\%3)$,
$(b_{\#3g-1,1}\%3, b_{\#3g-1,2}\%3)$, and
$(b_{\#3g,1}\%3, b_{\#3g,2}\%3)$ are any of (1, 2), or (2, 1) (where k=1, 2, 3, ..., 3g).

<Condition #3> has a similar relationship with respect to equations 11-1 to 11-3g as <Condition #2> has with respect to equations 9-1 to 9-3g. If the condition below (<Condition #4>) is added for equations 11-1 to 11-3g in addition to <Condition #3>, the possibility of being able to create an LDPC-CC having higher error correction capability is increased.

<Condition #4>

Orders of P(D) of equations 11-1 to 11-3g satisfy the following condition:

all values other than multiples of 3 (that is, 0, 3, 6, ..., 3g−3) from among integers from 0 to 3g−1 (0, 1, 2, 3, 4, ..., 3g−2, 3g−1) are present in the values of 6g orders of $(b_{\#1,1}\%3g, b_{\#1,2}\%3g)$,
$(b_{\#2,1}\%3g, b_{\#2,2}\%3g)$,
$(b_{\#3,1}\%3g, b_{\#3,2}3g)$,
$(b_{\#k,1}\%3g, b_{\#k,2}\%3g)$,
$(b_{\#3g-2,1}\%3g, b_{\#3g-2,2}\%3g)$,
$(b_{\#3g-1,1}\%3g, b\#_{3g-1,2}\%3g)$,
$(b_{\#3g,1}\%3g, b_{\#3g,2}\%3g)$ (in this case, two orders form a pair, and therefore the number of orders forming 3g pairs is 6g).

The possibility of obtaining good error correction capability is high if there is also randomness while regularity is maintained for positions at which "1"s are present in a parity check matrix. With an LDPC-CC for which the time varying period is 3g (where g=2, 3, 4, 5, ...) and the coding rate is (n−1)/n (where n is an integer equal to or greater than 2) that has parity check polynomials of equations 11-1 to 11-3g, if a code is created in which <Condition #4> is applied in addition to <Condition #3>, it is possible to provide randomness while maintaining regularity for positions at which "1"s are present in a parity check matrix, and therefore the possibility of obtaining good error correction capability is increased.

Next, an LDPC-CC of a time varying period of 3g (where g=2, 3, 4, 5, ...) is considered that enables encoding to be performed easily and provides relevancy to parity bits and data bits of the same point in time. At this time, if the coding rate is (n−1)/n (where n is an integer equal to or greater than 2), LDPC-CC parity check polynomials can be represented as shown below.

[13]

$$(D^{a\#1,1,1} + D^{a\#1,1,2} + 1)X_1(D) +$$ (Equation 13-1)
$$(D^{a\#1,2,1} + D^{a\#1,2,2} + 1)X_2(D) + \ldots +$$
$$(D^{a\#1,n-1,1} + D^{a\#1,n-1,2} + 1)X_{n-1}(D) +$$
$$(D^{b\#1,1} + D^{b\#1,2} + 1)P(D) = 0$$

$$(D^{a\#2,1,1} + D^{a\#2,1,2} + 1)X_1(D) +$$ (Equation 13-2)
$$(D^{a\#2,2,1} + D^{a\#2,2,2} + 1)X_2(D) + \ldots +$$
$$(D^{a\#2,n-1,1} + D^{a\#2,n-1,2} + 1)X_{n-1}(D) +$$
$$(D^{b\#2,1} D^{b\#2,2} + 1)P(D) = 0$$

$$(D^{a\#3,1,1} + D^{a\#3,1,2} + 1)X_1(D) +$$ (Equation 13-3)
$$(D^{a\#3,2,1} + D^{a\#3,2,2} + 1)X_2(D) + \ldots +$$
$$(D^{a\#3,n-1,1} + D^{a\#3,n-1,2} + 1)X_{n-1}(D) +$$
$$(D^{b\#3,1} D^{b\#3,2} + 1)P(D) = 0$$

$$\vdots$$

$$(D^{a\#k,1,1} + D^{a\#k,1,2} + 1)X_1(D) +$$ (Equation 13-k)
$$(D^{a\#k,2,1} + D^{a\#k,2,2} + 1)X_2(D) + \ldots +$$
$$(D^{a\#k,n-1,1} + D^{a\#k,n-1,2} + 1)X_{n-1}(D) +$$
$$(D^{b\#k,1} + D^{b\#k,2} + 1)P(D) = 0$$

$$\vdots$$

$$(Da\#3g-2,1,1 + Da\#3g-2,1,2+1)X_1(D) +$$ (Equation 13-(3g−2))
$$(Da\#3g-2,2,1 + Da\#3g-2,2,2+1)X_2(D) + \ldots + (Da\#3g-2,n-1,$$
$$1 + Da\#3g-2,n-1,2+1)X_{n-1}(D) +$$
$$(Db\#3g-2,1 + Db\#3g-2,2+1)P(D) = 0$$

$$(Da\#3g-1,1,1 + Da\#3g-1,1,2+1)X_1(D) +$$ (Equation 13-(3g−1))
$$(Da\#3g-1,2,1 + Da\#3g-1,2,2+1)$$
$$X_2(D) + \ldots + (Da\#3g-1,n-1,$$
$$1 + Da\#3g-1,n-1,2+1)X_{n-1}(D) +$$
$$(Db\#3g-1,1 + Db\#3g-1,2+1)P(D) = 0$$

$$(D^{a\#3g,1,1} + D^{a\#3g,1,2} + 1)X_1(D) +$$ (Equation 13-g)
$$(D^{a\#3g,2,1} + D^{a\#3g,2,2} + 1)X_2(D) + \ldots +$$
$$(D^{a\#3g,n-1,1} + D^{a\#3g,n-1,2} + 1)X_{n-1}(D) +$$
$$(D^{b\#3g,1} + D^{b\#3g,2} + 1)P(D) = 0$$

At this time, $X_1(D), X_2(D), \ldots, X_{n-1}(D)$ are polynomial representations of data (information) $X_1, X_2, \ldots, X_{n-1}$, and $P(D)$ is a polynomial representation of parity. In equations 13-1 to 13-3g, parity check polynomials are assumed such that there are three terms in $X_1(D), X_2(D), \ldots, X_{n-1}(D)$, and $P(D)$ respectively, and term $D^0$ is present in $X_1(D), X_2(D), \ldots, X_{n-1}(D)$, and $P(D)$ (where k=1, 2, 3, . . . , 3g).

In an LDPC-CC of a time varying period of 3g and a coding rate of (n−1)/n (where n is an integer equal to or greater than 2), parity and information at time i are represented by Pi and $X_{i,1}, X_{i,2}, \ldots, X_{i,n-1}$ respectively. If i %3g=k (where k=0, 1, 2, . . . 3g−1) is assumed at this time, a parity check polynomial of equation 13−(k+1) holds true. For example, if i=2, i %3g=2 (k=2), and therefore equation 14 holds true.

[14]

$$(D^{a\#3,1,1}+D^{a\#3,1,2}+1)X_{2,1}+(D^{a\#3,2,1}+D^{a\#3,2,2}+1)$$
$$X_{2,2}+ \ldots +(D^{a\#3n-1,1}+D^{a\#3,n-1,2}+1)X_{2n-1}+$$
$$(D^{b\#3,1}+D^{b\#3,2}+1)P_2=0$$ (Equation 14)

If following <Condition #5> and <Condition #6> are satisfied at this time, the possibility of being able to create a code having higher error correction capability is increased.

<Condition #5>

In equations 13-1 to 13-3g, combinations of orders of $X_1(D), X_2(D), \ldots, X_{n-1}(D)$, and $P(D)$ satisfy the following condition:

($a_{\#1,1,1}$%3, $a_{\#1,1,2}$%3),
($a_{\#1,2,1}$%3, $a_{\#1,2,2}$%3), . . . ,
($a_{\#1,p,1}$%3, $a_{\#1,p,2}$%3), . . . , and
($a_{\#1,n-1,1}$%3, $a_{\#1,n-1,2}$%3) are any of (1, 2), (2, 1) (p=1, 2, 3, . . . , n−1);
($a_{\#2,1,1}$%3, $a_{\#2,1,2}$%3),
($a_{\#2,2,1}$%3, $a_{\#2,2,2}$%3), . . . ,
($a_{\#2,p,1}$%3, $a_{\#2,p,2}$%3), . . . , and
($a_{\#2,n-1,1}$%3, $a_{\#2,n-1,2}$%3) are any of (1, 2), or (2, 1) (where p=1, 2, 3, . . . , n−1);
($a_{\#3,1,1}$%3, $a_{\#3,1,2}$%3),
($a_{\#3,2,1}$%3, $a_{\#3,2,2}$%3), . . . ,
($a_{\#3,p,1}$%3, $a_{\#3,p,2}$%3), . . . , and
($a_{\#3,n-1,1}$%3, $a_{\#3,n-1,2}$%3) are any of (1, 2), or (2, 1) (where p=1, 2, 3, . . . , n−1);

$$\vdots$$

($a_{\#k,1,1}$%3, $a_{\#k,1,2}$%3),
($a_{\#k,2,1}$%3, $a_{\#k,2,2}$%3), . . . ,
($a_{\#k,p,1}$% 3, $a_{\#k,p,2}$%3), . . . , and
($a_{\#k,n-1,1}$%3, $a_{\#k,n-1,2}$%3) are any of (1, 2), or (2, 1) (where p=1, 2, 3, . . . , n−1) (where, k=1, 2, 3, . . . , 3g)

$$\vdots$$

(a#3g−2,1,1%3, a#3g−2,1,2%3),
(a#3g−2,2,1%3, a#3g−2,2,2%3), . . . ,
(a#3g−2,p,1%3, a#3g−2,p,2%3), . . . ,
and (a#3g−2,n−1,1%3, a#3g−2,n−1,2%3) are any of (1, 2), or (2, 1) (where p=1, 2, 3, . . . , n−1);
(a#3g−1,1,1%3, a#3g−1,1,2%3),
(a#3g−1,2,1%3, a#3g−1,2,2%3),
(a#3g−1,p,1%3, a#3g−1,p,2%3), . . . , and
(a#3g−1,n−1,1%3, a#3g−1,n−1,2%3) are any of (1, 2), or (2, 1) (where p=1, 2, 3, . . . , n−1); and
(a#3g,1,1%3, a#3g,1,2%3),
(a#3g,2,1%3, a#3g,2,2%3),
(a#3g,p,1%3, a#3g,p,2%3), . . . , and
(a#3g,n−1,1%3, a#3g,n−1,2%3) are any of (1, 2), or (2, 1) (where p=1, 2, 3, . . . , n−1).

In addition, in equations 13-1 to 13-3g, combinations of orders of P(D) satisfy the following condition:

($b_{\#1,1}$%3, $b_{\#1,2}$%3),
($b_{\#2,1}$%3, $b_{\#2,2}$%3),
($b_{\#3,1}$%3, $b_{\#3,2}$%3),
($b_{\#k,1}$%3, $b_{\#k,2}$%3),
($b_{\#3g-2,1}$%3, $b_{\#3g-2,2}$%3),
($b_{\#3g-1,1}$%3, $b_{\#3g-1,2}$%3), and
($b_{\#3g,1}$%3, $b_{\#3g,2}$%3) are any of (1, 2), or (2, 1) (where k=1, 2, 3, . . . , 3g).

<Condition #5> has a similar relationship with respect to equations 13-1 to 13-3g as <Condition #2> has with respect to equations 9-1 to 9-3g. If the condition below (<Condition #6>) is added for equations 13-1 to 13-3g in addition to <Condition #5>, the possibility of being able to create a code having high error correction capability is increased.

<Condition #6>

Orders of $X_1(D)$ of equations 13-1 to 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of ($a_{\#1,1,1}$%3g, $a_{\#1,1,2}$%3g),
($a_{\#}2,1,1$%3g, $a_{\#2,1,2}$%3g), . . . ,
($a_{\#p,1,1}$%3g, $a_{\#p,1,2}$%3g), . . . , and $(a_{\#3g,1,1}\%3g, a_{\#3g,1,2}\%3g)$ (where $p=1, 2, 3, \ldots, 3g$);

Orders of $X_2(D)$ of equations 13-1 to 13-3g satisfy the following condition: all values other than multiples of 3 (that is, $0, 3, 6, \ldots, 3g-3$) from among integers from 0 to $3g-1$ $(0, 1, 2, 3, 4, \ldots, 3g-2, 3g-1)$ are present in the following $6g$ values of $(a_{\#1,2,1}\%3g, a_{\#1,2,2}\%3g)$,
$(a_{\#2,2,1}\%3g, a_{\#2,2,2}\%3g)$,
$(a_{\#p,2,1}\%3g, a_{\#p,2,2}\%3g), \ldots$, and
$(a_{\#3g,2,1}\%3g, a_{\#3g,2,2}\%3g)$ (where $p=1, 2, 3, \ldots, 3g$);

Orders of $X_3(D)$ of equations 13-1 to 13-3g satisfy the following condition: all values other than multiples of 3 (that is, $0, 3, 6, \ldots, 3g-3$) from among integers from 0 to $3g-1$ $(0, 1, 2, 3, 4, \ldots, 3g-2, 3g-1)$ are present in the following $6g$ values of $(a_{\#1,3,1}\%3g, a_{\#1,3,2}\%3g)$,
$(a_{\#2,3,1}\%3g, a_{\#2,3,2}\%3g), \ldots$,
$(a_{\#p,3,1}\%3g, a_{\#p,3,2}\%3g), \ldots$, and
$(a_{\#3g,3,1}\%3g, a_{\#3g,3,2}\%3g)$ (where $p=1, 2, 3, \ldots, 3g$);

⋮

Orders of $X_k(D)$ of equations 13-1 to 13-3g satisfy the following condition: all values other than multiples of 3 (that is, $0, 3, 6, \ldots, 3g-3$) from among integers from 0 to $3g-1$ $(0, 1, 2, 3, 4, \ldots, 3g-2, 3g-1)$ are present in the following $6g$ values of $(a_{\#1,k,1}\%3g, a_{\#1,k,2}\%3g)$,
$(a_{\#2,k,1}\%3g, a_{\#2,k,2}\%3g), \ldots$,
$(a_{\#p,k,1}\%3g, a_{\#p,k,2}\%3g), \ldots$, and
$(a_{\#3g,k,1}\%3g, a_{\#3g,k,2}\%3g)$ (where $p=1, 2, 3, \ldots, 3g$, and $k=1, 2, 3, \ldots, n-1$);

⋮

Orders of $X_{n-1}(D)$ of equations 13-1 to 13-3g satisfy the following condition: all values other than multiples of 3 (that is, $0, 3, 6, \ldots, 3g-3$) from among integers from 0 to $3g-1$ $(0, 1, 2, 3, 4, \ldots, 3g-2, 3g-1)$ are present in the following $6g$ values of $(a_{\#1,n-1,1}\%3g, a_{\#1,n-1,2}\%3g)$,
$(a_{\#2,n-1,1}\%3g, a_{\#2,n-1,2}\%3g), \ldots$,
$(a_{\#p,n-1,1}\%3g, a_{\#p,n-1,2}\%3g), \ldots$, and
$(a_{\#3g,n-1,1}\%3g, a_{\#3g,n-1,2}\%3g)$ (where $p=1, 2, 3, \ldots, 3g$); and Orders of $P(D)$ of equations 13-1 to 13-3g satisfy the following condition: all values other than multiples of 3 (that is, $0, 3, 6, \ldots, 3g-3$) from among integers from 0 to $3g-1$ $(0, 1, 2, 3, 4, \ldots, 3g-2, 3g-1)$ are present in the following $6g$ values of $(b_{\#1,1}\%3g, b_{\#1,2}\%3g)$,
$(b_{\#2,1}\%3g, b_{\#2,2}\%3g)$,
$(b_{\#3,1}\%3g, b_{\#3,2}\%3g), \ldots$,
$(b_{\#k,1}\%3g, b_{\#k,2}\%3g), \ldots$,
$(b_{\#3g-2,1}\%3g, b_{\#3g-2,2}\%3g)$,
$(b_{\#3g-1,1}\%3g, b_{\#3g-1,2}\%3g)$ and
$(b_{\#3g,1}\%3g, b_{\#3g,2}\%3g)$ (where $k=1, 2, 3, \ldots, n-1$).

The possibility of obtaining good error correction capability is high if there is also randomness while regularity is maintained for positions at which "1"s are present in a parity check matrix. With an LDPC-CC for which the time varying period is $3g$ (where $g=2, 3, 4, 5, \ldots$) and the coding rate is $(n-1)/n$ (where n is an integer equal to or greater than 2) that has parity check polynomials of equations 13-1 to 13-3g, if a code is created in which <Condition #6> is applied in addition to <Condition #5>, it is possible to provide randomness while maintaining regularity for positions at which "1"s are present in a parity check matrix, and therefore the possibility of obtaining good error correction capability is increased.

The possibility of being able to create an LDPC-CC having higher error correction capability is also increased if a code is created using <Condition #6'> instead of <Condition #6>, that is, using <Condition #6'> in addition to <Condition #5>.

<Condition #6'>

Orders of $X_1(D)$ of equations 13-1 to 13-3g satisfy the following condition: all values other than multiples of 3 (that is, $0, 3, 6, \ldots, 3g-3$) from among integers from 0 to $3g-1$ $(0, 1, 2, 3, 4, \ldots, 3g-2, 3g-1)$ are present in the following $6g$ values of $(a_{\#1,1,1}\%3g, a_{\#1,1,2}\%3g)$,
$(a_{\#2,1,1}\%3g, a_{\#2,1,2}\%3g), \ldots$,
$(a_{\#p,1,1}\%3g, a_{\#p,1,2}\%3g), \ldots$, and
$(a_{\#3g,1,1}\%3g, a_{\#3g,1,2}\%3g)$ (where $p=1, 2, 3, \ldots, 3g$);

Orders of $X_2(D)$ of equations 13-1 to 13-3g satisfy the following condition: all values other than multiples of 3 (that is, $0, 3, 6, \ldots, 3g-3$) from among integers from 0 to $3g-1$ $(0, 1, 2, 3, 4, \ldots, 3g-2, 3g-1)$ are present in the following $6g$ values of $(a_{\#1,2,1}\%3g, a_{\#1,2,2}\%3g)$,
$(a_{\#2,2,1}\%3g, a_{\#2,2,2}\%3g), \ldots$,
$(a_{\#p,2,1}\%3g, a_{\#p,2,2}\%3g), \ldots$, and
$(a_{\#3g,2,1}\%3g, a_{\#3g,2,2}\%3g)$ (where $p=1, 2, 3, \ldots, 3g$);

Orders of $X_3(D)$ of equations 13-1 to 13-3g satisfy the following condition: all values other than multiples of 3 (that is, $0, 3, 6, \ldots, 3g-3$) from among integers from 0 to $3g-1$ $(0, 1, 2, 3, 4, \ldots, 3g-2, 3g-1)$ are present in the following $6g$ values of $(a_{1,3,1}\%3g, a_{1,3,2}\%3g)$,
$(a_{2,3,1}\%3g, a_{2,3,2}\%3g)$,
$(a_{p,3,1}\%3g, a_{p,3,2}\%3g), \ldots$, and
$(a_{3g,3,1}\%3g, a_{3g,3,2}\%3g)$ (where $p=1, 2, 3, \ldots, 3g$);

⋮

Orders of $X_k(D)$ of equations 13-1 to 13-3g satisfy the following condition: all values other than multiples of 3 (that is, $0, 3, 6, \ldots, 3g-3$) from among integers from 0 to $3g-1$ $(0, 1, 2, 3, 4, \ldots, 3g-2, 3g-1)$ are present in the following $6g$ values of $(a_{1,k,1}\%3g, a_{1,k,2}\%3g)$,
$(a_{2,k,1}\%3g, a_{2,k,2}\%3g), \ldots$,
$(a_{p,k,1}\%3g, a_{\#p,k,2}\%3g), \ldots$,
$(a_{3g,k,1}\%3g, a_{\#3g,k,2}\%3g)$ (where $p=1, 2, 3, \ldots, 3g$, and $k=1, 2, 3, \ldots, n-1$);

⋮

Orders of $X_{n-1}(D)$ of equations 13-1 to 13-3g satisfy the following condition: all values other than multiples of 3 (that is, $0, 3, 6, \ldots, 3g-3$) from among integers from 0 to $3g-1$ $(0, 1, 2, 3, 4, \ldots, 3g-2, 3g-1)$ are present in the following $6g$ values of $(a_{\#1,n-1,1}\%3g, a_{\#1,n-1,2}\%3g)$,
$(a_{\#2,n-1,1}\%3g, a_{\#2,n-1,2}\%3g), \ldots$,
$(a_{\#p,n-1,1}\%3g, a_{\#p,n-1,2}\%3g), \ldots$,
$(a_{\#3g,n-1,1}\%3g, a_{\#3g,n-1,2}\%3g)$ (where $p=1, 2, 3, \ldots, 3g$); or Orders of $P(D)$ of equations 13-1 to 13-3g satisfy the following condition: all values other than multiples of 3 (that is, $0, 3, 6, \ldots, 3g-3$) from among integers from 0 to $3g-1$ $(0, 1, 2, 3, 4, \ldots, 3g-2, 3g-1)$ are present in the following $6g$ values of $(b_{\#1,1}\%3g, b_{\#1,2}\%3g)$,
$(b_{\#2,1}\%3g, b_{\#2,2}\%3g)$,
$(b_{\#3,1}\%3g, b_{\#3,2}\%3g), \ldots$,
$(b_{\#1}\%3g, b_{\#k,2}\%3g), \ldots$,
$(b_{\#3g-2,1}\%3g, b_{\#3g-2,2}\%3g)$,
$(b_{\#3g-1,1}\%3g, b_{\#3g-1,2}\%3g)$, ($b_{\#3g,1}\%3g$, $b_{\#3g,2}\%3g$) (where k=1, 2, 3, ..., 3g).

The above description relates to an LDPC-CC of a time varying period of 3g and a coding rate of (n−1)/n (where n is an integer equal to or greater than 2). Below, conditions are described for orders of an LDPC-CC of a time varying period of 3g and a coding rate of 1/2 (n=2).

Consider equations 15-1 to 15-3g as parity check polynomials of an LDPC-CC for which the time varying period is 3g (where g=1, 2, 3, 4, ...) and the coding rate is 1/2 (n=2).

[15]

$$(D^{a\#1,1,1} + D^{a\#1,1,2} + D^{a\#1,1,3})X(D) + \\ (D^{b\#1,1} + D^{b\#1,2} + D^{b\#1,3})P(D) = 0 \quad \text{(Equation 15-1)}$$

$$(D^{a\#2,1,1} + D^{a\#2,1,2} + D^{a\#2,1,3})X(D) + \\ (D^{b\#2,1} + D^{b\#2,2} + D^{b\#2,3})P(D) = 0 \quad \text{(Equation 15-2)}$$

$$(D^{a\#3,1,1} + D^{a\#3,1,2} + D^{a\#3,1,3})X(D) + \\ (D^{b\#3,1} + D^{b\#3,2} + D^{b\#3,3})P(D) = 0 \quad \text{(Equation 15-3)}$$

$$\vdots$$

$$(D^{a\#k,1,1} + D^{a\#k,1,2} + D^{a\#k,1,3})X(D) + \\ (D^{b\#k,1} + D^{b\#k,2} + D^{b\#k,3})P(D) = 0 \quad \text{(Equation 15-k)}$$

$$\vdots$$

$$(D^{a\#3g-2,1,1} + D^{a\#3g-2,1,2} + D^{a\#3g-2,1,3})X(D) + \\ (D^{b\#3g-2,1} + D^{b\#3g-2,2} + D^{b\#3g-2,3})P(D) = 0 \quad \text{(Equation 15-(3g-2))}$$

$$(D^{a\#3g-1,1,1} + D^{a\#3g-1,1,2} + D^{a\#3g-1,1,3})X(D) + \\ (D^{b\#3g-1,1} + D^{b\#3g-1,2} + D^{b\#3g-1,3})P(D) = 0 \quad \text{(Equation 15-(3g-1))}$$

$$(D^{a\#3g,1,1} + D^{a\#3g,1,2} + D^{a\#3g,1,3})X(D) + \\ (D^{b\#3g,1} + D^{b\#3g,2} + D^{b\#3g,3})P(D) = 0 \quad \text{(Equation 15-3g)}$$

At this time, X(D) is a polynomial representation of data (information) X and P(D) is a polynomial representation of parity. Here, in equations 15-1 to 15-3g, parity check polynomials are assumed such that there are three terms in X(D) and P(D) respectively.

Thinking in the same way as in the case of an LDPC-CC of a time varying period of 3 and an LDPC-CC of a time varying period of 6, the possibility of being able to obtain higher error correction capability is increased if the condition below (Condition #2-1>) is satisfied in an LDPC-CC of a time varying period of 3g and a coding rate of 1/2 (n=2) represented by parity check polynomials of equations 15-1 to 15-3g.

In an LDPC-CC of a time varying period of 3g and a coding rate of 1/2 (n=2), parity and information at time i are represented by Pi and $X_{i,1}$ respectively. If i %3g=k (where k=0, 1, 2, ..., 3g−1) is assumed at this time, a parity check polynomial of equation 15-(k+1) holds true. For example, if i=2, i %3g=2 (k=2), and therefore equation 16 holds true.

[16]

$$(D^{a\#3,1,1}+D^{a\#3,1,2}+D^{a\#3,1,3})X_{2,1}+(D^{b\#3,1}+D^{b\#3,2}+D^{b\#3,3})P_2=0 \quad \text{(Equation 16)}$$

In equations 15-1 to 15-3g, it is assumed that $a_{\#k,1,1}$, $a_{\#k,1,2}$, and $a_{\#k,1,3}$ are integers (where $a_{\#k,1,1} \neq a_{\#k,1,2} \neq a_{\#k,1,3}$) (where k=1, 2, 3, ..., 3g). Also, it is assumed that $b_{\#k,1}$, $b_{\#k,2}$, and $b_{\#k,3}$ are integers (where $b_{\#k,1} \neq b_{\#k,2} \neq b_{\#k,3}$). A parity check polynomial of equation 15-k (k=1, 2, 3, ..., 3g) is called "check equation #k," and a sub-matrix based on the parity check polynomial of equation 15-k is designated k-th sub-matrix $H_k$. Next, an LDPC-CC of a time varying period of 3g is considered that is generated from first sub-matrix $H_1$, second sub-matrix $H_2$, third sub-matrix H3, ..., and 3g-th sub-matrix $H_{3g}$.

<Condition #2-1>

In equations 15-1 to 15-3g, combinations of orders of X(D) and P(D) satisfy the following condition:

($a_{\#1,1,1}\%3$, $a_{\#1,1,2}\%3$, $a_{\#1,1,3}\%3$) and
($b_{\#1,1}\%3$, $b_{\#1,2}\%3$, $b_{\#1,3}\%3$) are any of (0, 1, 2), (0, 2, 1), (1, 0, 2), (1, 2, 0), (2, 0, 1), or (2, 1, 0);

($a_{\#2,1,1}\%3$, $a_{\#2,1,2}\%3$, $a_{\#2,1,3}\%3$) and
($b_{\#2,1}\%3$, $b_{\#2,2}\%3$, $b_{\#2,3}\%3$) are any of (0, 1, 2), (0, 2, 1), (1, 0, 2), (1, 2, 0), (2, 0, 1), or (2, 1, 0);

($a_{\#3,1,1}\%3$, $a_{\#3,1,2}\%3$, $a_{\#3,1,3}\%3$) and
($b_{\#3,1}\%3$, $b_{\#3,2}\%3$, $b_{\#3,3}\%3$) are any of (0, 1, 2), (0, 2, 1), (1, 0, 2), (1, 2, 0), (2, 0, 1), or (2, 1, 0);

$\vdots$ ($a_{\#k,1,1}\%3$, $a_{\#k,1,2}\%3$, $a_{\#k,1,3}\%3$) and
($b_{\#k,1}\%3$, $b_{\#k,2}\%3$, $b_{\#k,3}\%3$) are any of (0, 1, 2), (0, 2, 1), (1, 0, 2), (1, 2, 0), (2, 0, 1), or (2, 1, 0) (where k=1, 2, 3, ..., 3g);

$\vdots$ ($a_{\#3g-2,1,1}\%3$, $a_{\#3g-2,1,2}\%3$, $a_{\#3g-2,1,3}\%3$) and
($b_{\#3g-2,1}\%3$, $b_{\#3g-2,2}\%3$, $b_{\#3g-2,3}\%3$) are any of (0, 1, 2), (0, 2, 1), (1, 0, 2), (1, 2, 0), (2, 0, 1), or (2, 1, 0);

($a_{\#3g-1,1,1}\%3$, $a_{\#3g-1,1,2}\%3$, $a_{\#3g-1,1,3}\%3$) and
($b_{\#3g-1,1}\%3$, $b_{\#3g-1,2}\%3$, $b_{\#3g-1,3}\%3$) are any of (0, 1, 2), (0, 2, 1), (1, 0, 2), (1, 2, 0), (2, 0, 1), or (2, 1, 0); and ($a_{\#3g,1,1}\%3$, $a_{\#3g,1,2}\%3$, $a_{\#3g,1,3}\%3$) and
($b_{\#3g,1}\%3$, $b_{\#3g,2}\%3$, $b_{\#3g,3}\%3$) are any of (0, 1, 2), (0, 2, 1), (1, 0, 2), (1, 2, 0), (2, 0, 1), or (2, 1, 0).

Taking ease of performing encoding into consideration, it is desirable for one "0" to be present among the three items ($b_{\#k,1}\%3$, $b_{\#k,2}\%3$, $b_{\#k,3}\%3$) (where k=1, 2, ..., 3g) in equations 15-1 to 15-3g. This is because of a feature that, if $D^0=1$ holds true and $b_{\#k,1}$, $b_{\#k,2}$ and $b_{\#k,3}$ are integers equal to or greater than 0 at this time, parity P can be found sequentially.

Also, in order to provide relevancy between parity bits and data bits of the same point in time, and to facilitate a search for a code having high correction capability, it is desirable for one "0" to be present among the three items ($a_{\#k,1,1}\%3$, $a_{\#k,1,2}\%3$, $a_{\#k,1,3}\%3$) (where k=1, 2, ..., 3g).

Next, an LDPC-CC of a time varying period of 3g (where g=2, 3, 4, 5, ...) that takes ease of encoding into account is considered. At this time, if the coding rate is 1/2 (n=2), LDPC-CC parity check polynomials can be represented as shown below.

[17]

$$(D^{a\#1,1,1}+D^{a\#1,1,2}+D^{a\#1,1,3})X(D)+(D^{b\#1,1}+D^{b\#1,2}+1)P(D)=0 \quad \text{(Equation 17-1)}$$

$$(D^{a\#2,1,1}+D^{a\#2,1,2}+D^{a\#2,1,3})X(D)+(D^{b\#2,1}+D^{b\#2,2}+1)P(D)=0 \quad \text{(Equation 17-2)}$$

$$(D^{a\#3,1,1}+D^{a\#3,1,2}+D^{a\#3,1,3})X(D)+(D^{b\#3,1}+D^{b\#3,2}+1)P(D)=0 \quad \text{(Equation 17-3)}$$

At this time, X(D) is a polynomial representation of data (information) X and P(D) is a polynomial representation of parity. Here, in equations 17-1 to 17-3g, parity check polynomials are assumed such that there are three terms in X(D) and P(D) respectively. In an LDPC-CC of a time varying period of 3g and a coding rate of 1/2 (n=2), parity and information at time i are represented by Pi and $X_{i,1}$ respectively. If i %3g=k (where k=0, 1, 2, . . . , 3g−1) is assumed at this time, a parity check polynomial of equation 17-(k+1) holds true. For example, if i=2, i %3g=2 (k=2), and therefore equation 18 holds true.

[18]

$$(D^{a\#3,1,1}+D^{a\#3,1,2}+D^{a\#3,1,3})X_{2,1}+(D^{b\#3,1}+D^{b\#3,2}+1)P_2 0 \quad \text{(Equation 18)}$$

If <Condition #3-1> and <Condition #4-1> are satisfied at this time, the possibility of being able to create a code having higher error correction capability is increased.

<Condition #3-1>

In equations 17-1 to 17-3g, combinations of orders of X(D) satisfy the following condition:

$(a_{\#1,1,1}\%3, a_{\#1,1,2}\%3, a_{\#1,1,3}\%3)$ are any of (0, 1, 2), (0, 2, 1), (1, 0, 2), (1, 2, 0), (2, 0, 1), or (2, 1, 0);

$(a_{\#2,1,1}\%3, a_{\#2,1,2}\%3, a_{\#2,1,3}\%3)$ are any of (0, 1, 2), (0, 2, 1), (1, 0, 2), (1, 2, 0), (2, 0, 1), or (2, 1, 0);

$(a_{\#3,1,1}\%3, a_{\#3,1,2}\%3, a_{\#3,1,3}\%3)$ are any of (0, 1, 2), (0, 2, 1), (1, 0, 2), (1, 2, 0), (2, 0, 1), or (2, 1, 0);

⋮

$(a_{\#k,1,1}\%3, a_{\#k,1,2}\%3, a_{\#k,1,3}\%3)$ are any of (0, 1, 2), (0, 2, 1), (1, 0, 2), (1, 2, 0), (2, 0, 1), or (2, 1, 0) (where k=1, 2, 3, . . . , 3g);

⋮

$(a_{\#3g-2,1,1}\%3, a_{\#3g-2,1,2}\%3, a_{\#3g-2,1,3}\%3)$ are any of (0, 1, 2), (0, 2, 1), (1, 0, 2), (1, 2, 0), (2, 0, 1), or (2, 1, 0);

$(a_{\#3g-1,1,1}\%3, a_{\#3g-1,1,2}\%3, a_{\#3g-1,1,3}\%3)$ are any of (0, 1, 2), (0, 2, 1), (1, 0, 2), (1, 2, 0), (2, 0, 1), or (2, 1, 0); and $(a_{\#3g,1,1}\%3, a_{\#3g,1,2}\%3, a_{\#3g,1,3}\%3)$ are any of (0, 1, 2), (0, 2, 1), (1, 0, 2), (1, 2, 0), (2, 0, 1), or (2, 1, 0).

In addition, in equations 17-1 to 17-3g, combinations of orders of P(D) satisfy the following condition:

$(b_{\#1,1}\%3, b_{\#1,2}\%3),$ $(b_{\#2,1}\%3, b_{\#2,2}\%3),$ $(b_{\#3,1}\%3, b_{\#3,2}\%3),$ . . . , $(b_{\#k,1}\%3, b_{\#k,2}\%3),$ . . . , $(b_{\#3g-2,1}\%3, b_{\#3g-2,2}\%3),$ $(b_{\#3g-1,1}\%3, b_{\#3g-1,2}\%3),$ and $(b_{\#3g,1}\%3, b_{\#3g,2}\%3)$ are any of (1, 2), or (2, 1) (k=1, 2, 3, . . . , 3g).

<Condition #3-1> has a similar relationship with respect to equations 17-1 to 17-3g as <Condition #2-1> has with respect to equations 15-1 to 15-3g. If the condition below (<Condition #4-1>) is added for equations 17-1 to 17-3g in addition to <Condition #3-1>, the possibility of being able to create an LDPC-CC having higher error correction capability is increased.

<Condition #4-1>

Orders of P(D) of equations 17-1 to 17-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(b_{\#1,1}\%3g, b_{\#1,2}\%3g),$ $(b_{\#2,1}\%3g, b_{\#2,2}\%3g),$ $(b_{\#3,1}\%3g, b_{\#3,2}\%3g),$ . . . , $(b_{\#k,1}\%3g, b_{\#k,2}\%3g),$ . . . , $(b_{\#3g-2,1}\%3g, b_{\#3g-2,2}\%3g),$ $(b_{\#3g-1,1}\%3g, b_{\#3g-1,2}\%3g),$ and $(b_{\#3g,1}\%3g, b_{\#3g,2}\%3g).$ The possibility of obtaining good error correction capability is high if there is also randomness while regularity is maintained for positions at which "1"s are present in a parity check matrix. With an LDPC-CC for which the time varying period is 3g (where g=2, 3, 4, 5, . . . ) and the coding rate is 1/2 (n=2) that has parity check polynomials of equations 17-1 to 17-3g, if a code is created in which <Condition #4-1> is applied in addition to <Condition #3-1>, it is possible to provide randomness while maintaining regularity for positions at which "1"s are present in a parity check matrix, and therefore the possibility of obtaining better error correction capability is increased.

Next, an LDPC-CC of a time varying period of 3g (where g=2, 3, 4, 5, . . . ) is considered that enables encoding to be performed easily and provides relevancy to parity bits and data bits of the same point in time. At this time, if the coding rate is 1/2 (n=2), LDPC-CC parity check polynomials can be represented as shown below.

[19]

$$(D^{a\#1,1,1} + D^{a\#1,1,2} + 1)X(D) + \quad \text{(Equation 19-1)}$$
$$(D^{b\#1,1} + D^{b\#1,2} + 1)P(D) = 0$$

$$(D^{a\#2,1,1} + D^{a\#2,1,2} + 1)X(D) + \quad \text{(Equation 19-2)}$$
$$(D^{b\#2,1} + D^{b\#2,2} + 1)P(D) = 0$$

$$(D^{a\#3,1,1} + D^{a\#3,1,2} + 1)X(D) + \quad \text{(Equation 19-3)}$$
$$(D^{b\#3,1} + D^{b\#3,2} + 1)P(D) = 0$$

⋮

$$(D^{a\#k,1,1} + D^{a\#k,1,2} + 1)X(D) + \quad \text{(Equation 19-k)}$$
$$(D^{b\#k,1} + D^{b\#k,2} + 1)P(D) = 0$$

⋮

$$(D^{a\#3g-2,1,1} + D^{a\#3g-2,1,2} + 1)X(D) + \quad \text{(Equation 19-(3g − 2))}$$
$$(D^{b\#3g-2,1} + D^{b\#3g-2,2} + 1)P(D) = 0$$

$$(D^{a\#3g-1,1,1} + D^{a\#3g-1,1,2} + 1)X(D) + \quad \text{(Equation 19-(3g − 1))}$$
$$(D^{b\#3g-1,1} + D^{b\#3g-1,2} + 1)P(D) = 0$$

$$(D^{a\#3g,1,1} + D^{a\#3g,1,2} + 1)X(D) + \quad \text{(Equation 19-3g)}$$
$$(D^{b\#3g,1} + D^{b\#3g,2} + 1)P(D) = 0$$

At this time, X(D) is a polynomial representation of data (information) X and P(D) is a polynomial representation of parity.

In equations 19-1 to 19-3g, parity check polynomials are assumed such that there are three terms in X(D) and P(D) respectively, and a $D^0$ term is present in X(D) and P(D) (where k=1, 2, 3, . . . , 3g).

In an LDPC-CC of a time varying period of 3g and a coding rate of 1/2 (n=2), parity and information at time i are represented by Pi and $X_{i,1}$ respectively. If i %3g=k (where k=0, 1, 2, . . . , 3g−1) is assumed at this time, a parity check polynomial of equation 19-(k+1) holds true. For example, if i=2, i %3g=2 (k=2), and therefore equation 20 holds true.

[20]

$$(D^{a\#3,1,1}+D^{a\#3,1,2}+1)X_{2,1}(D^{b\#3,1}+D^{b\#3,2}+1)P_2=0 \quad \text{(Equation 20)}$$

If following <Condition #5-1> and <Condition #6-1> are satisfied at this time, the possibility of being able to create a code having higher error correction capability is increased.

<Condition #5-1>

In equations 19-1 to 19-3g, combinations of orders of X(D) satisfy the following condition:

$(a_{\#1,1,1}\%3, a_{\#1,1,2}\%3)$ is (1, 2) or (2, 1);

$(a_{\#2,1,1}\%3, a_{\#2,1,2}\%3)$ is (1, 2) or (2, 1);

$(a_{\#3,1,1}\%3, a_{\#3,1,2}\%3)$ is (1, 2) or (2, 1);

⋮

$(a_{\#k,1,1}\%3, a_{\#k,1,2}\%3)$ is (1, 2) or (2, 1) (where k=1, 2, 3, ..., 3g);

⋮

$(a_{\#3g-2,1,1}\%3, a_{\#3g-2,1,2}\%3)$ is (1, 2) or (2, 1),
$(a_{\#3g-1,1,1}\%3, a_{\#3g-1,1,2}\%3)$ is (1, 2) or (2, 1); and
$(a_{\#3g,1,1}\%3, a_{\#3g,1,2}\%3)$ is (1, 2) or (2, 1).

In addition, in equations 19-1 to 19-3g, combinations of orders of P(D) satisfy the following condition:
$(b_{\#1,1}\%3, b_{\#1,2}\%3)$,
$(b_{\#2,1}\%3, b_{\#2,2}\%3)$,
$(b_{\#3,1}\%3, b_{\#3,2}\%3)$, ...,
$(b_{\#k,1}\%3, b_{\#k,2}\%3)$, ...,
$(b_{\#3g-2,1}\%3, b_{\#3g-2,2}\%3)$,
$(b_{\#3g-1,1}\%3, b_{\#3g-}1,2\%3)$, and
$(b_{\#3g,1}\%3, b_{\#3g,2}\%3)$ are any of (1, 2), or (2, 1) (where k=1, 2, 3, ..., 3g).

<Condition #5-1> has a similar relationship with respect to equations 19-1 to 19-3g as <Condition #2-1> has with respect to equations 15-1 to 15-3g. If the condition below (<Condition #6-1>) is added for equations 19-1 to 19-3g in addition to <Condition #5-1>, the possibility of being able to create an LDPC-CC having higher error correction capability is increased.

<Condition #6-1>

Orders of X(D) of equations 19-1 to 19-3g satisfy the following condition: all values other than multiples of 3 (that is, 0, 3, 6, ..., 3g-3) from among integers from 0 to 3g-1 (0, 1, 2, 3, 4, ..., 3g-2, 3g-1) are present in the following 6g values of
$(a_{\#1,1,1}\%3g, a_{\#1,1,2}\%3g)$,
$(a_{\#2,1,1}\%3g, a_{\#2,1,2}\%3g)$, ...,
$(a_{\#p,1,1}\%3g, a_{\#p,1,2}\%3g)$, ...,
$(a_{\#3g,1,1}\%3g, a_{\#3g,1,2}\%3g)$ (where p=1, 2, 3, ..., 3g); and Orders of P(D) of equations 19-1 to 19-3g satisfy the following condition: all values other than multiples of 3 (that is, 0, 3, 6, ..., 3g-3) from among integers from 0 to 3g-1 (0, 1, 2, 3, 4, ..., 3g-2, 3g-1) are present in the following 6g values of
$(b_{\#1,1}\%3g, b_{\#1,2}\%3g)$,
$(b_{\#2,1}\%3g, b_{\#2,2}\%3g)$,
$(b_{\#3,1}\%3g, b_{\#3,2}\%3g)$, ...,
$(b_{\#k,1}\%3g, b_{\#k,2}\%3g)$, ...,
$(b_{\#3g-2,1}\%3g, b_{\#3g-2,2}\%3g)$,
$(b_{\#3g-1,1}\%3g, b_{\#3g-1,2}\%3g)$, and
$(b_{\#3g,1}\%3g, b_{\#3g,2}\%3g)$ (where k=1, 2, 3, ... 3g).

The possibility of obtaining good error correction capability is high if there is also randomness while regularity is maintained for positions at which "1"s are present in a parity check matrix. With an LDPC-CC for which the time varying period is 3g (where g=2, 3, 4, 5, ... ) and the coding rate is 1/2 that has parity check polynomials of equations 19-1 to 19-3g, if a code is created in which <Condition #6-1> is applied in addition to <Condition #5-1>, it is possible to provide randomness while maintaining regularity for positions at which "1"s are present in a parity check matrix, so that the possibility of obtaining better error correction capability is increased.

The possibility of being able to create a code having higher error correction capability is also increased if a code is created using <Condition #6'-1> instead of <Condition #6-1>, that is, using <Condition #6'-1> in addition to <Condition #5-1>.

<Condition #6'-1>

Orders of X(D) of equations 19-1 to 19-3g satisfy the following condition: all values other than multiples of 3 (that is, 0, 3, 6, ..., 3g-3) from among integers from 0 to 3g-1 (0, 1, 2, 3, 4, ..., 3g-2, 3g-1) are present in the following 6g values of
$(a_{\#1,1,1}\%3g, a_{\#1,1,2}\%3g)$,
$(a_{\#2,1,1}\%3g, a_{\#2,1,2}\%3g)$, ...,
$(a_{\#p,1,1}\%3g, a_{\#p,1,2}\%3g)$, ...,
and $(a_{\#3g,1,1}\%3g, a_{\#3g,1,2}\%3g)$ (where p=1, 2, 3, ..., 3g);
or Orders of P(D) of equations 19-1 to 19-3g satisfy the following condition: all values other than multiples of 3 (that is, 0, 3, 6, ..., 3g-3) from among integers from 0 to 3g-1 (0, 1, 2, 3, 4, ..., 3g-2, 3g-1) are present in the following 6g values of
$(b_{\#1,1}\%3g, b_{\#1,2}\%3g)$,
$(b_{\#2,1}\%3g, b_{\#2,2}\%3g)$,
$(b_{\#3,1}\%3g, b_{\#3,2}\%3g)$, ...,
$(b_{\#k,1}\%3g, b_{\#k,2}\%3g)$, ...,
$(b_{\#3g-2,1}\%3g, b_{\#3g-2,2}\%3g)$,
$(b_{\#3g-1,1}\%3g, b_{\#3g-1,2}\%3g)$ and
$(b_{\#3g,1}\%3g, b_{\#3g,2}\%3g)$ (where k=1, 2, 3, ..., 3g).

Examples of LDPC-CCs of a coding rate of 1/2 and a time varying period of 6 having good error correction capability are shown in Table 4.

TABLE 4

| Code | Parity check polynomial |
|---|---|
| LDPC-CC #1 of a time varying period of 6 and a coding rate of 1/2 | Check polynomial #1: $(D^{328} + D^{317} + 1)X(D) + (D^{589} + D^{434} + 1)P(D) = 0$<br>Check polynomial #2: $(D^{596} + D^{553} + 1)X(D) + (D^{586} + D^{461} + 1)P(D) = 0$<br>Check polynomial #3: $(D^{550} + D^{143} + 1)X(D) + (D^{470} + D^{448} + 1)P(D) = 0$<br>Check polynomial #4: $(D^{470} + D^{223} + 1)X(D) + (D^{256} + D^{41} + 1)P(D) = 0$<br>Check polynomial #5: $(D^{89} + D^{40} + 1)X(D) + (D^{316} + D^{71} + 1)P(D) = 0$<br>Check polynomial #6: $(D^{320} + D^{190} + 1)X(D) + (D^{575} + D^{136} + 1)P(D) = 0$ |
| LDPC-CC #2 of a time varying period of 6 and a coding rate of 1/2 | Check polynomial #1: $(D^{524} + D^{511} + 1)X(D) + (D^{215} + D^{103} + 1)P(D) = 0$<br>Check polynomial #2: $(D^{547} + D^{287} + 1)X(D) + (D^{467} + D^{1} + 1)P(D) = 0$<br>Check polynomial #3: $(D^{289} + D^{62} + 1)X(D) + (D^{503} + D^{502} + 1)P(D) = 0$<br>Check polynomial #4: $(D^{401} + D^{55} + 1)X(D) + (D^{443} + D^{106} + 1)P(D) = 0$<br>Check polynomial #5: $(D^{433} + D^{395} + 1)X(D) + (D^{404} + D^{100} + 1)P(D) = 0$<br>Check polynomial #6: $(D^{136} + D^{59} + 1)X(D) + (D^{599} + D^{559} + 1)P(D) = 0$ |
| LDPC-CC #3 of a time varying period of 6 and a coding rate of 1/2 | Check polynomial #1: $(D^{253} + D^{44} + 1)X(D) + (D^{473} + D^{256} + 1)P(D) = 0$<br>Check polynomial #2: $(D^{595} + D^{143} + 1)X(D) + (D^{598} + D^{95} + 1)P(D) = 0$<br>Check polynomial #3: $(D^{97} + D^{11} + 1)X(D) + (D^{592} + D^{491} + 1)P(D) = 0$<br>Check polynomial #4: $(D^{50} + D^{10} + 1)X(D) + (D^{368} + D^{112} + 1)P(D) = 0$<br>Check polynomial #5: $(D^{286} + D^{221} + 1)X(D) + (D^{517} + D^{359} + 1)P(D) = 0$<br>Check polynomial #6: $(D^{407} + D^{322} + 1)X(D) + (D^{283} + D^{257} + 1)P(D) = 0$ |

An LDPC-CC of a time varying period of g with good characteristics has been described above. Also, for an LDPC-CC, it is possible to provide encoded data (codeword) by multiplying information vector n by generator matrix G. That is, encoded data (codeword) c can be represented by c=n×G. Here, generator matrix G is found based on parity check matrix H designed in advance. To be more specific, generator matrix G refers to a matrix satisfying G×H$^T$=0.

For example, a convolutional code of a coding rate of 1/2 and generator polynomial G=[1 G$_1$(D)/G$_0$(D)] will be considered as an example. At this time, G$_1$ represents a feedforward polynomial and G$_0$ represents a feedback polynomial. If a polynomial representation of an information sequence (data) is X(D), and a polynomial representation of a parity sequence is P(D), a parity check polynomial is represented as shown in equation 21 below.

[21]

$$G_1(D)X(D)+G_0(D)P(D)=0 \quad \text{(Equation 21)}$$

where D is a delay operator.

FIG. 5 shows information relating to a (7, 5) convolutional code. A (7, 5) convolutional code generator polynomial is represented as G=[1 (D$^2$+1)/(D$^2$+D+1)]. Therefore, a parity check polynomial is as shown in equation 22 below.

[22]

$$(D^2+1)X(D)+(D^2+D+1)P(D)=0 \quad \text{(Equation 22)}$$

Here, data at point in time i is represented by X$_i$, and parity by P$_i$, and transmission sequence Wi is represented as W$_i$=(X$_i$, P$_i$). Then transmission vector w is represented as w=(X$_1$, P$_1$, X$_2$, P$_2$, . . . , X$_i$, P$_i$, . . . )$^T$. Thus, from equation 22, parity check matrix H can be represented as shown in FIG. 5. At this time, the relational equation in equation 23 below holds true.

[23]

$$Hw=0 \quad \text{(Equation 23)}$$

Therefore, using parity check matrix H, the decoding side can perform decoding using belief propagation such as BP (belief propagation) decoding, min-sum decoding which is approximation of BP decoding, offset BP decoding, normalized BP decoding, shuffled BP decoding as shown in Non-Patent Literature 5 to Non-Patent Literature 7.

(Time-invariant/time varying LDPC-CCs (of a coding rate of (n-1)/n) based on a convolutional code (where n is a natural number))

An overview of time-invariant/time varying LDPC-CCs based on a convolutional code is given below.

A parity check polynomial represented as shown in equation 24 will be considered, with polynomial representations of coding rate of R=(n-1)/n as information X$_1$, X$_2$, . . . , X$_{n-1}$ as X$_1$(D), X$_2$(D), X$_{n-1}$(D), and a polynomial representation of parity P as P(D).

[24]

$$(D^{a1,1}+D^{a1,2}+\ldots+D^{a1,r1}+1)X_1(D)+(D^{a2,1}+D^{a2,2}+\ldots+D^{a2,r2}+1)X_2(D)++\ldots+(D^{an-1,1}+D^{an-1,2}+\ldots+D^{an-1,rn-1}+1)X_{n-1}(D)+(D^{b1}+D^{b2}+\ldots+D^{bs}+1)P(D)=0 \quad \text{(Equation 24)}$$

In equation 24, at this time, $a_{p,p}$ (where p=1, 2, . . . , n-1 and q=1, 2, . . . , rp) is, for example, a natural number, and satisfies the condition $a_{p,1} \neq a_{p,2} \neq \ldots \neq a_{p,rp}$. Also, b$_q$ (where q=1, 2, . . . , s) is a natural number, and satisfies the condition $b_1 \neq b_2 \neq \ldots \neq b_s$. A code defined by a parity check matrix based on a parity check polynomial of equation 24 at this time is called a time-invariant LDPC-CC here.

Here, m different parity check polynomials based on equation 24 are provided (where m is an integer equal to or greater than 2). These parity check polynomials are represented as shown below.

[25]

$$A_{X1,i}(D)X_1(D)+A_{X2,i}(D)X_2(D)+\ldots+A_{Xn-1,i}(D)X_{n-1}(D)+B_i(D)P(D)=0 \quad \text{(Equation 25)}$$

Here, i=0, 1, . . . , m-1.

Then information X$_1$, X$_2$, . . . , X$_{n-1}$ at point in time j is represented as X$_{1,j}$, X$_{2,j}$, . . . , X$_{n-1,j}$, parity P at point in time j is represented as P$_j$, and u$_j$=(X$_{1,j}$, X$_{2,j}$, . . . , X$_{n-1,j}$, Pj)$^T$. At this time, information X$_{1,j}$, X$_{2,j}$, . . . , X$_{n-1,j}$, and parity P$_j$ at point in time j satisfy a parity check polynomial of equation 26.

[26]

$$A_{X1,k}(D)X_1(D)+A_{X2,k}(D)X_2(D)+\ldots+A_{Xn-1,k}(D)X_{n-1}(D)+B_k(D)P(D)=0 \quad (k=j \bmod m) \quad \text{(Equation 26)}$$

Here, "j mod m" is a remainder after dividing j by m.

A code defined by a parity check matrix based on a parity check polynomial of equation 26 is called a time varying LDPC-CC here. At this time, a time-invariant LDPC-CC defined by a parity check polynomial of equation 24 and a time varying LDPC-CC defined by a parity check polynomial of equation 26 have a characteristic of enabling parity easily to be found sequentially by means of a register and exclusive OR.

Figure 6:
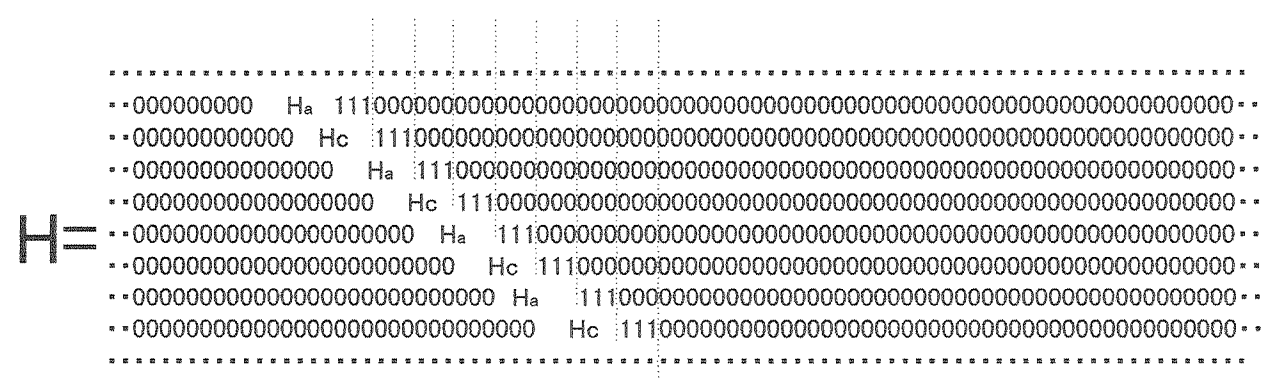

For example, the configuration of parity check matrix H of an LDPC-CC of a time varying period of 2 and a coding rate of 2/3 based on equation 24 to equation 26 is shown in FIG. 6. Two different check polynomials of a time varying period of 2 based on equation 26 are designed "check equation #1" and "check equation #2." In FIG. 6, (Ha, 111) is a part corresponding to "check equation #1," and (Hc, 111) is a part corresponding to "check equation #2." Below, (Ha, 111) and (Hc, 111) are defined as sub-matrices.

Thus, LDPC-CC parity check matrix H of a time varying period of 2 of this proposal can be defined by a first sub-matrix representing a parity check polynomial of "check equation #1", and by a second sub-matrix representing a parity check polynomial of "check equation #2". Specifically, in parity check matrix H, a first sub-matrix and second sub-matrix are arranged alternately in the row direction. When the coding rate is 2/3, a configuration is employed in which a sub-matrix is shifted three columns to the right between an i'th row and (i+1)-th row, as shown in FIG. 6.

In the case of a time varying LDPC-CC of a time varying period of 2, an i'th row sub-matrix and an (i+1)-th row sub-matrix are different sub-matrices. That is to say, either sub-matrix (Ha, 111) or sub-matrix (Hc, 111) is a first sub-matrix, and the other is a second sub-matrix. If transmission vector u is represented as u=(X$_{1,0}$, X$_{2,0}$, P$_0$, X$_{1,1}$, X$_{2,1}$, P$_1$, . . . , X$_{1,k}$, X$_{2,k}$, P$_k$, . . . )$^T$, the relationship Hu=0 holds true (see equation 23).

Next, an LDPC-CC for which the time varying period is m is considered in the case of a coding rate of 2/3. In the same way as when the time varying period is 2, m parity check polynomials represented by equation 24 are provided. Then "check equation #1" represented by equation 24 is provided. "Check equation #2" to "check equation #m" represented by equation 24 are provided in a similar way. Data X and parity P of point in time mi+1 are represented by X$_{mi+1}$ and P$_{mi+1}$ respectively, data X and parity P of point in time mi+2 are represented by X$_{mi+2}$ and P$_{mi+2}$ respectively, . . . , and data X and parity P of point in time mi+m are represented by X$_{mi+m}$ and P$_{mi+m}$ respectively (where i is an integer).

Consider an LDPC-CC for which parity P$_{mi+1}$ of point in time mi+1 is found using "check equation #1," parity $P_{mi+2}$ of point in time mi+2 is found using "check equation #2," . . . , and parity $P_{mi+m}$ of point in time mi+m is found using "check equation #m." An LDPC-CC code of this kind provides the following advantages:

An encoder can be configured easily, and parity can be found sequentially.

Termination bit reduction and received quality improvement in puncturing upon termination can be expected.

Figure 7:
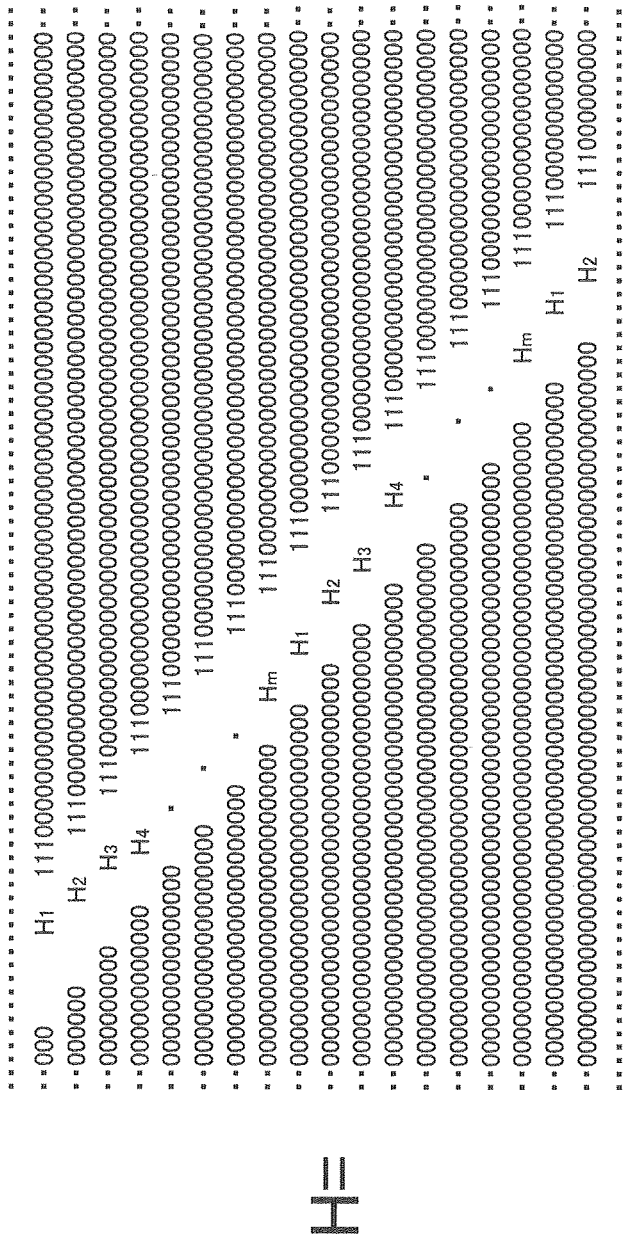
FIG. 7 shows an example of the configuration of an LDPC-CC parity check matrix of a coding rate of 2/3 and a time varying period of m.

FIG. 7 shows the configuration of the above LDPC-CC parity check matrix of a coding rate of 2/3 and a time varying period of m. In FIG. 7, ($H_1$, 111) is a part corresponding to "check equation #1," ($H_2$, 111) is a part corresponding to "check equation #2," . . . , and ($H_m$, 111) is a part corresponding to "check equation #m." Below, ($H_1$, 111) is defined as a first sub-matrix, ($H_2$, 111) is defined as a second sub-matrix, . . . , and ($H_m$, 111) is defined as an m-th sub-matrix.

Thus, LDPC-CC parity check matrix H of a time varying period of m of this proposal can be defined by a first sub-matrix representing a parity check polynomial of "check equation #1", a second sub-matrix representing a parity check polynomial of "check equation #2", . . . , and an m-th sub-matrix representing a parity check polynomial of "check equation #m". Specifically, in parity check matrix H, a first sub-matrix to m-th sub-matrix are arranged periodically in the row direction (see FIG. 7). When the coding rate is 2/3, a configuration is employed in which a sub-matrix is shifted three columns to the right between an i-th row and (i+1)-th row (see FIG. 7).

If transmission vector u is represented as u=($X_{1,0}$, $X_{2,0}$, $P_0$, $X_{1,1}$, $X_{2,1}$, $P_1$, . . . , $X_{1,k}$, $X_{2,k}$, $P_k$, . . . )$^T$, the relationship Hu=0 holds true (see equation 23).

In the above description, a case of a coding rate of 2/3 has been described as an example of a time-invariant/time varying LDPC-CC based on a convolutional code of a coding rate of (n−1)/n, but a time-invariant/time varying LDPC-CC parity check matrix based on a convolutional code of a coding rate of (n−1)/n can be created by thinking in a similar way.

Figure 8:
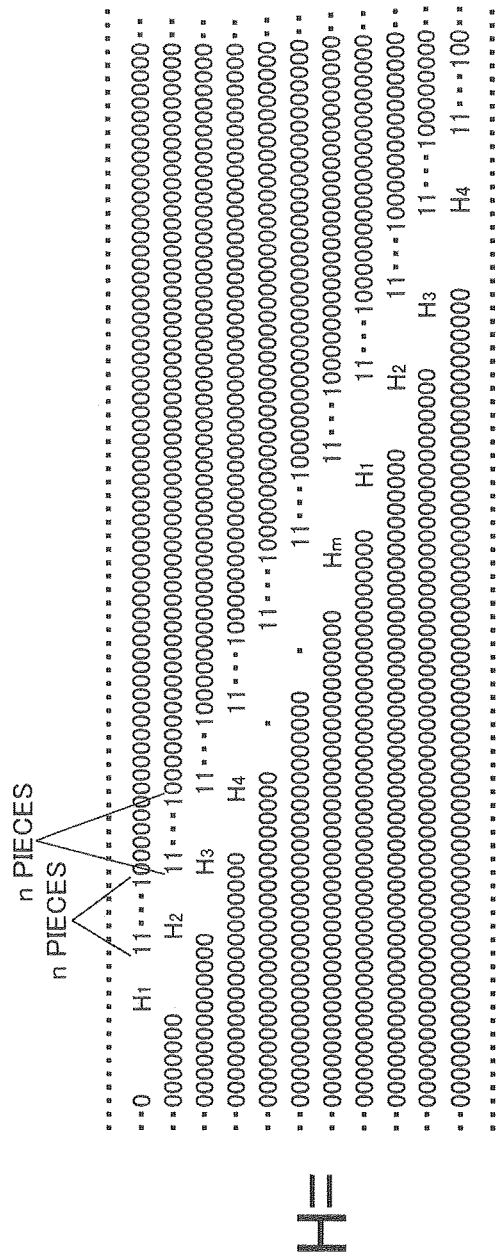
FIG. 8 shows an example of the configuration of an LDPC-CC parity check matrix of a coding rate of (n−1)/n and a time varying period of m.

That is to say, in the case of a coding rate of 2/3, in FIG. 7, ($H_1$, 111) is a part (first sub-matrix) corresponding to "check equation #1," ($H_2$, 111) is a part (second sub-matrix) corresponding to "check equation #2," . . . , and ($H_m$, 111) is a part (m-th sub-matrix) corresponding to "check equation #m," while, in the case of a coding rate of (n−1)/n, the situation is as shown in FIG. 8. That is to say, a part (first sub-matrix) corresponding to "check equation #1" is represented by ($H_1$, 11 . . . 1), and a part (k-th sub-matrix) corresponding to "check equation #k" (where k=2, 3, . . . , m) is represented by ($H_k$, 11 . . . 1). At this time, the number of "1"s of parts excluding $H_k$ in the k-th sub-matrix is n. Also, in parity check matrix H, a configuration is employed in which a sub-matrix is shifted n columns to the right between an i'th row and (i+1)-th row (see FIG. 8).

If transmission vector u is represented as u=($X_{1,0}$, $X_{2,0}$, $X_{n-1,0}$, $P_0$, $X_{1,1}$, $X_{2,1}$, . . . , $X_{n-1,1}$, $P_1$, . . . , $X_{1,k}$, $X_{2,k}$, . . . , $X_{n-1,k}$, $P_k$, . . . )$^T$, the relationship Hu=0 holds true (see equation 23).

Figure 9:
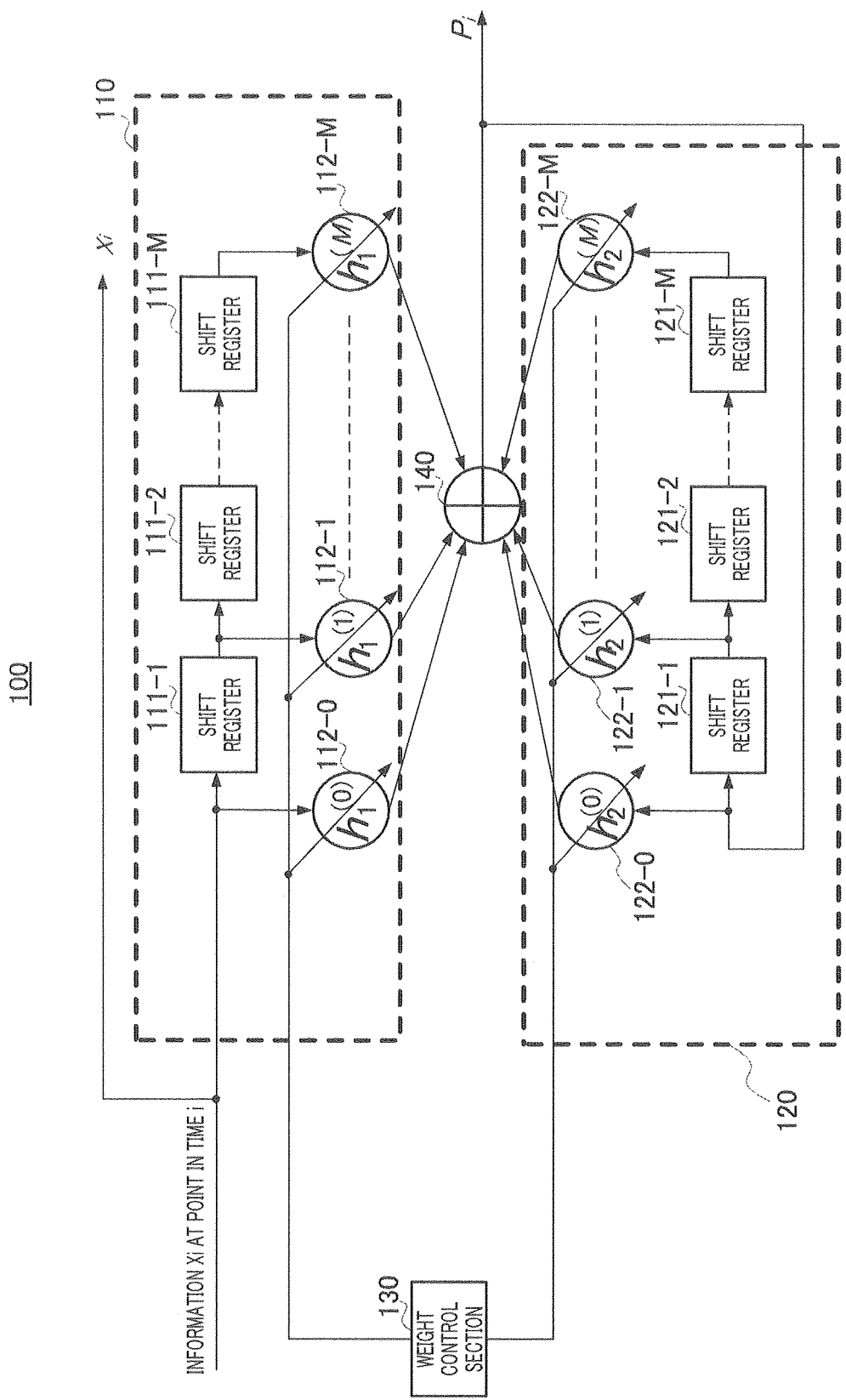
FIG. 9 shows an example of the configuration of an LDPC-CC encoding section.

FIG. 9 shows an example of the configuration of an LDPC-CC encoder when the coding rate is R=1/2. As shown in FIG. 9, LDPC-CC encoder 100 is provided mainly with data computing section 110, parity computing section 120, weight control section 130, and modulo 2 adder (exclusive OR computer) 140.

Data computing section 110 is provided with shift registers 111-1 to 111-M and weight multipliers 112-0 to 112-M.

Parity computing section 120 is provided with shift registers 121-1 to 121-M and weight multipliers 122-0 to 122-M.

Shift registers 111-1 to 111-M and 121-1 to 121-M are registers storing $v_{1,t-i}$ and $v_{2,t-i}$ (where i=0, . . . , M) respectively, and, at a timing at which the next input comes in, send a stored value to the adjacent shift register to the right, and store a new value sent from the adjacent shift register to the left. The initial state of the shift registers is all-zeros.

Weight multipliers 112-0 to 112-M and 122-0 to 122-M switch values of $h_1^{(m)}$ and $h_2^{(m)}$ to 0 or 1 in accordance with a control signal outputted from weight control section 130.

Based on a parity check matrix stored internally, weight control section 130 outputs values of $h_1^{(m)}$ and $h_2^{(m)}$ at that timing, and supplies them to weight multipliers 112-0 to 112-M and 122-0 to 122-M.

Modulo 2 adder 140 adds all modulo 2 calculation results to the outputs of weight multipliers 112-0 to 112-M and 122-0 to 122-M, and calculates pi.

By employing this kind of configuration, LDPC-CC encoder 100 can perform LDPC-CC encoding in accordance with a parity check matrix.

If the arrangement of rows of a parity check matrix stored by weight control section 130 differs on a row-by-row basis, LDPC-CC encoder 100 is a time varying convolutional encoder. Also, in the case of an LDPC-CC of a coding rate of (q−1)/q, a configuration needs to be employed in which (q−1) data computing sections 110 are provided and modulo 2 adder 140 performs modulo 2 addition (exclusive OR computation) of the outputs of weight multipliers.

Embodiment 2

Next, the present embodiment will explain a search method that can support a plurality of coding rates in a low computational complexity in an encoder and decoder. By using an LDPC-CC searched out by the method described below, it is possible to realize high data received quality in the decoder.

With the LDPC-CC search method according to the present embodiment, LDPC-CCs of coding rates of 2/3, 3/4, 4/5, . . . , (q−1)/q are sequentially searched based on, for example, a coding rate of 1/2 among LDPC-CCs with good characteristics described above. By this means, in coding and decoding processing, by preparing a coder and decoder in the highest coding rate of (q−1)/q, it is possible to perform coding and decoding in a coding rate of (s−1)/s (S=2, 3, . . . , q−1) lower than the highest coding rate of (q−1)/q.

A case in which the time varying period is 3 will be described below as an example. As described above, an LDPC-CC for which the time varying period is 3 can provide excellent error correction capability.

(LDPC-CC Search Method)

(1) Coding Rate of 1/2

First, an LDPC-CC of a coding rate of 1/2 is selected as a reference LDPC-CC of a coding rate of 1/2. Here, an LDPC-CC of good characteristics described above is selected as a reference LDPC-CC of a coding rate of 1/2.

A case will be explained below where the parity check polynomials represented by equations 27-1 to 27-3 are used as parity check polynomials of a reference LDPC-CC of a coding rate of 1/2. The examples of equations 27-1 to 27-3 are represented in the same way as above (i.e. an LDPC-CC of good characteristics), so that it is possible to define an LDPC-CC of a time varying period of 3 by three parity check polynomials

[27]

$$(D^{373}+D^{56}+1)X_1(D)+(D^{406}+D^{218}+1)P(D)=0 \quad \text{(Equation 27-1)}$$

$$(D^{457}+D^{197}+1)X_1(D)+(D^{491}+D^{22}+1)P(D)=0 \quad \text{(Equation 27-2)}$$

$$(D^{485}+D^{70}+1)X_1(D)+(D^{236}+D^{181}+1)P(D)=0 \quad \text{(Equation 27-3)}$$

As described in table 3, equations 27-1 to 27-3 are represented as an example of an LDPC-CC with good characteristics where the time varying period is 3 and the coding rate is 1/2. Then, as described above (with an LDPC-CC of good characteristics), information $X_1$ at point in time j is represented as $X_{1,j}$, parity P at point in time j is represented as $P_j$, and $u_j=(X_{1,j}, P_j)^T$. At this time, information $X_{1,j}$ and parity $P_j$ at point in time j satisfy a parity check polynomial of equation 27-1 when "j mod 3=0." Further, information $X_{1,j}$ and parity $P_j$ at point in time j satisfy a parity check polynomial of equation 27-2 when "j mod 3=1." Further, information $X_{1,j}$ and parity $P_j$ at point in time j satisfy a parity check polynomial of equation 27-3 when "j mod 3=2." At this time, the relationships between parity check polynomials and a parity check matrix are the same as above (i.e. as in an LDPC-CC of good characteristics).

(2) Coding Rate of 2/3

Next, LDPC-CC parity check polynomials of a coding rate of 2/3 is created based on the parity check polynomials of a coding rate of 1/2 with good characteristics. To be more specific, LDPC-CC parity check polynomials of a coding rate of 2/3 are formed, including the reference parity check polynomials of a coding rate of 1/2.

As shown in equations 28-1 to 28-3, upon using equations 27-1 to 27-3 in a reference LDPC-CC of a coding rate of 1/2, it is possible to represent LDPC-CC parity check polynomials of a coding rate of 2/3.

[28]

$$(D^{373}+D^{56}+1)X_1(D)+(D^{\alpha 1}+D^{\beta 1}+1)X_2(D)+(D^{406}+D^{218}+1)P(D)=0 \quad \text{(Equation 28-1)}$$

$$(D^{457}+D^{197}+1)X_1(D)+(D^{\alpha 2}+D^{\beta 2}+1)X_2(D)+(D^{491}+D^{22}+1)P(D)=0 \quad \text{(Equation 28-2)}$$

$$(D^{485}+D^{70}+1)X_1(D)+(D^{\alpha 3}+D^{\beta 3}+1)X_2(D)+(D^{236}+D^{181}+1)P(D)=0 \quad \text{(Equation 28-3)}$$

The parity check polynomials represented by equations 28-1 to 28-3 are formed by adding term $X_2(D)$ to equations 27-1 to 27-3. LDPC-CC parity check polynomials of a coding rate of 2/3 used in equations 28-1 to 28-3 are references for parity check polynomials of a coding rate of 3/4.

Also, in equations 28-1 to 28-3, if the orders of $X_2(D)$, ($\alpha 1$, $\beta 1$), ($\alpha 2$, $\beta 2$), ($\alpha 3$, $\beta 3$), are set to satisfy the above conditions (e.g. <Condition #1> to <Condition #6>), it is possible to provide an LDPC-CC of good characteristics even in a coding rate of 2/3.

Then, as described above (with an LDPC-CC of good characteristics), information $X_1$ and $X_2$ at point in time j is represented as $X_{1,j}$ and $X_{2,j}$, parity P at point in time j is represented as $P_j$, and $u_j=(X_{1,j}, X_{2,j}, P_j)^T$. At this time, information $X_{1,j}$ and $X_{2,j}$ and parity $P_j$ at point in time j satisfy a parity check polynomial of equation 28-1 when "j mod 3=0." Further, information $X_{1,j}$ and $X_{2,j}$ and parity $P_j$ at point in time j satisfy a parity check polynomial of equation 28-2 when "j mod 3=1." Further, information $X_{1,j}$ and $X_{2,j}$ and parity $P_j$ at point in time j satisfy a parity check polynomial of equation 28-3 when "j mod 3=2." At this time, the relationships between parity check polynomials and a parity check matrix are the same as above (i.e. as in an LDPC-CC of good characteristics).

(3) Coding Rate of 3/4

Next, LDPC-CC parity check polynomials of a coding rate of 3/4 is created based on the above parity check polynomials of a coding rate of 2/3. To be more specific, LDPC-CC parity check polynomials of a coding rate of 3/4 are formed, including the reference parity check polynomials of a coding rate of 2/3.

Equations 29-1 to 29-3 show LDPC-CC parity check polynomials of a coding rate of 3/4 upon using equations 28-1 to 28-3 in a reference LDPC-CC of a coding rate of 2/3.

[29]

$$(D^{373}+D^{56}+1)X_1(D)+(D^{\alpha 1}+D^{\beta 1}+1)X_2(D)+(D^{\gamma 1}+D^{\gamma 1}+1)X_3(D)+(D^{406}+D^{218}+1)P(D)=0 \quad \text{(Equation 29-1)}$$

$$(D^{457}+D^{197}+1)X_1(D)+(D^{\alpha 2}+D^{\beta 2}+1)X_2(D)+(D^{\gamma 2}+D^{\gamma 2}+1)X_3(D)+(D^{491}+D^{22}+1)P(D)=0 \quad \text{(Equation 29-2)}$$

$$(D^{485}+D^{70}+1)X_1(D)+(D^{\alpha 3}+D^{\beta 3}+1)X_2(D)+(D^{\gamma 3}+D^{\gamma 3}+1)X_3(D)+(D^{236}+D^{181}+1)P(D)=0 \quad \text{(Equation 29-3)}$$

The parity check polynomials represented by equations 29-1 to 29-3 are formed by adding term $X_3(D)$ to equations 28-1 to 28-3. Also, in equations 29-1 to 29-3, if the orders in $X_3(D)$, ($\gamma 1$, $\delta 1$), ($\gamma 2$, $\delta 2$), ($\gamma 3$, $\delta 3$), are set to satisfy the above conditions (e.g. <Condition #1> to <Condition #6>) with good characteristics, it is possible to provide an LDPC-CC of good characteristics even in a coding rate of 3/4.

Then, as described above (LDPC-CC of good characteristics), information $X_1$, $X_2$ and $X_3$ at point in time j is represented as $X_{1,j}$, $X_{2,j}$ and $X_{3,j}$, parity P at point in time j is represented as $P_j$, and $u_j=(X_{1,j}, X_{2,j}, X_{3,j}, P_j)^T$. At this time, information $X_{1,j}$, $X_{2,j}$ and $X_{3,j}$ and parity $P_j$ at point in time j satisfy a parity check polynomial of equation 29-1 when "j mod 3=0." Further, information $X_{1,j}$, $X_{2,j}$ and $X_{3,j}$ and parity $P_j$ at point in time j satisfy a parity check polynomial of equation 29-2 when "j mod 3=1." Further, information $X_{1,j}$, $X_{2,j}$ and $X_{3,j}$ and parity $P_j$ at point in time j satisfy a parity check polynomial of equation 29-3 when "j mod 3=2." At this time, the relationships between parity check polynomials and a parity check matrix are the same as above (i.e. as in an LDPC-CC of good characteristics).

Equations 30-1 to 30-(q-1) show general LDPC-CC parity check polynomials of a time varying period of g upon performing a search as above.

[30]

$$A_{X1,k}(D)X_1(D) + B_k(D)P(D) = 0 \quad \text{(Equation 30-1)}$$
$$(k = i \bmod g)$$

$$A_{X1,k}(D)X_1(D) + (A_{X2,k}(D)X_2(D) + B_k(D)P(D) = 0 \quad \text{(Equation 30-2)}$$
$$(k = i \bmod g)$$

$$A_{X1,k}(D)X_1(D) + A_{X2,k}(D)X_2(D) + \quad \text{(Equation 30-3)}$$
$$A_{X3,k}(D)X_3(D) + B_k(D)P(D) = 0$$
$$(k = i \bmod g)$$

$$\vdots$$

$$A_{X1,k}(D)X_1(D) + A_{X2,k}(D)X_2(D) + \ldots + \quad \text{(Equation 30-(q-1))}$$
$$A_{Xq-1,k}(D)X_{q-1}(D)B_k(D)P(D) = 0$$
$$(k = i \bmod g)$$

Here, equation 30-1 is represented as above because it is a general equation. However, as described above (with an LDPC-CC of good characteristics), the time varying period is g, and therefore equation 30-1 is actually represented by g parity check polynomials. For example, as described with the present embodiment, when the time varying period is 3, representation of three parity check polynomials is provided as shown in equations 27-1 to 27-3. Similar to equation 30-1, equations 30-2 to 30-(q−1) each have a time varying period of g, and therefore are represented by g parity check equations.

Here, assume that g parity check equations of equation 30-1 are represented by equation 30-1-0, equation 30-1-1, equation 30-1-2, . . . , equation 30-1-(g−2) and equation 30-1-(g−1).

Similarly, equation 30-w is represented by g parity check polynomials (w=2, 3, . . . , q−1). Here, assume that g parity check equations of equation 30-w are represented by equation 30-w-0, equation 30-w-1, equation 30-w-2, . . . , equation 30-w-(g−2) and equation 30-w-(g−1).

Also, in equations 30-1 to 30-(q−1), information $X_1, X_2, \ldots, X_{q-1}$ at point in time i is represented as and parity P at point in time i is represented as $P_i$. Also, $A_{Xr,k}(D)$ refers to a term of $X_r(D)$ in the parity check polynomial for k calculated from "k=i mod g," at point in time i where the coding rate is (r−1)/r (r=2, 3, . . . , q, and q is a natural number equal to or greater than 3). Also, $B_k(D)$ refers to a term of P(D) in the parity check polynomial for k calculated from "k=i mod g," at point in time i where the coding rate is (r−1)/r. Here, "i mod g" is a remainder after dividing i by g.

That is, equation 30-1 represents an LDPC-CC parity check polynomial of a time varying period of g supporting a coding rate of 1/2, equation 30-2 represents an LDPC-CC parity check polynomial of a time varying period of g supporting a coding rate of 2/3, . . . , and equation 30-(q−1) represents an LDPC-CC parity check polynomial of a time varying period of g supporting a coding rate of (q−1)/q.

Thus, based on equation 30-1 which represents an LDPC-CC parity check polynomial of a coding rate of 1/2 with good characteristics, an LDPC-CC parity check polynomial of a coding rate of 2/3 (i.e. equation 30-2) is generated.

Further, based on equation 30-2 which represents an LDPC-CC parity check polynomial of a coding rate of 2/3, an LDPC-CC parity check polynomial of a coding rate of 3/4 (i.e. equation 30-3) is generated. The same applies to the following, and, based on an LDPC-CC of a coding rate of (r−1)/r, LDPC-CC parity check polynomials of a coding rate of r/(r+1) (r=2, 3, . . . , q−2, q−1) are generated.

The above method of forming parity check polynomials will be shown in a different way. Consider an LDPC-CC for which the coding rate is (y−1)/y and the time varying period is g, and an LDPC-CC for which the coding rate is (z−1)/z and the time varying period is g. Here, the maximum coding rate is (q−1)/q among coding rates to share encoder circuits and to share decoder circuits, where g is an integer equal to or greater than 2, y is an integer equal to or greater than 2, z is an integer equal to or greater than 2, and the relationship of y<z≤q holds true. Here, sharing encoder circuits means to share circuits inside encoders, and does not mean to share circuits between an encoder and a decoder.

At this time, if w=y−1 is assumed in equations 30-w-0, 30-w-1, 30-w-2, . . . , 30-w-(g−2) and 30-w-(g−1), which represent g parity check polynomials described upon explaining equations 30-1 to 30-(q−1), representations of g parity check polynomials is provided as shown in equations 31-1 to 31-g.

[31]

$$A_{X1,0}(D)X_1(D) + A_{X2,0}(D)X_2(D) + \ldots + A_{Xy-1,0}(D)X_{y-1}(D) + B_0(D)P(D) = 0 \quad \text{(Equation 31-1)}$$
$$(0 = i \bmod g)$$

$$B_0(D)P(D) + \sum_{r=1}^{y-1} A_{Xr,0}(D)X_r(D) = 0 \quad \text{(Equation 31-1')}$$
$$(0 = i \bmod g)$$

$$A_{X1,1}(D)X_1(D) A_{X2,1}(D)X_2(D) + \ldots + A_{Xy-1,1}(D)X_{y-1}(D) + B_1(D)P(D) = 0 \quad \text{(Equation 31-2)}$$
$$(1 = i \bmod g)$$

$$B_1(D)P(D) + \sum_{r=1}^{y-1} A_{Xr,1}(D)X_r(D) = 0 \quad \text{(Equation 31-2')}$$
$$(1 = i \bmod g)$$

$$\vdots$$

$$A_{X1,k}(D)X_1(D) + A_{X2,k}(D)X_2(D) + \ldots + A_{Xy-1,k}(D)X_{y-1}(D) + B_k(D)P(D) = 0 \quad \text{(Equation 31-(k+1))}$$
$$(k = i \bmod g)$$

$$B_k(D)P(D) + \sum_{r=1}^{y-1} A_{Xr,k}(D)X_r(D) = 0 \quad \text{(Equation 31-(k+1)')}$$
$$(k = i \bmod g)$$

$$\vdots$$

$$A_{X1,g-1}(D)X_1(D) + A_{X2,g-1}(D)X_2(D) + \ldots + A_{Xy-1,g-1}(D)X_{y-1}(D) + B_{g-1}(D)P(D) = 0 \quad \text{(Equation 31-g)}$$
$$(g - 1 = i \bmod g)$$

$$B_{g-1}(D)P(D) + \sum_{r=1}^{y-1} A_{Xr,g-1}(D)X_r(D) = 0 \quad \text{(Equation 31-g')}$$
$$(g - 1 = i \bmod g)$$

In equations 31-1 to 31-g, equation 31-w and equation 31-w' are equivalent, and therefore it is possible to replace equation 31-w below with equation 31-w' (w=1, 2, g).

Then, as described above (with an LDPC-CC of good characteristics), information $X_1, X_2, \ldots, X_{y-1}$ at point in time j is represented as $X_{1,j}, X_{2,j}, X_{y-1,j}$, parity P at point in time j is represented as $P_j$, and $u_j = (X_{1,j}, X_{2,j}, X_{y-1,j}, P_j)^T$. At this time, information $X_{1,j}, X_{2,j}, X_{y-1}$ and parity $P_j$ at point in time j: satisfy a parity check polynomial of equation 31-1 when "j mod g=0"; satisfy a parity check polynomial of equation 31-2 when "j mod g=1"; satisfy a parity check polynomial of equation 31-3 when "j mod g=2"; . . . ; satisfy a parity check polynomial of equation 31-(k+1) when "j mod g=k"; . . . ; and satisfy a parity check polynomial of equation 31-g when "j mod g=g−1." At this time, the relationships between parity check polynomials and a parity check matrix are the same as above (i.e. as in an LDPC-CC of good characteristics).

Next, if w=z−1 is assumed in equations 30-w-0, 30-w-1, 30-w-2, . . . , 30-w-(g−2) and 30-w-(g−1), which represent g parity check polynomials described upon explaining equations 30-1 to 30-(q−1), representations of g parity check polynomials can be provided as shown in equations 32-1 to 32-g. Here, from the relationship of y<z≤q, representations of equations 32-1 to 32-g can be provided.

[32]

$$A_{X1,0}(D)X_1(D) + A_{X2,0}(D)X_2(D) + \ldots + \\ A_{Xy-1,0}(D)X_{y-1}(D) + \ldots + A_{Xs,0}(D)X_s(D) + \\ \ldots + A_{Xz-1,0}(D)X_{z-1}(D) + B_0(D)P(D) = 0$$
(Equation 32-1)
$$(0 = i \bmod g)$$

$$B_0(D)P(D) + \sum_{r=1}^{y-1} A_{Xr,0}(D)X_r(D) + \\ \sum_{s=y}^{z-1} A_{Xs,0}(D)X_s(D) = 0$$
(Equation 32-1')
$$(0 = i \bmod g)$$

$$A_{X1,1}(D)X_1(D) + A_{X2,1}(D)X_2(D) + \ldots + \\ A_{Xy-1,1}(D)X_{y-1}(D) + \ldots + A_{Xs,1}(D)X_s(D) + \\ \ldots + A_{Xz-1,1}(D)X_{z-1}(D) + B_1(D)P(D) = 0$$
(Equation 32-2)
$$(1 = i \bmod g)$$

$$B_1(D)P(D) + \sum_{r=1}^{y-1} A_{Xr,1}(D)X_r(D) + \\ \sum_{s=y}^{z-1} A_{Xs,1}(D)X_s(D) = 0$$
(Equation 32-2')
$$(1 = i \bmod g)$$

⋮

$$A_{X1,k}(D)X_1(D) + A_{X2,k}(D)X_2(D) + \ldots + \\ A_{Xy-1,k}(D)X_{y-1}(D) + \ldots + A_{Xs,k}(D)X_s(D) + \\ \ldots + A_{Xz-1,k}(D)X_{z-1}(D) + B_k(D)P(D) = 0$$
(Equation 32-(k+1))
$$(k = i \bmod g)$$

$$B_k(D)P(D) + \sum_{r=1}^{y-1} A_{Xr,k}(D)X_r(D) + \\ \sum_{s=y}^{z-1} A_{Xs,k}(D)X_s(D) = 0$$
(Equation 32-(k+1)')
$$(k = i \bmod g)$$

⋮

$$A_{X1,g-1}(D)X_1(D) + A_{X2,g-1}(D)X_2(D) + \\ \ldots + A_{Xy-1,g-1}(D)X_{y-1}(D) + \\ \ldots + A_{Xs,g-1}(D)X_s(D) + \ldots + \\ A_{Xz-1,g-1}(D)X_{z-1}(D) + B_{g-1}(D)P(D) = 0$$
(Equation 32-g)
$$(g - 1 = i \bmod g)$$

$$B_{g-1}(D)P(D) + \sum_{r=1}^{y-1} A_{Xr,g-1}(D)X_r(D) = \\ \sum_{s=y}^{z-1} A_{Xs,g-1}(D)X_s(D) = 0$$
(Equation 32-g')
$$(g - 1 = i \bmod g)$$

In equations 32-1 to 32-g, equation 32-w and equation 32-w' are equivalent, and therefore it is possible to replace equation 32-w below with equation 32-w' (w=1, 2, ..., g).

Then, as described above (LDPC-CC of good characteristics), information $X_1, X_2, \ldots, X_{y-1}, \ldots, X_s, \ldots, X_{z-1}$ at point in time j is represented as $X_{1,j}, X_{2,j}, \ldots, X_{y-1,j}, \ldots, X_{s,j}, \ldots, X_{z-1,j}$, parity P at point in time j is represented as $P_j$, and $u_j = (X_{1,j}, X_{2,j}, \ldots, X_{y-1,j}, \ldots, X_{s,j}, \ldots, X_{z-1,j}, P_j)^T$ (here, from the relationship of y<z≤q, s=y, y+1, y+2, y+3, z−3, z−2, z−1). At this time, information $X_{1,j}, X_{2,j}, X_{y-1,j}$, $X_{s,j}, X_{z-1,j}$ and parity $P_j$ at point in time j: satisfy a parity check polynomial of equation 32-1 when "j mod g=0"; satisfy a parity check polynomial of equation 32-2 when "j mod g=1"; satisfy a parity check polynomial of equation 32-3 when "j mod g=2"; . . . , satisfy a parity check polynomial of equation 32-(k+1) when "j mod g=k"; . . . ; and satisfy a parity check polynomial of equation 32-g when "j mod g=g−1." At this time, the relationships between parity check polynomials and a parity check matrix are the same as above (i.e. as in an LDPC-CC of good characteristics).

In a case where the above relationships hold true, if the following conditions hold true for an LDPC-CC of a time varying period of g in a coding rate of (y−1)/y and for an LDPC-CC of a time varying period of g in a coding rate of (z−1)/z, it is possible to share circuits between an encoder for an LDPC-CC of a time varying period of g in a coding rate of (y−1)/y and an encoder for an LDPC-CC of a time varying period of g in a coding rate of (z−1)/z, and it is possible to share circuits between a decoder for an LDPC-CC of a time varying period of g in a coding rate of (y−1)/y and a decoder for an LDPC-CC of a time varying period of g in a coding rate of (z−1)/z. The conditions are as follows.

First, the following relationships hold true between equation 31-1 and equation 32-1:

$A_{X1,0}(D)$ of equation 31-1 and $A_{X1,0}(D)$ of equation 32-1 are equal;

⋮

$A_{Xf,0}(D)$ of equation 31-1 and $A_{Xf,0}(D)$ of equation 32-1 are equal;

⋮

$A_{Xy-1,0}(D)$ of equation 31-1 and $A_{Xy-1,0}(D)$ of equation 32-1 are equal. That is, the above relationships hold true for f=1, 2, 3, . . . , y−1.

Also, the following relationship holds true for parity:

$B_0(D)$ of equation 31-1 and $B_0(D)$ of equation 32-1 are equal.

Similarly, the following relationships hold true between equation 31-2 and equation 32-2:

$A_{X1,1}(D)$ of equation 31-2 and $A_{X1,1}(D)$ of equation 32-2 are equal;

⋮

$A_{Xf,1}(D)$ of equation 31-2 and $A_{Xf,1}(D)$ of equation 32-2 are equal;

⋮

$A_{Xy-1,1}(D)$ of equation 31-2 and $A_{Xy-1,1}(D)$ of equation 32-2 are equal. That is, the above relationships hold true for f=1, 2, 3, . . . , y−1.

Also, the following relationship holds true for parity:

$B_1(D)$ of equation 31-2 and $B_1(D)$ of equation 32-2 are equal, and so on.

Similarly, the following relationships hold true between equation 31-h and equation 32-h:

$A_{X1,h-1}(D)$ of equation 31-h and $A_{X1,h-1}(D)$ of equation 32-h are equal;

⋮

$A_{Xf,h-1}(D)$ of equation 31-h and $A_{Xf,h-1}(D)$ of equation 32-h are equal;

⋮

$A_{Xy-1,h-1}(D)$ of equation 31-h and $A_{Xy-1,h-1}(D)$ of equation 32-h are equal. That is, the above relationships hold true for f=1, 2, 3, . . . , y−1.

Also, the following relationship holds true for parity:
B$_1$(D) of equation 31-h and B$_1$(D) of equation 32-h are equal, and so on.

Similarly, the following relationships hold true between equation 31-g and equation 32-g:
A$_{X1,g-1}$(D) of equation 31-g and A$_{X1,g-1}$(D) of equation 32-g are equal;

$\vdots$

A$_{Xf,g-1}$(D) of equation 31-g and A$_{Xf,g-1}$(D) of equation 32-g are equal;

$\vdots$

A$_{Xy-1,g-1}$(D) of equation 31-g and A$_{Xy-1,g-1}$(D) of equation 32-g are equal. That is, the above relationships hold true for f=1, 2, 3, . . . , y−1.

Also, the following relationship holds true for parity:
B$_{g-1}$(D) of equation 31-g and B$_{g-1}$(D) of equation 32-g are equal (therefore, h=1, 2, 3, . . . , g−2, g−1, g).

In a case where the above relationships hold true, it is possible to share circuits between an encoder for an LDPC-CC of a time varying period of g in a coding rate of (y−1)/y and an encoder for an LDPC-CC of a time varying period of g in a coding rate of (z−1)/z, and it is possible to share circuits between a decoder for an LDPC-CC of a time varying period of g in a coding rate of (y−1)/y and a decoder for an LDPC-CC of a time varying period of g in a coding rate of (z−1)/z. Here, the method of sharing encoder circuits and the method of sharing decoder circuits will be explained in detail in the following (configurations of an encoder and decoder).

Examples of LDPC-CC parity check polynomials will be shown in table 5, where the time varying period is 3 and the coding rate is 1/2, 2/3, 3/4 or 5/6. Here, the form of parity check polynomials is the same as in the form of table 3. By this means, if the transmitting apparatus and the receiving apparatus support coding rates of 1/2, 2/3, 3/4 and 5/6 (or if the transmitting apparatus and the receiving apparatus support two or more of the four coding rates), it is possible to reduce the computational complexity (circuit scale) (this is because it is possible to share encoder circuits and decoder circuits even in the case of distributed codes, and therefore reduce the circuit scale), and provide data of high received quality in the receiving apparatus.

TABLE 5

| Code | Parity check polynomial |
| --- | --- |
| LDPC-CC of a time varying period of 3 and a coding rate of 1/2 | Check polynomial #1: $(D^{373} + D^{56} + 1)X_1(D) + (D^{406} + D^{218} + 1)P(D) = 0$ <br> Check polynomial #2: $(D^{457} + D^{197} + 1)X_1(D) + (D^{491} + D^{22} + 1)P(D) = 0$ <br> Check polynomial #3: $(D^{485} + D^{70} + 1)X_1(D) + (D^{236} + D^{181} + 1)P(D) = 0$ |
| LDPC-CC of a time varying period of 3 and a coding rate of 2/3 | Check polynomial #1: $(D^{373} + D^{56} + 1)X_1(D) + (D^{86} + D^4 + 1)X_2(D) + (D^{406} + D^{218} + 1)P(D) = 0$ <br> Check polynomial #2: $(D^{457} + D^{197} + 1)X_1(D) + (D^{368} + D^{295} + 1)X_2(D) + (D^{491} + D^{22} + 1)P(D) = 0$ <br> Check polynomial #3: $(D^{485} + D^{70} + 1)X_1(D) + (D^{475} + D^{398} + 1)X_2(D) + (D^{236} + D^{181} + 1)P(D) = 0$ |
| LDPC-CC of a time varying period of 3 and a coding rate of 3/4 | Check polynomial #1: $(D^{373} + D^{56} + 1)X_1(D) + (D^{86} + D^4 + 1)X_2(D) + (D^{388} + D^{134} + 1)X_3(D) + (D^{406} + D^{218} + 1)P(D) = 0$ <br> Check polynomial #2: $(D^{457} + D^{197} + 1)X_1(D) + (D^{368} + D^{295} + 1)X_2(D) + (D^{155} + D^{136} + 1)X_3(D) + (D^{491} + D^{22} + 1)P(D) = 0$ <br> Check polynomial #3: $(D^{485} + D^{70} + 1)X_1(D) + (D^{475} + D^{398} + 1)X_2(D) + (D^{493} + D^{77} + 1)X_3(D) + (D^{236} + D^{181} + 1)P(D) = 0$ |
| LDPC-CC of a time varying period of 3 and a coding rate of 5/6 | Check polynomial #1: $(D^{373} + D^{56} + 1)X_1(D) + (D^{86} + D^4 + 1)X_2(D) + (D^{388} + D^{134} + 1)X_3(D) + (D^{250} + D^{197} + 1)X_4(D) + (D^{295} + D^{113} + 1)X_5(D) + (D^{406} + D^{218} + 1)P(D) = 0$ <br> Check polynomial #2: $(D^{457} + D^{197} + 1)X_1(D) + (D^{368} + D^{295} + 1)X_2(D) + (D^{155} + D^{136} + 1)X_3(D) + (D^{220} + D^{146} + 1)X_4(D) + (D^{311} + D^{115} + 1)X_5(D) + (D^{491} + D^{22} + 1)P(D) = 0$ <br> Check polynomial #3: $(D^{485} + D^{70} + 1)X_1(D) + (D^{475} + D^{398} + 1)X_2(D) + (D^{493} + D^{77} + 1)X_3(D) + (D^{490} + D^{239} + 1)X_4(D) + (D^{394} + D^{278} + 1)X_5(D) + (D^{236} + D^{181} + 1)P(D) = 0$ |

A case will be explained where LDPC-CCs of a time varying period of 3 in table 5 satisfy the above conditions. For example, consider an LDPC-CC of a time varying period of 3 in a coding rate of 1/2 in table 5 and an LDPC-CC of a time varying period of 3 in a coding rate of 2/3 in table 5. That is, y=2 holds true in equations 31-1 to 31-g, and z=3 holds true in equations 32-1 to 32-g.

Then, seen from an LDPC-CC of a time varying period of 3 in a coding rate of 1/2 in table 5, A$_{X1,0}$(D) of equation 31-1 represents $D^{373}+D^{56}+1$, and, seen from an LDPC-CC of a time varying period of 3 in a coding rate of 2/3 in table 5, A$_{X1,0}$(D) of equation 32-1 represents $D^{373}+D^{56}+1$, so that A$_{X1,0}$(D) of equation 31-1 and A$_{X1,0}$(D) of equation 32-1 are equal.

Also, seen from an LDPC-CC of a time varying period of 3 in a coding rate of 1/2 in table 5, B$_0$(D) of equation 31-1 represents $D^{406}+D^{218}+1$, and, seen from an LDPC-CC of a time varying period of 3 in a coding rate of 2/3 in table 5, B$_0$(D) of equation 32-1 represents $D^{406}+D^{218}+1$, so that B$_0$(D) of equation 31-1 and B$_0$(D) of equation 32-1 are equal.

Similarly, seen from an LDPC-CC of a time varying period of 3 in a coding rate of 1/2 in table 5, A$_{X1,1}$(D) of equation 31-2 represents $D^{457}+D^{197}+1$, and, seen from an LDPC-CC of a time varying period of 3 in a coding rate of 2/3 in table 5, A$_{X1,1}$(D) of equation 32-2 represents $D^{457}+D^{197}+1$, so that A$_{X1,1}$(D) of equation 31-2 and A$_{X1,1}$(D) of equation 32-2 are equal.

Also, seen from an LDPC-CC of a time varying period of 3 in a coding rate of 1/2 in table 5, B$_1$(D) of equation 31-2 represents $D^{491}+D^{22}+1$, and, seen from an LDPC-CC of a time varying period of 3 in a coding rate of 2/3 in table 5, B$_1$(D) of equation 32-2 represents $D^{491}+D^{22}+1$, so that B$_1$(D) of equation 31-2 and B$_1$(D) of equation 32-2 are equal.

Similarly, seen from an LDPC-CC of a time varying period of 3 in a coding rate of 1/2 in table 5, A$_{X1,2}$(D) of equation 31-3 represents $D^{485}+D^{70}+1$, and, seen from an LDPC-CC of a time varying period of 3 in a coding rate of 2/3 in table 5, A$_{X1,2}$(D) of equation 32-3 represents $D^{485}+D^{70}+1$, so that A$_{X1,2}$(D) of equation 31-3 and A$_{X1,2}$(D) of equation 32-3 are equal.

Also, seen from an LDPC-CC of a time varying period of 3 in a coding rate of 1/2 in table 5, B2(D) of equation 31-3 represents $D^{236}+D^{181}+1$, and, seen from an LDPC-CC of a time varying period of 3 in a coding rate of 2/3 in table 5, B2(D) of equation 32-3 represents $D^{236}+D^{181}+1$, so that B$_2$(D) of equation 31-3 and B$_2$(D) of equation 32-3 are equal.

In view of the above, it is confirmed that an LDPC-CC of a time varying period of 3 in a coding rate of 1/2 in table 5 and an LDPC-CC of a time varying period of 3 in a coding rate of 2/3 in table 5 satisfy the above conditions.

Similarly as above, if LDPC-CCs of a time varying period of 3 in two different coding rates are selected from LDPC-CCs of a time varying period of 3 in coding rates of 1/2, 2/3, 3/4 and 5/6 in table 5, and whether or not the above conditions are satisfied is examined, it is confirmed that the above conditions are satisfied in any selected patterns.

Also, an LDPC-CC is a class of a convolutional code, and therefore requires, for example, termination or tail-biting to secure belief in decoding of information bits. Here, a case will be considered where the method of making the state of data (information) X zero (hereinafter "information-zero-termination") is implemented.

Figure 10:
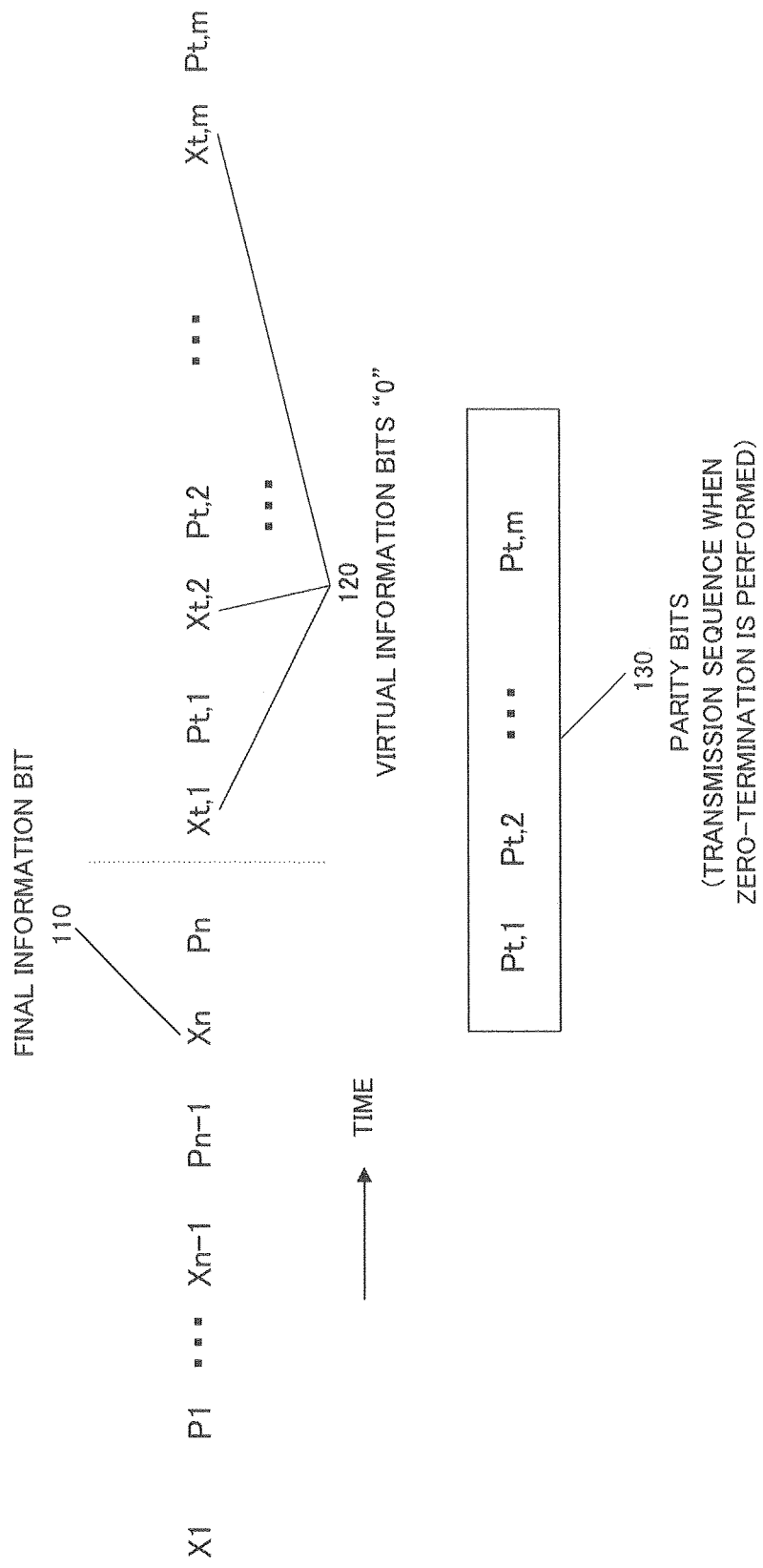
FIG. 10 is a drawing for explaining a method of information-zero-termination.

FIG. 10 shows the method of information-zero-termination. As shown in FIG. 10, the information bit (final transmission bit) that is finally transmitted in a transmission information sequence is Xn(110). With this final information bit Xn(110), if the transmitting apparatus transmits data only until parity bits generated in an encoder and then the receiving apparatus performs decoding, the received quality of information degrades significantly. To solve this problem, information bits subsequent to final information bit Xn(110) (hereinafter "virtual information bits") are presumed as "0" and encoded to generate parity bits 130.

In this case, the receiving apparatus knows that virtual information bits 120 are "0," so that the transmitting apparatus does not transmit virtual information bits 120, but transmits only parity bits 130 generated by virtual information bits 120 (these parity bits represent redundant bits that need to be transmitted, and therefore are called "redundant bits"). Then, a new problem arises that, in order to enable both improvement of efficiency of data transmission and maintenance of received quality of data, it is necessary to secure the received quality of data and decrease the number of parity bits 130 generated by virtual information bits 120 as much as possible.

At this time, it is confirmed by simulation that, in order to secure the received quality of data and decrease the number of parity bits generated by virtual information bits, terms related to parity of a parity check polynomial play an important role.

As an example, a case will be explained using an LDPC-CC for which the time varying period is m (where m is an integer equal to or greater than 2) and the coding rate is 1/2. When the time varying period is m, m necessary parity check polynomials are represented by the following equation.

[33]

$$A_{X1,i}(D)X_1(D)+B_i(D)P(D)=0 \quad \text{(Equation 33)}$$

where i=0, 1, ..., m−1. Also, assume that all of the orders of D in $A_{X1,i}(D)$ are integers equal to or greater than 0 (e.g. as shown in $A_{X1,1}(D)=D^{15}+D^3+D^0$, the orders of D are 15, 3 and 0, all of which are integers equal to or greater than 0), and all of the orders of D in $B_i(D)$ are also integers equal to or greater than 0 (e.g. as shown in $B_i(D)=D^{18}+D^4+D^0$, the orders of D are 18, 4 and 0, all of which are integers equal to or greater than 0).

Here, at time j, the parity check polynomial of the following equation holds true.

[34]

$$A_{X1,k}(D)X_1(D)+B_k(D)P(D)=0 \; (k=j \bmod m) \quad \text{(Equation 34)}$$

Then, in $X_1(D)$, assume that: the highest order of D in $A_{X1,1}(D)$ is cu (e.g. when $A_{X1,1}(D)=D^{15}+D^3+D^0$, D has the orders of 15, 3 and 0, and therefore provides 15 as the highest order of D, $\alpha_1$); the highest order of D in $A_{X1,1}(D)$ is $\alpha_2$; ...; the highest order of D in $A_{X1,i}(D)$ is $\alpha_i$; ...; and the highest order of D in $A_{X1,m-1}(D)$ is $\alpha_{m-1}$. Then, the highest value in $\alpha_i$ (where i=0, 1, 2, ..., m−1) is $\alpha$.

On the other hand, in P(D), assume that: the highest order of D in $B_1(D)$ is $\beta_1$; the highest order of D in $B_2(D)$ is $\beta_2$; ...; the highest order of D in $B_i(D)$ is $\beta_i$; ...; and the highest order of D in $B_{m-1}(D)$ is $\beta_{m-1}$. Then, the highest value in $\beta_i$ (where i=0, 1, 2, ..., m−1) is $\beta$.

Then, in order to secure the received quality of data and decrease the number of parity bits generated by virtual information bits as much as possible, it is preferable to set $\beta$ equal to or below half of $\alpha$.

Although a case has been described where the coding rate is 1/2, the same applies to other cases where the coding rate is above 1/2. At this time, especially when the coding rate is equal to or greater than 4/5, there is a trend to require a significant number of redundant bits to satisfy conditions for securing the received quality of data and decreasing the number of parity bits generated by virtual information bits as much as possible. Consequently, the conditions described above play an important role to secure the received quality of data and decrease the number of parity bits generated by virtual information bits as much as possible.

As an example, a case will be explained using an LDPC-CC for which the time varying period is m (where m is an integer equal to or greater than 2) and the coding rate is 4/5. When the time varying period is m, m necessary parity check polynomials are represented by the following equation.

[35]

$$A_{X1,i}(D)X_1(D)+A_{X2,i}(D)X_2(D)+A_{X3,i}(D)X_3(D)+A_{X4,i}(D)X_4(D)+B_i(D)P(D)=0 \quad \text{(Equation 35)}$$

where i=0, 1, ..., m−1. Also, assume that all of the orders of D in $A_{X1,i}(D)$ are integers equal to or greater than 0 (e.g. as shown in $A_{X1,1}(D)=D^{15}+D^3+D^0$, the orders of D are 15, 3 and 0, all of which are integers equal to or greater than 0). Similarly, assume that: all of the orders of D in $A_{X2,i}(D)$ are integers equal to or greater than 0; all of the orders of D in $A_{X3,i}(D)$ are integers equal to or greater than 0; all of the orders of D in $A_{X4,i}(D)$ are integers equal to or greater than 0; and all of the orders of D in $B_1(D)$ are integers equal to or greater than 0 (e.g. as shown in $B_i(D)=D^{18}+D^4+D^0$, the orders of D are 18, 4 and 0, all of which are integers equal to or greater than 0).

Here, at time j, the parity check polynomial of the following equation holds true.

[36]

$$A_{X1,k}(D)X_1(D)+A_{X2,k}(D)X_2(D)+A_{X3,k}(D)X_3(D)+A_{X4,k}(D)X_4(D)+B_k(D)P(D)=0 \; (k=j \bmod m) \quad \text{(Equation 36)}$$

Then, in $X_1(D)$, assume that: the highest order of D in $A_{X1,1}(D)$ is $\alpha_{1,1}$ (e.g. when $A_{X1,1}(D)=D^{15}+D^3+D^0$, D has the orders of 15, 3 and 0, and therefore provides 15 as the highest order of D, $\alpha_{1,1}$); the highest order of D in $A_{X1,2}(D)$ is $\alpha_{1,2}$; ...; the highest order of D in $A_{X1,i}(D)$ is $\alpha_{1,i}$; ...; and the highest order of D in $A_{X1,m-1}(D)$ is $\alpha_{1,m-1}$. Then, the highest value in $\alpha_{1,i}$ (where i=0, 1, 2, ..., m−1) is $\alpha_1$.

In $X_2(D)$, assume that: the highest order of D in $A_{X2,1}(D)$ is $\alpha_{2,1}$ (e.g. when $A_{X2,1}(D)=D^{15}+D^3+D^0$, D has the orders of 15, 3 and 0, and therefore provides 15 as the highest order of D, $\alpha_{2,1}$); the highest order of D in $A_{X2,2}(D)$ is $\alpha_{2,2}$; ...; the highest order of D in $A_{X2,i}(D)$ is $\alpha_{2,i}$; ...; and the highest order of D in $A_{X2,m-1}(D)$ is $\alpha_{2, m-1}$. Then, the highest value in $\alpha_{2,i}$ (where i=0, 1, 2, ..., m−1) is $\alpha_2$.

In $X_3(D)$, assume that: the highest order of D in $A_{X3,1}(D)$ is $\alpha_{3,1}$ (e.g. when $A_{X3,1}(D)=D^{15}+D^3+D^0$, D has the orders of 15, 3 and 0, and therefore provides 15 as the highest order of D, $\alpha_{3,1}$); the highest order of D in $A_{X3,2}(D)$ is $\alpha_{3,2}$; ...; the highest order of D in $A_{X3,i}(D)$ is $\alpha_{3,i}$; ...; and the highest order of D in $A_{X3,m-1}(D)$ is $\alpha_{3, m-1}$. Then, the highest value in $\alpha_{3,i}$ (where i=0, 1, 2, ..., m−1) is $\alpha_3$.

In $X_4(D)$, assume that: the highest order of D in $A_{X4,1}(D)$ is $\alpha_{4,1}$ (e.g. when $A_{X4,1}(D)=D^{15}+D^3+D^0$, D has the orders of 15, 3 and 0, and therefore provides 15 as the highest order of D, $\alpha_{4,1}$); the highest order of D in $A_{X4,2}(D)$ is $\alpha_{4,2}$; ...; the highest order of D in $A_{X4,i}(D)$ is $\alpha_{4,i}$; ...; and the highest order of D in $A_{X4,m-1}(D)$ is $\alpha_{4, m-1}$. Then, the highest value in $\alpha_{4,i}$ (where i=0, 1, 2, ..., m−1) is $\alpha_4$.

In P(D), assume that: the highest order of D in $B_1(D)$ is $\beta_1$; the highest order of D in $B_2(D)$ is $\beta_2$; ...; the highest order of D in $B_i(D)$ is $\beta_i$; ...; and the highest order of D in $B_{m-1}(D)$ is $\beta_{m-1}$. Then, the highest value in $\beta_i$ (where i=0, 1, 2, ..., m−1) is $\beta$.

Then, in order to secure the received quality of data and decrease the number of parity bits generated by virtual information bits as much as possible, it is necessary to satisfy conditions that: $\beta$ is equal to or below half of $\alpha_1$; $\beta$ is equal to or below half of $\alpha_2$; $\beta$ is equal to or below half of $\alpha_3$; and $\beta$ is equal to or below half of $\alpha_4$, so that, especially, there is a high possibility to secure the received quality of data.

Also, even in a case where: $\beta$ is equal to or below half of $\alpha_1$; $\beta$ is equal to or below half of $\alpha_2$; $\beta$ is equal to or below half of $\alpha_3$; or $\beta$ is equal to or below half of $\alpha_4$, although it is possible to secure the received quality of data and decrease the number of parity bits generated by virtual information bits as much as possible, there is a little possibility to cause degradation in the received quality of data (here, degradation in the received quality of data is not necessarily caused).

Therefore, in the case of an LDPC-CC for which the time varying period is m (where m is an integer equal to or greater than 2) and the coding rate is (n−1)/n, the following is possible.

When the time varying period is m, m necessary parity check polynomials are represented by the following equation.

[37]

$$A_{X1,i}(D)X_1(D)+A_{X2,i}(D)X_2(D)+ \ldots +A_{Xn-1,i}(D)X_{n-1}(D)+B_i(D)P(D)=0 \quad \text{(Equation 37)}$$

where i=0, 1, ..., m−1. Also, assume that all of the orders of D in $A_{X1,i}(D)$ are integers equal to or greater than 0 (e.g. as shown in $A_{X1,1}(D)=D^{15}+D^3+D^0$, the orders of D are 15, 3 and 0, all of which are integers equal to or greater than 0). Similarly, assume that: all of the orders of D in $A_{X2,i}(D)$ are integers equal to or greater than 0; all of the orders of D in $A_{X3,i}(D)$ are integers equal to or greater than 0; all of the orders of D in $A_{X4,i}(D)$ are integers equal to or greater than 0; ...; all of the orders of D in $A_{Xu,i}(D)$ are integers equal to or greater than 0; ...; all of the orders of D in $A_{Xn-1,i}(D)$ are integers equal to or greater than 0; and all of the orders of D in $B_i(D)$ are integers equal to or greater than 0 (e.g. as shown in $B_i(D)=D^{18}+D^4+D^0$, the orders of D are 18, 4 and 0, all of which are integers equal to or greater than 0).

Here, at time j, the parity check polynomial of the following equation holds true.

[38]

$$A_{X1,k}(D)X_1(D)+A_{X2,k}(D)X_2(D)+ \ldots +A_{Xn-1,k}(D)X_{n-1}(D)+B_k(D)P(D)=0 \quad (k=j \bmod m) \quad \text{(Equation 38)}$$

Then, in $X_1(D)$, assume that: the highest order of D in $A_{X1,1}(D)$ is $\alpha_{1,1}$ (e.g. when $A_{X1,1}(D)=D^{15}+D^3+D^0$, D has the orders of 15, 3 and 0, and therefore provides 15 as the highest order of D, $\alpha_{1,1}$); the highest order of D in $A_{X1,2}(D)$ is $\alpha_{1,2}$; ...; the highest order of D in $A_{X1,i}(D)$ is $\alpha_{1,i}$; ...; and the highest order of D in $A_{X1,m-1}(D)$ is $\alpha_{1, m-1}$. Then, the highest value in $\alpha_{1,i}$ (where i=0, 1, 2, ..., m−1) is $\alpha_1$.

In $X_2(D)$, assume that: the highest order of D in $A_{X2,1}(D)$ is $\alpha_{2,1}$ (e.g. when $A_{X2,1}(D)=D^{15}+D^3+D^0$, D has the orders of 15, 3 and 0, and therefore provides 15 as the highest order of D, $\alpha_{2,1}$); the highest order of D in $A_{X2,2}(D)$ is $\alpha_{2,2}$; ...; the highest order of D in $A_{X2,i}(D)$ is $\alpha_{2,i}$; ...; and the highest order of D in $A_{X2,m-1}(D)$ is $\alpha_{2, m-1}$. Then, the highest value in $\alpha_{2,i}$ (where i=0, 1, 2, ..., m−1) is $\alpha_2$.

In $X_u(D)$, assume that: the highest order of D in $A_{Xu,1}(D)$ is $\alpha_{u,1}$ (e.g. when $A_{Xu,1}(D)=D^{15}+D^3+D^0$, D has the orders of 15, 3 and 0, and therefore provides 15 as the highest order of D, $\alpha_{u,1}$); the highest order of D in $A_{Xu,2}(D)$ is $\alpha_{u,2}$; ...; the highest order of D in $A_{Xu,i}(D)$ is $\alpha_{u,i}$; ...; and the highest order of D in $A_{Xu,m-1}(D)$ is $\alpha_{u, m-1}$. Then, the highest value in $\alpha_{u,i}$ (where i=0, 1, 2, ..., m−1, u=1, 2, 3, ..., n−2, n−1) is $\alpha_u$.

$\vdots$

In $X_{n-1}(D)$, assume that: the highest order of D in $A_{Xn-1,1}(D)$ is $\alpha_{n-1,1}$ (e.g. when $A_{Xn-1,1}(D)=D^{15}+D^3+D^0$, D has the orders of 15, 3 and 0, and therefore provides 15 as the highest order of D, $\alpha_{n-1,1}$); the highest order of D in $A_{Xn-1,2}(D)$ is $\alpha_{n-1,2}$; ...; the highest order of D in $A_{Xn-1,i}(D)$ is $\alpha_{n-1,i}$; ...; and the highest order of D in $A_{Xn-1,m-1}(D)$ is $\alpha_{n-1, m-1}$. Then, the highest value in $\alpha_{n-1,i}$ (where i=0, 1, 2, ..., m−1) is $\alpha_{n-1}$.

In P(D), assume that: the highest order of D in $B_1(D)$ is $\beta_1$; the highest order of D in $B_2(D)$ is $\beta_2$; ...; the highest order of D in $B_i(D)$ is $\beta_i$; ...; and the highest order of D in $B_{m-1}(D)$ is $\beta_{m-1}$. Then, the highest value in $\beta_1$ (where i=0, 1, 2, ..., m−1) is $\beta$.

Then, in order to secure the received quality of data and decrease the number of parity bits generated by virtual information bits as much as possible, it is necessary to satisfy conditions that: $\beta$ is equal to or below half of $\alpha_1$; $\beta$ is equal to or below half of $\alpha_2$; ...; $\beta$ is equal to or below half of $\alpha_u$; ...; and $\beta$ is equal to or below half of $\alpha_{n-1}$ (where u=1, 2, 3, ..., n−2, n−1), so that, especially, there is a high possibility to secure the received quality of data.

Also, even in a case where: $\beta$ is equal to or below half of $\alpha_1$; $\beta$ is equal to or below half of $\alpha_2$; ...; $\beta$ is equal to or below half of $\alpha_u$; ...; or $\beta$ is equal to or below half of $\alpha_{n-1}$ (where u=1, 2, 3, ..., n−2, n−1), although it is possible to secure the received quality of data and decrease the number of parity bits generated by virtual information bits as much as possible, there is a little possibility to cause degradation in the received quality of data (here, degradation in the received quality of data is not necessarily caused).

Table 6 shows an example of LDCPC-CC parity check polynomials that can secure the received quality of data and reduce redundant bits, where the time varying period is 3 and the coding rate is 1/2, 2/3, 3/4 or 4/5. If LDPC-CCs of a time varying period of 3 in two different coding rates are selected from LDPC-CCs of a time varying period of 3 in coding rates of 1/2, 2/3, 3/4 and 5/6 in table 6, and whether or not the above-described conditions for sharing encoders and decoders are satisfied is examined, similar to LDPC- CCs of a time varying period of 3 in table 5, it is confirmed that the above conditions for enabling sharing process in encoders and decoders are satisfied in any selected patterns.

Also, although 1000 redundant bits are required in a coding rate of 5/6 in table 5, it is confirmed that the number of redundant bits is equal to or below 500 bits in a coding rate of 4/5 in table 6.

Also, in the codes of table 6, the number of redundant bits (which are added for information-zero-termination) varies between coding rates. At this time, the number of redundant bits tends to increase when the coding rate increases. However, this tendency is not always seen. Furthermore, when the coding rate is large and the information size is large, the number of redundant bits tends to increase. That is, when codes are created as shown in Table 5 and Table 6, if there are a code of a coding rate of (n−1)/n and a code of a coding rate of (m−1)/m (n>m), the number of redundant bits necessary for the code of a coding rate of (n−1)/n (redundant bits added for "information-zero-termination") tends to be greater than the number of redundant bits necessary for the code of a coding rate of (m−1)/m (redundant bits added for "information-zero-termination"), and moreover when the information size is small, the number of redundant bits necessary for the code of a coding rate of (n−1)/n tends to be greater than the number of redundant bits necessary for the code of a coding rate of (m−1)/m. However, such a tendency is not always observed.

TABLE 6

| Code | Parity check polynomial |
|---|---|
| LDPC-CC of a time varying period of 3 and a coding rate of 1/2 | Check polynomial #1:<br>$(D^{268} + D^{164} + 1)X_1(D) + (D^{92} + D^7 + 1)P(D) = 0$<br>Check polynomial #2:<br>$(D^{370} + D^{317} + 1)X_1(D) + (D^{95} + D^{22} + 1)P(D) = 0$<br>Check polynomial #3:<br>$(D^{346} + D^{86} + 1)X_1(D) + (D^{88} + D^{26} + 1)P(D) = 0$ |
| LDPC-CC of a time varying period of 3 and a coding rate of 2/3 | Check polynomial #1:<br>$(D^{268} + D^{164} + 1)X_1(D) + (D^{385} + D^{242} + 1)X_2(D) + (D^{92} + D^7 + 1)P(D) = 0$<br>Check polynomial #2:<br>$(D^{370} + D^{317} + 1)X_1(D) + (D^{125} + D^{103} + 1)X_2(D) + (D^{95} + D^{22} + 1)P(D) = 0$<br>Check polynomial #3:<br>$(D^{346} + D^{86} + 1)X_1(D) + (D^{319} + D^{290} + 1)X_2(D) + (D^{88} + D^{26} + 1)P(D) = 0$ |
| LDPC-CC of a time varying period of 3 and a coding rate of 3/4 | Check polynomial #1:<br>$(D^{268} + D^{164} + 1)X_1(D) + (D^{385} + D^{242} + 1)X_2(D) + (D^{343} + D^{284} + 1)X_3(D) + (D^{92} + D^7 + 1)P(D) = 0$<br>Check polynomial #2:<br>$(D^{370} + D^{317} + 1)X_1(D) + (D^{125} + D^{103} + 1)X_2(D) + (D^{259} + D^{14} + 1)X_3(D) + (D^{95} + D^{22} + 1)P(D) = 0$<br>Check polynomial #3:<br>$(D^{346} + D^{86} + 1)X_1(D) + (D^{319} + D^{290} + 1)X_2(D) + (D^{145} + D^{11} + 1)X_3(D) + (D^{88} + D^{26} + 1)P(D) = 0$ |
| LDPC-CC of a time varying period of 3 and a coding rate of 4/5 | Check polynomial #1:<br>$(D^{268} + D^{164} + 1)X_1(D) + (D^{385} + D^{242} + 1)X_2(D) + (D^{343} + D^{284} + 1)X_3(D) + (D^{310} + D^{113} + 1)X_4(D) + (D^{92} + D^7 + 1)P(D) = 0$<br>Check polynomial #2:<br>$(D^{370} + D^{317} + 1)X_1(D) + (D^{125} + D^{103} + 1)X_2(D) + (D^{259} + D^{14} + 1)X_3(D) + (D^{394} + D^{188} + 1)X_4(D) + (D^{95} + D^{22} + 1)P(D) = 0$<br>Check polynomial #3:<br>$(D^{346} + D^{86} + 1)X_1(D) + (D^{319} + D^{290} + 1)X_2(D) + (D^{145} + D^{11} + 1)X_3(D) + (D^{239} + D^{67} + 1)X_4(D) + (D^{88} + D^{26} + 1)P(D) = 0$ |

A case has been described above where the maximum coding rate is (q−1)/q among coding rates of enabling encoder circuits to be shared and enabling decoder circuits to be shared, and where an LDPC-CC parity check polynomial of a coding rate of (r−1)/r (r=2, 3, . . . , q (q is a natural number equal to or greater than 3)) and a time varying period of g is provided.

Here, the method of generating an LDPC-CC parity check polynomial of a time varying period of g for reducing the computational complexity (i.e. circuit scale) in a transmitting apparatus and receiving apparatus, and features of parity check polynomials have been described, where the transmitting apparatus provides at least an LDPC-CC encoder of a coding rate of (y−1)/y and a time varying period of g and an LDPC-CC encoder of a coding rate of (z−1)/z (y≠z) and a time varying period of g, and where the receiving apparatus provides at least an LDPC-CC decoder of a coding rate of (y−1)/y and a time varying period of g and an LDPC-CC decoder of a coding rate of (z−1)/z (y≠z) and a time varying period of g.

Here, the transmitting apparatus refers to a transmitting apparatus that can generate at least one of a modulation signal for transmitting an LDPC-CC coding sequence of a coding rate of (y−1)/y and a time varying period of g and an LDPC-CC coding sequence of a coding rate of (z−1)/z and a time varying period of g.

Also, the receiving apparatus refers to a receiving apparatus that demodulates and decodes at least one of a received signal including an LDPC-CC coding sequence of a coding rate of (y−1)/y and a time varying period of g and a received signal including an LDPC-CC coding sequence of a coding rate of (z−1)/z and a time varying period of g.

By using an LDPC-CC of a time varying period of g proposed by the present invention, it is possible to provide an advantage of reducing the computational complexity (i.e. circuit scale) in a transmitting apparatus including encoders and in a receiving apparatus including decoders (i.e. it is possible to share circuits).

Further, by using an LDPC-CC of a time varying period of g proposed by the present invention, it is possible to provide an advantage of acquiring data of high received quality in the receiving apparatus in any coding rates. Also, the configurations of encoders and decoders, and their operations will be described later in detail.

Also, although a case has been described above where LDPC-CCs of a time varying period of g in coding rates of 1/2, 2/3, 3/4, . . . , and (q−1)/q are provided in equations 30-1 to 30-(q−1), a transmitting apparatus including encoders and a receiving apparatus including decoders need not support all of the coding rates of 1/2, 2/3, 3/4, . . . , and (q−1)/q. That is, as long as these apparatuses support at least two or more different coding rates, it is possible to provide an advantage of reducing the computational complexity (or circuit scale) in the transmitting apparatus and the receiving apparatus (i.e. sharing encoder circuits and decoder circuits), and acquiring data of high received quality in the receiving apparatus.

Also, if all of coding rates supported by the transmitting and receiving apparatuses (encoders/decoders) are associated with codes based on the methods described with the present embodiment, by providing encoders/decoders of the highest coding rate among the supported coding rates, it is possible to easily support coding and decoding in all coding rates and, at this time, provide an advantage of reducing the computational complexity significantly.

Furthermore, although the present embodiment has been described based on the code (LDPC-CC with good characteristics) described in Embodiment 1, the above-described condition (LDPC-CC with good characteristics) need not always be satisfied, and the present embodiment can be likewise implemented if it is an LDPC-CC of a time varying period of g (g is an integer equal to or greater than 2) based on a parity check polynomial of the above-described format (LDPC-CC with good characteristics). This is obvious from the relationships between equations 31-1 to 31-g and equations 32-1 to 32-g.

Naturally, for example, in a case where: the transmitting and receiving apparatuses (encoders/decoders) support coding rates of 1/2, 2/3, 3/4 and 5/6; LDPC-CCs based on the above conditions are used in coding rates of 1/2, 2/3 and 3/4; and codes not based on the above conditions are used in a coding rate of 5/6, it is possible to share circuits in the encoders and decoders in coding rates of 1/2, 2/3 and 3/4, and it is difficult to share circuits in these encoders and decoders to share circuits in a coding rate of 5/6.

Embodiment 3

The present embodiment will explain in detail the method of sharing encoder circuits of an LDPC-CC formed by the search method explained in Embodiment 2 and the method of sharing decoder circuits of that LDPC-CC.

First, in a case where the highest coding rate is $(q-1)/q$ among coding rates for sharing encoder circuits and decoder circuits, an LDPC-CC encoder of a time varying rate of g (where g is a natural number) supporting a plurality of coding rates, $(r-1)/r$, will be explained (e.g. when the coding rates supported by a transmitting and receiving apparatus are 1/2, 2/3, 3/4 and 5/6, coding rates of 1/2, 2/3 and 3/4 allow the circuits of encoders/decoders to be shared, while a coding rate of 5/6 does not allow the circuits of encoders/decoders to be shared, where the above highest coding rate, $(q-1)/q$, is 3/4).

Figure 11:
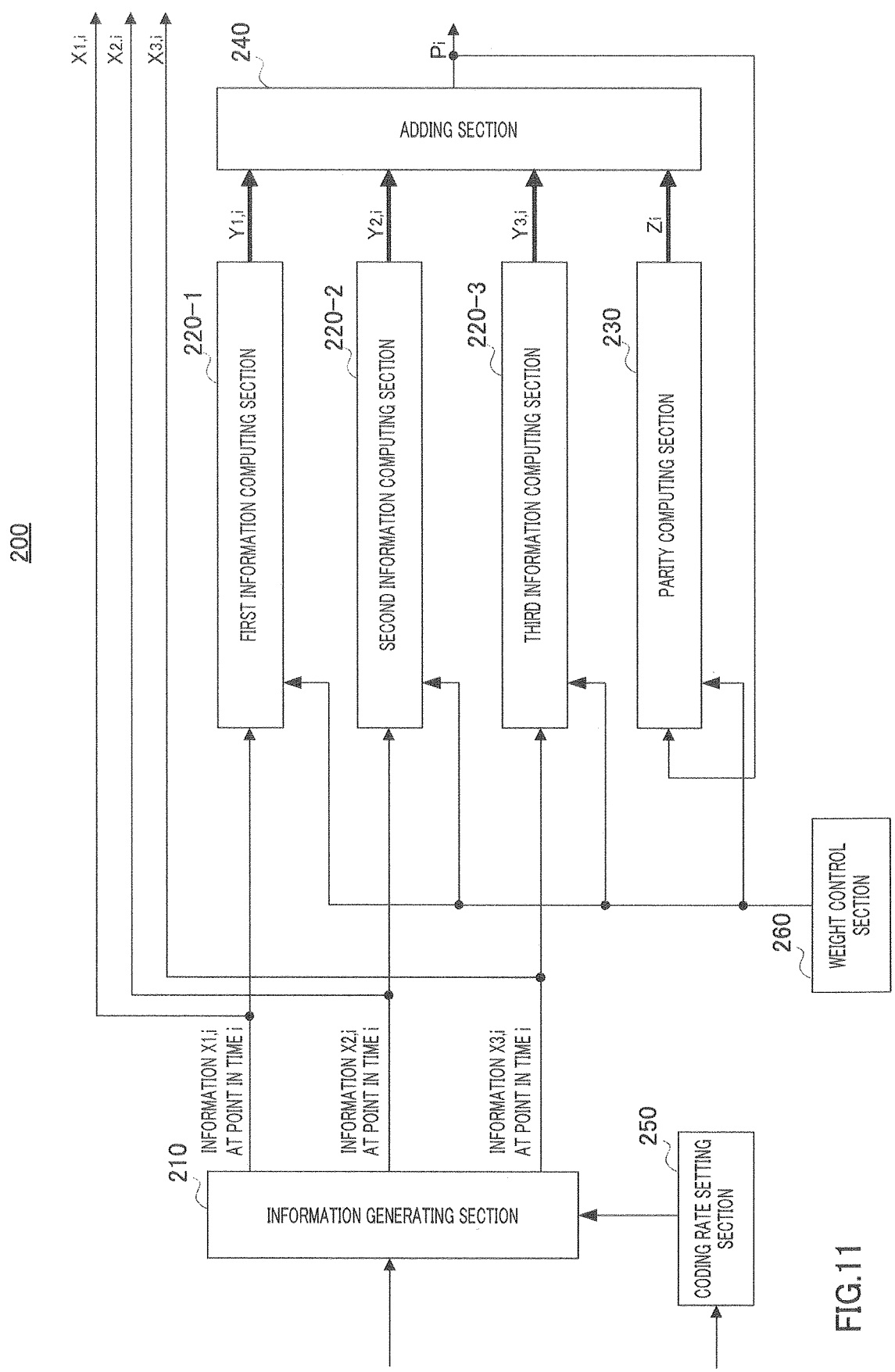
FIG. 11 is a block diagram showing the main configuration of an encoder according to Embodiment 3 of the present invention.

FIG. 11 is a block diagram showing an example of the main components of an encoder according to the present embodiment. Also, encoder 200 shown in FIG. 11 refers to an encoder that can support coding rates of 1/2, 2/3 and 3/4. Encoder 200 shown in FIG. 11 is mainly provided with information generating section 210, first information computing section 220-1, second information computing section 220-2, third information computing section 220-3, parity computing section 230, adding section 240, coding rate setting section 250 and weight control section 260.

Information generating section 210 sets information $X_{1,i}$, information $X_{2,i}$ and information $X_{3,i}$ at point in time i, according to a coding rate designated from coding rate setting section 250. For example, if coding rate setting section 250 sets the coding rate to 1/2, information generating section 210 sets information $X_{1,i}$ at point in time i to input information data $S_j$, and sets information $X_{2,i}$ and information $X_{3,i}$ at point in time i to "0."

Also, in the case of a coding rate of 2/3, information generating section 210 sets information $X_{1,i}$ at point in time i to input information data $S_j$, sets information $X_{2,i}$ at point in time i to input information data $S_{j+1}$ and sets information $X_{3,i}$ at point in time i to input information data $S_{j+2}$.

Also, in the case of a coding rate of 3/4, information generating section 210 sets information $X_{1,i}$ at point in time i to input information data $S_j$, sets information $X_{2,i}$ at point in time i to input information data $S_{j+1}$ and sets information $X_{3,i}$ at point in time i to input information data $S_{j+2}$.

In this way, using input information data, information generating section 210 sets information $X_{1,i}$, information $X_{2,i}$ and information $X_{3,i}$ at point in time i according to a coding rate set in coding rate setting section 250, outputs set information $X_{1,i}$ to first information computing section 220-1, outputs set information $X_{2,i}$ to second information computing section 220-2 and outputs set information $X_{3,i}$ to third information computing section 220-3.

First information computing section 220-1 calculates $X_1(D)$ according to $A_{X1,k}(D)$ of equation 30-1. Similarly, second information computing section 220-2 calculates $X_2(D)$ according to $A_{X2,k}(D)$ of equation 30-2. Similarly, third information computing section 220-3 calculates $X_3(D)$ according to $A_{X3,k}(D)$ of equation 30-3.

At this time, as described in Embodiment 2, from the conditions to satisfy in equations 31-1 to 31-g and 32-1 to 32-g, if the coding rate is changed, it is not necessary to change the configuration of first information computing section 220-1, and, similarly, change the configuration of second information computing section 220-2 and change the configuration of third information computing section 220-3.

Therefore, when a plurality of coding rates are supported, by using the configuration of the encoder of the highest coding rate as a reference among coding rates for sharing encoder circuits, the other coding rates can be supported by the above operations. That is, regardless of coding rates, LDPC-CCs explained in Embodiment 2 provide an advantage of sharing first information computing section 220-1, second information computing section 220-2 and third information computing section 220-3, which are main components of the encoder. Also, for example, the LDPC-CCs shown in table 5 provides an advantage of providing data of good received quality regardless of coding rates.

Figure 12:
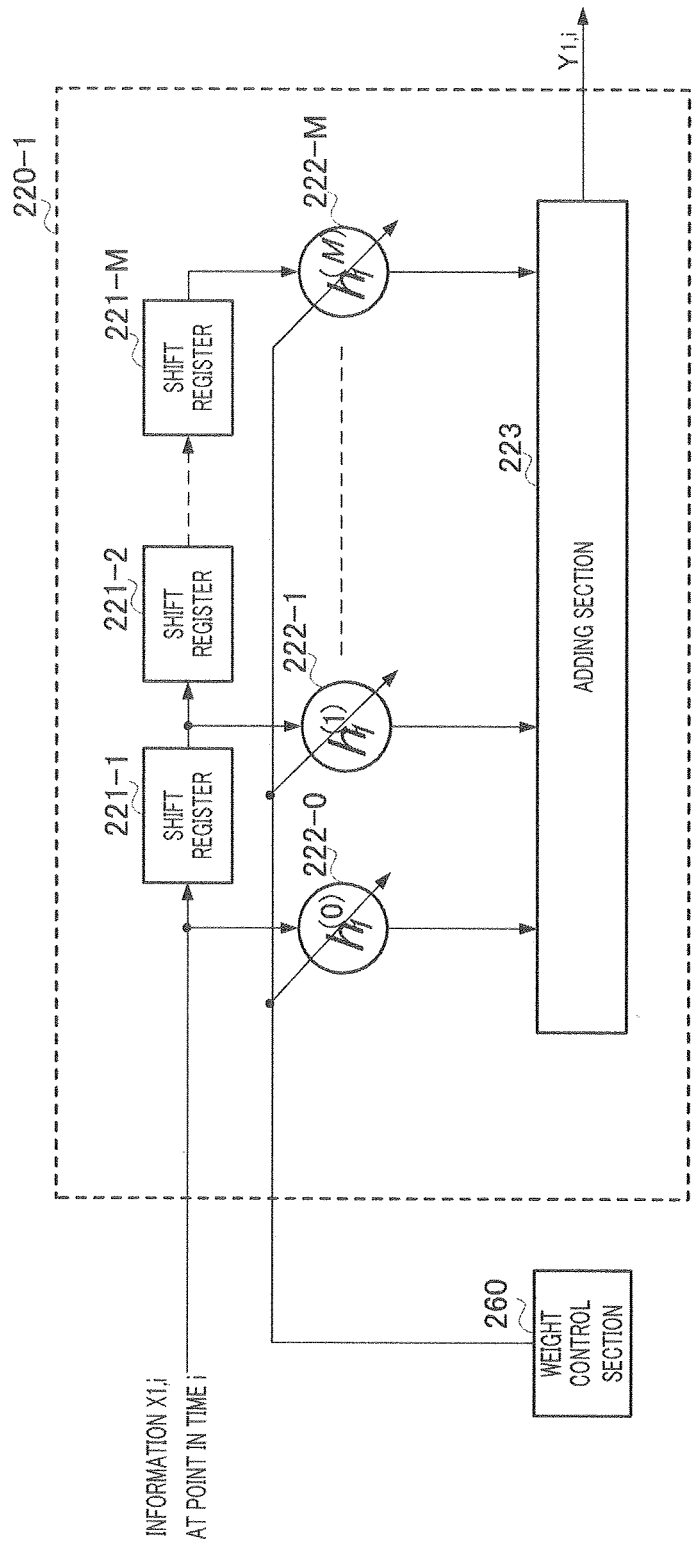
FIG. 12 is a block diagram showing the main configuration of a first information computing section according to Embodiment 3.

FIG. 12 shows the configuration inside first information computing section 220-1. First information computing section 220-1 in FIG. 12 is provided with shift registers 221-1 to 221-M, weight multipliers 220-0 to 222-M and adder 223.

Shift registers 222-1 to 222-M are registers each storing $X_{1,i-t}$ (where t=0, . . . , M), and, at a timing at which the next input comes in, send a stored value to the adjacent shift register to the right, and store a value sent from the adjacent shift register to the left.

Weight multipliers 220-0 to 222-M switch a value of $h_1^{(m)}$ to 0 or 1 in accordance with a control signal outputted from weight control section 260.

Adder 223 performs exclusive OR computation of outputs of weight multipliers 222-0 to 222-M to find and output computation result $Y_{1,i}$ to adder 240 in FIG. 11.

Also, the configurations inside second information computing section 220-2 and third information computing section 220-3 are the same as first information computing section 220-1, and therefore their explanation will be omitted. In the same way as in first information computing section 220-1, second information computing section 220-2 finds and outputs calculation result $Y_{2,i}$ to adder 240. In the same way as in first information computing section 220-1, third information computing section 220-3 finds and outputs calculation result $Y_{3,i}$ to adder 240 in FIG. 11.

Parity computing section 230 in FIG. 11 calculates P(D) according to $B_k(D)$ of equations 30-1 to 30-3.

Parity computing section 230 in FIG. 11 calculates P(D) according to $B_k(D)$ of equations 30-1 to 30-3.

Figure 13:
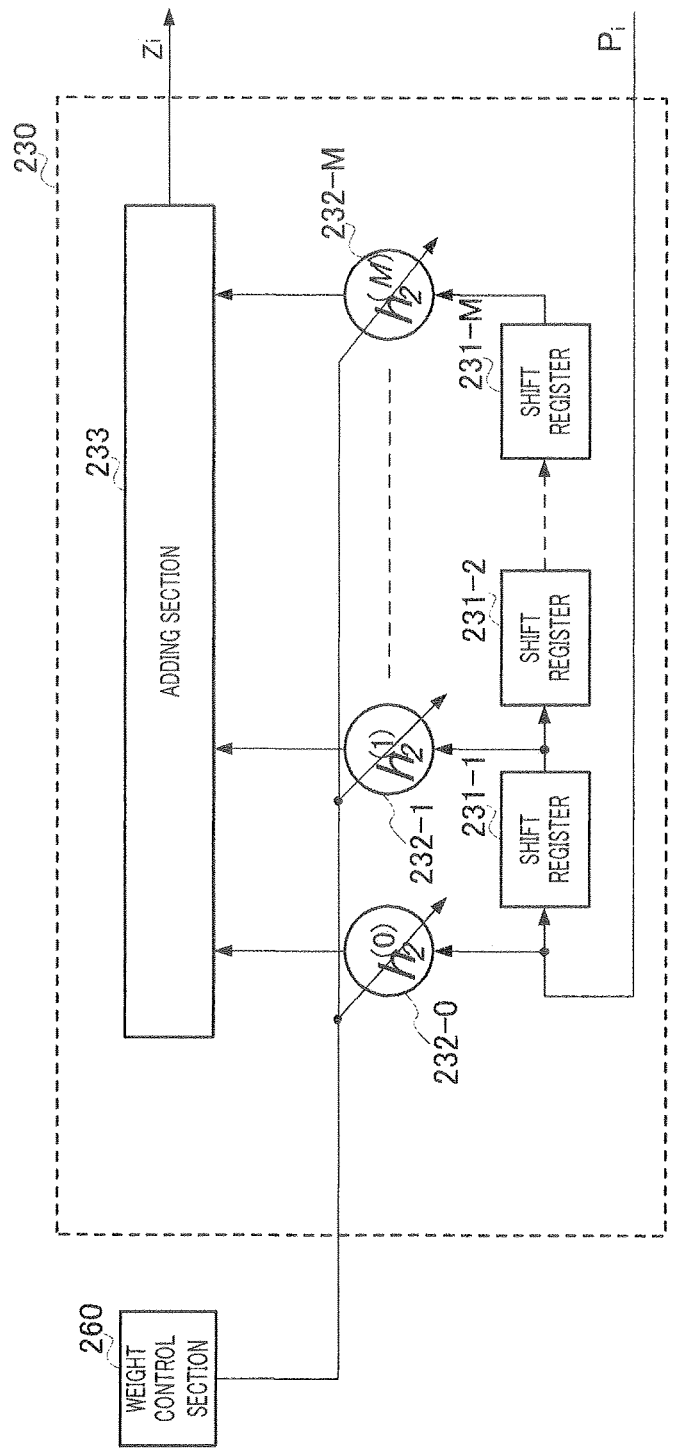
FIG. 13 is a block diagram showing the main configuration of a parity computing section according to Embodiment 3.

FIG. 13 shows the configuration inside parity computing section 230 in FIG. 11. Parity computing section 230 in FIG. 13 is provided with shift registers 231-1 to 231-M, weight multipliers 232-0 to 232-M and adder 233.

Shift registers 231-1 to 231-M are registers each storing $P_{i-t}$ (where t=0, . . . , M), and, at a timing at which the next input comes in, send a stored value to the adjacent shift register to the right, and store a value sent from the adjacent shift register to the left.

Weight multipliers 232-0 to 232-M switch a value of $h_2^{(m)}$ to 0 or 1 in accordance with a control signal outputted from weight control section 260.

Adder 223 performs exclusive OR computation of outputs of weight multipliers 232-0 to 232-M to find and output computation result $Z_i$ to adder 240 in FIG. 11.

Referring back to FIG. 11 again, adder 240 performs exclusive OR computation of computation results $Y_{1,i}$, $Y_{2,i}$, $Y_{3,i}$ and $Z_i$ outputted from first information computing section 220-1, second information computing section 220-2, third information computing section 220-3 and parity computing section 230, to find and output parity $P_i$ at point in time i. Adder 240 also outputs parity $P_i$ at point in time i to parity computing section 230.

Coding rate setting section 250 sets the coding rate of encoder 200 and outputs coding rate information to information generating section 210.

Based on a parity check matrix supporting equations 30-1 to 30-3 held in weight control section 260, weight control section 260 outputs the value of $h_1^{(m)}$ at point in time i based on the parity check polynomials of equations 30-1 to 30-3, to first information computing section 220-1, second information computing section 220-2, third information computing section 220-3 and parity computing section 230. Also, based on the parity check matrix supporting equations 30-1 to 30-3 held in weight control section 260, weight control section 260 outputs the value of $h_2^{(m)}$ at that timing to weight multipliers 232-0 to 232-M.

Figure 14:
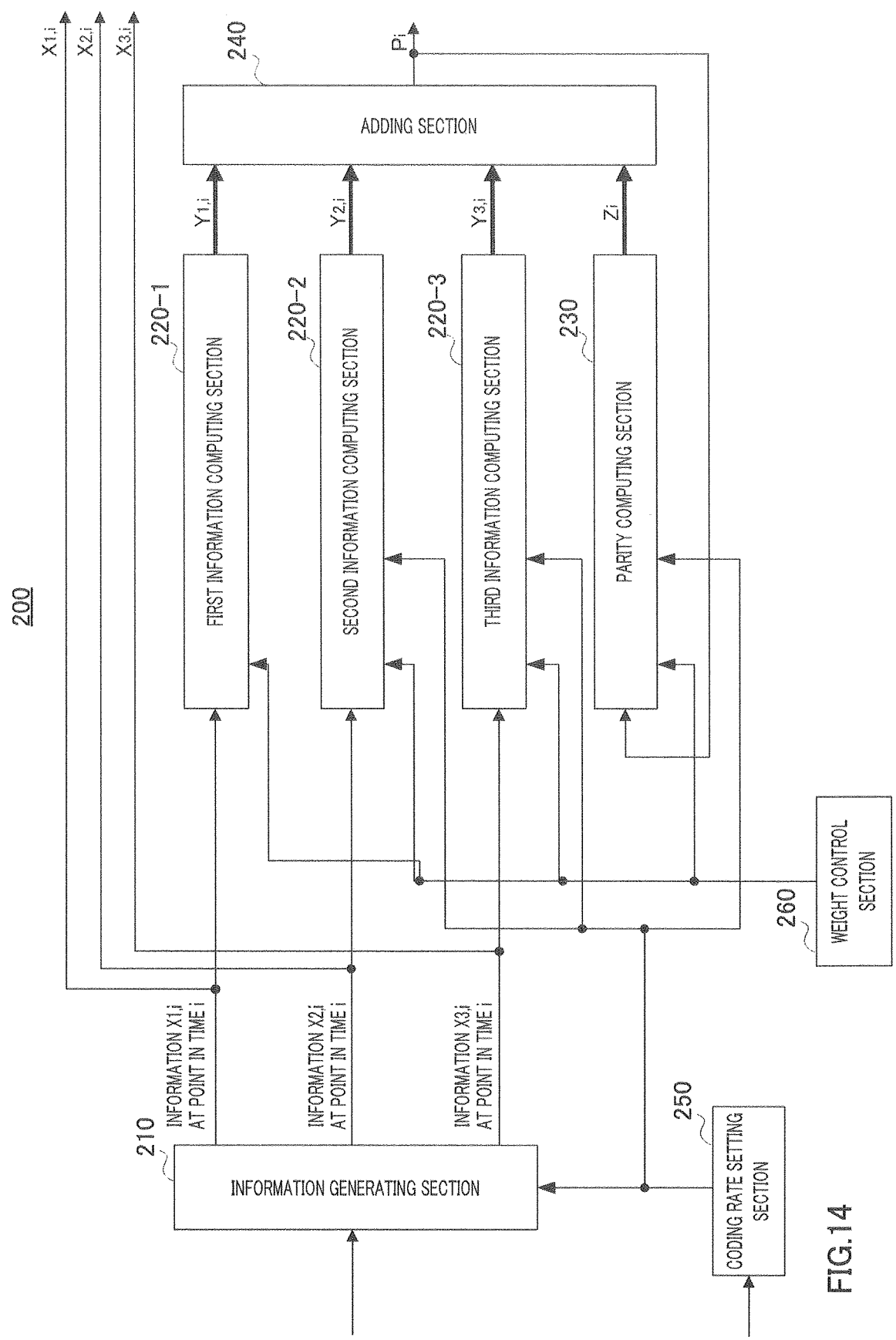
FIG. 14 is a block diagram showing another main configuration of an encoder according to Embodiment 3.

Also, FIG. 14 shows another configuration of an encoder according to the present embodiment. In the encoder of FIG. 14, the same components as in the encoder of FIG. 11 are assigned the same reference numerals. Encoder 200 of FIG. 14 differs from encoder 200 of FIG. 11 in that coding rate setting section 250 outputs coding rate information to first information computing section 220-1, second information computing section 220-2, third information computing section 220-3 and parity computing section 230.

In the case where the coding rate is 1/2, second information computing section 220-2 outputs "0" to adder 240 as computation result $Y_{2,i}$, without computation processing. Also, in the case where the coding rate is 1/2 or 2/3, third information computing section 220-3 outputs "0" to adder 240 as computation result $Y_{3,i}$, without computation processing.

Here, although information generating section 210 of encoder 200 in FIG. 11 sets information $X_{2,i}$ and information $X_{3,i}$ at point in time i to "0" according to a coding rate, second information computing section 220-2 and third information computing section 220-3 of encoder 200 in FIG. 14 stop computation processing according to a coding rate and output 0 as computation results $Y_{2,i}$ and $Y_{3,i}$. Therefore, the resulting computation results in encoder 200 of FIG. 14 are the same as in encoder 200 of FIG. 11.

Thus, in encoder 200 of FIG. 14, second information computing section 220-2 and third information computing section 220-3 stops computation processing according to a coding rate, so that it is possible to reduce computation processing, compared to encoder 200 of FIG. 11.

Next, the method of sharing LDPC-CC decoder circuits described in Embodiment 2 will be explained in detail.

Figure 15:
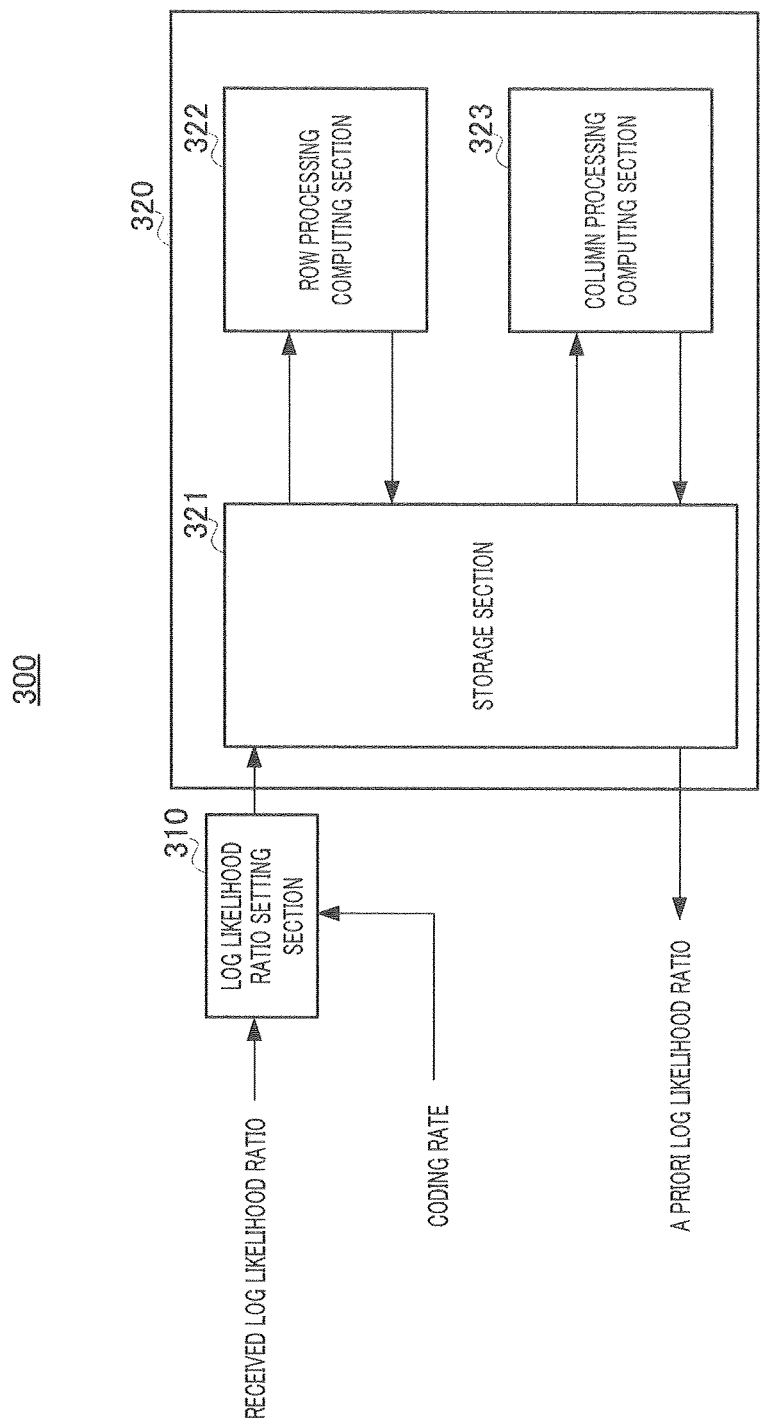
FIG. 15 is a block diagram showing the main configuration of a decoder according to Embodiment 3.

FIG. 15 is a block diagram showing the main components of a decoder according to the present embodiment. Here, decoder 300 shown in FIG. 15 refers to a decoder that can support coding rates of 1/2, 2/3 and 3/4. Decoder 300 of FIG. 14 is mainly provided with log likelihood ratio setting section 310 and matrix processing computing section 320.

Log likelihood ratio setting section 310 receives as input a reception log likelihood ratio and coding rate calculated in a log likelihood ratio computing section (not shown), and inserts a known log likelihood ratio in the reception log likelihood ratio according to the coding rate.

For example, when the coding rate is 1/2, it means that encoder 200 transmits "0" as $X_{2,i}$ and $X_{3,i}$, and, consequently, log likelihood ratio setting section 310 inserts a fixed log likelihood ratio for the known bit "0" as the log likelihood ratios of $X_{2,i}$ and $X_{3,i}$, and outputs the inserted log likelihood ratios to matrix processing computing section 320. This will be explained below using FIG. 16.

Figure 16:
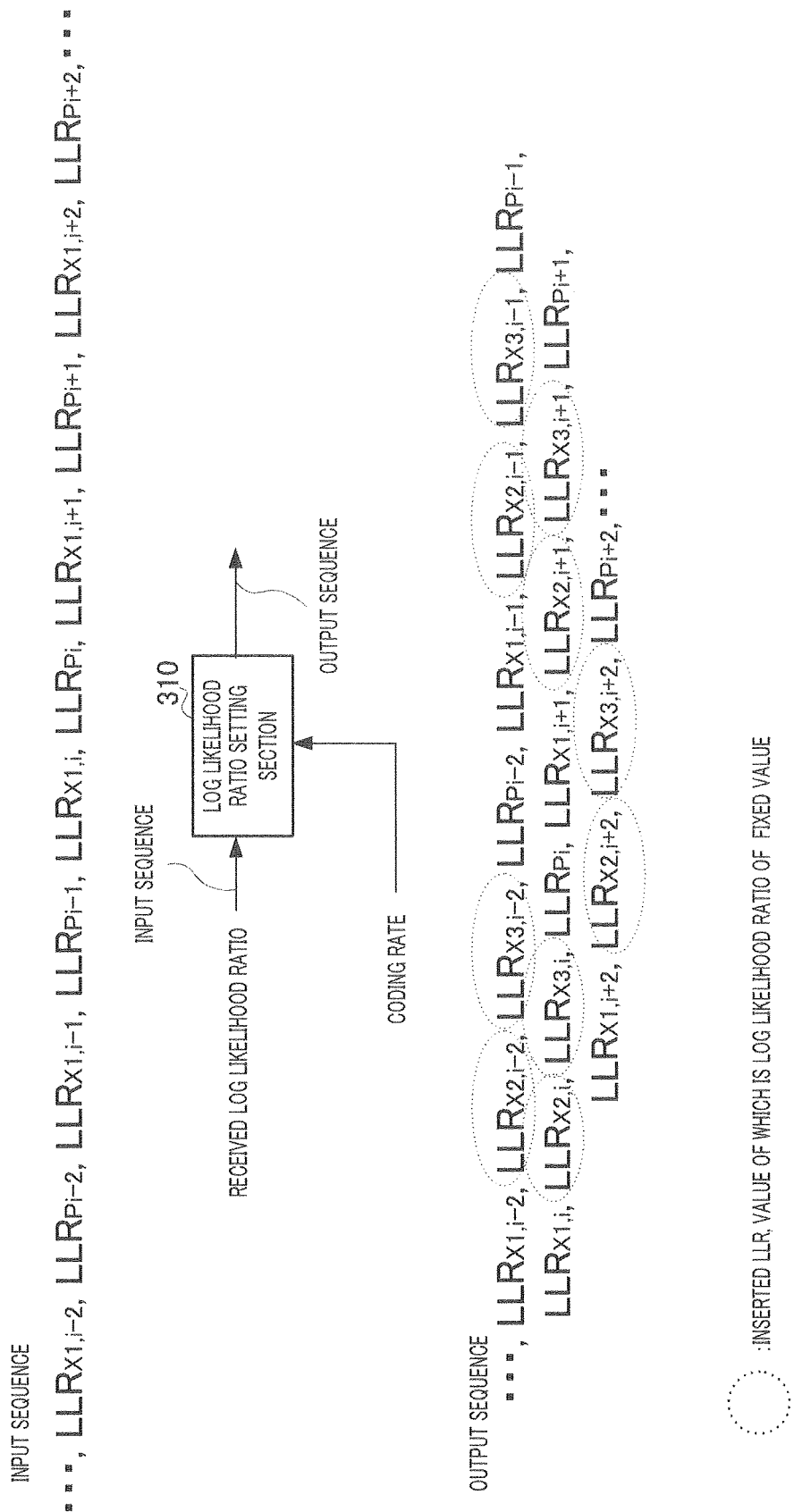
FIG. 16 illustrates operations of a log likelihood ratio setting section in a case of a coding rate of 1/2.

As shown in FIG. 16, when the coding rate is 1/2, log likelihood ratio setting section 310 receives reception log likelihood ratios $LLR_{X1,i}$ and $LLR_{Pi}$ corresponding to $X_{1,i}$ and $P_i$, respectively. Therefore, log likelihood ratio setting section 310 inserts reception log likelihood ratios $LLR_{X2,i}$ and $LLR_{3,i}$ corresponding to $X_{2,i}$ and $X_{3,i}$, respectively. In FIG. 16, reception log likelihood ratios circled by dotted lines represent reception log likelihood ratios $LLR_{X2,i}$ and $LLR_{3,i}$ inserted by log likelihood ratio setting section 310. Log likelihood ratio setting section 310 inserts fixed-value log likelihood ratios as reception log likelihood ratios $LLR_{X2,i}$ and $LLR_{3,i}$.

Also, in the case where the coding rate is 2/3, it means that encoder 200 transmits "0" as $X_{3,i}$, and, consequently, log likelihood ratio setting section 310 inserts a fixed log likelihood ratio for the known bit "0" as the log likelihood ratio of $X_{3,i}$, and outputs the inserted log likelihood ratio to matrix processing computing section 320. This will be explained using FIG. 17.

Figure 17:
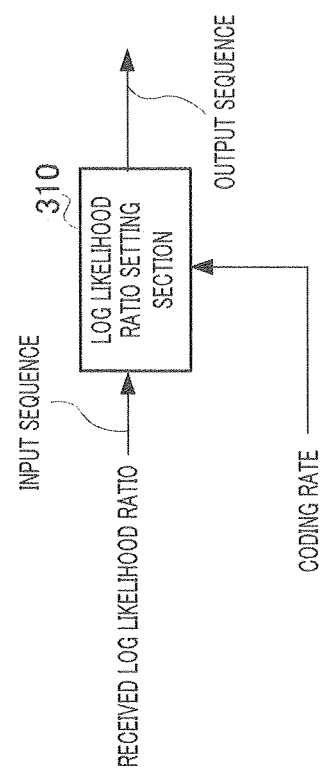
FIG. 17 illustrates operations of a log likelihood ratio setting section in a case of a coding rate of 2/3.

As shown in FIG. 17, in the case where the coding rate is 2/3, log likelihood ratio setting section 310 receives as input reception log likelihood ratios $LLR_{X1}$, $LLR_{X2,i}$ and $LLR_{Pi}$ corresponding to $X_{1,i}$, $X_{2,i}$ and $P_i$, respectively. Therefore, log likelihood ratio setting section 310 inserts reception log likelihood ratio $LLR_{3,i}$ corresponding to $X_{3,i}$. In FIG. 17, reception log likelihood ratios circled by dotted lines represent reception log likelihood ratio $LLR_{3,i}$ inserted by log likelihood ratio setting section 310. Log likelihood ratio setting section 310 inserts fixed-value log likelihood ratios as reception log likelihood ratio $LLR_{3,i}$.

Matrix processing computing section 320 in FIG. 15 is provided with storage section 321, row processing computing section 322 and column processing computing section 323.

Storage section 321 stores a log likelihood ratio, external value $\alpha_{mn}$ obtained by row processing and a priori value $\beta_{mn}$ obtained by column processing.

Row processing computing section 322 holds the row-direction weight pattern of LDPC-CC parity check matrix H of the maximum coding rate of 3/4 among coding rates supported by encoder 200. Row processing computing section 322 reads a necessary priori value $\beta_{mn}$ from storage section 321, according to that row-direction weight pattern, and performs row processing computation.

In row processing computation, row processing computation section 322 decodes a single parity check code using a priori value $\beta_{mn}$, and finds external value $\alpha_{mn}$.

Processing of the m-th row will be explained. Here, an LDPC code parity check matrix to decode two-dimensional M×N matrix H={$H_{mn}$} will be used. External value $\alpha_{mn}$ is updated using the following update equation for all pairs (m, n) satisfying the equation $H_{mn}=1$.

[39]

$$\alpha_{mn} = \left(\prod_{n' \in A(m)\backslash n} \text{sign}(\beta_{mn'})\right) \Phi\left(\sum_{n' \in A(m)\backslash n} \Phi(|\beta_{mn'}|)\right) \quad \text{(Equation 39)}$$

where $\Phi(x)$ is called a Gallager f function, and is defined by the following equation.

[40]

$$\Phi(x) = \ln \frac{\exp(x)+1}{\exp(x)-1} \quad \text{(Equation 40)}$$

Column processing computing section 323 holds the column-direction weight pattern of LDPC-CC parity check matrix H of the maximum coding rate of 3/4 among coding rates supported by encoder 200. Column processing computing section 323 reads a necessary external value $\alpha_{mn}$ from storage section 321, according to that column-direction weight pattern, and finds a priori value $\beta_{mn}$.

In column processing computation, column processing computing section 323 performs iterative decoding using input log likelihood ratio $\lambda_n$ and external value $\alpha_{mn}$, and finds a priori value $\beta_{mn}$.

Processing of the m-th column will be explained. $\beta_{mn}$ is updated using the following update equation for all pairs (m, n) satisfying the equation $H_{mn}=1$. Only when q=1, the calculation is performed with $\alpha_{mn}=0$.

[41]

$$\beta_{mn} = \lambda_n + \sum_{m' \in B(n)/m} \alpha_{m'n} \quad \text{(Equation 41)}$$

After repeating above row processing and column processing a predetermined number of times, decoder 300 finds an a posteriori log likelihood ratio.

As described above, with the present embodiment, in a case where the highest coding rate is (q−1)/q among supported coding rates and where coding rate setting section 250 sets the coding rate to (s−1)/s, information generating section 310 sets from information $X_{s,i}$ to information $X_{q-1,i}$ as "0." For example, when supported coding rates are 1/2, 2/3 and 3/4 (q=4), first information computing section 220-1 receives as input information $X_{1,i}$ at point in time i and calculates term $X_1(D)$ of equation 30-1. Also, second information computing section 220-2 receives as input information $X_{2,i}$ at point in time i and calculates term $X_2(D)$ of equation 30-2. Also, third information computing section 220-3 receives as input information $X_{3,i}$ at point in time i and calculates term $X_3(D)$ of equation 30-3. Also, parity computing section 230 receives as input parity at point in time i−1 and calculates term P(D) of equations 30-1 to 30-3. Also, adder 240 finds, as parity $P_i$ at point in time i, the exclusive OR of the computation results of first information computing section 220-1, second information computing section 220-2 and third information computing section 220-3 and the computation result of parity computing section 230.

With this configuration, upon creating an LDPC-CC supporting different coding rates, it is possible to share the configurations of information computing sections according to the above explanation, so that it is possible to provide an LDPC-CC encoder and decoder that can support a plurality of coding rates in a small computational complexity.

Also, in a case where $A_{X1,k}(D)$ to $A_{Xq-1,k}(D)$ are set to satisfy the above <Condition #1> to <Condition #6> described with the above LDPC-CCs of good characteristics, it is possible to provide an encoder and decoder that can support different coding rates in a small computational complexity and provide data of good received quality in the receiver. Here, as described in Embodiment 2, the method of generating an LDPC-CC is not limited to the above case of LDPC-CCs of good characteristics.

Also, by adding log likelihood ratio setting section 310 to the decoder configuration based on the maximum coding rate among coding rates for sharing decoder circuits, decoder 300 in FIG. 15 can perform decoding in accordance with a plurality of coding rates. Also, according to a coding rate, log likelihood ratio setting section 310 sets log likelihood ratios for (q−2) items of information from information $X_{r,i}$ to information $X_{q-1,i}$ at point in time i, to predetermined values.

Also, although a case has been described above where the maximum coding rate supported by encoder 200 is 3/4, the supported maximum coding rate is not limited to this, and is equally applicable to a case where a coding rate of (q−1)/q (where q is an integer equal to or greater than 5) is supported (here, it naturally follows that it is possible to set the maximum coding rate to 2/3). In this case, essential requirements are that encoder 200 employs a configuration including first to (q−1)-th information computing sections, and that adder 240 finds, as parity P1at point in time i, the exclusive OR of the computation results of first to (q−1)-th information computing sections and the computation result of party computing section 230.

Also, if all of coding rates supported by the transmitting and receiving apparatuses (encoder/decoder) are associated with codes based on the methods described with above Embodiment 2, by providing an encoder/decoder of the highest coding rate among the supported coding rates, it is possible to easily support coding and decoding in a plurality of coding rates and, at this time, provide an advantage of reducing computational complexity significantly.

Also, although an example case has been described above where the decoding scheme is sum-product decoding, the decoding method is not limited to this, and it is equally possible to implement the present invention using decoding methods by a message-passing algorithm such as min-sum decoding, normalized BP (Belief Propagation) decoding, shuffled BP decoding and offset BP decoding, as shown in Non-Patent Literature 5 to Non-Patent Literature 7.

Next, a case will be explained where the present invention is applied to a communication apparatus that adaptively switches the coding rate according to the communication condition. Also, an example case will be explained where the present invention is applied to a radio communication apparatus, the present invention is not limited to this, but is equally applicable to a PLC (Power Line Communication) apparatus, a visible light communication apparatus or an optical communication apparatus.

Figure 18:
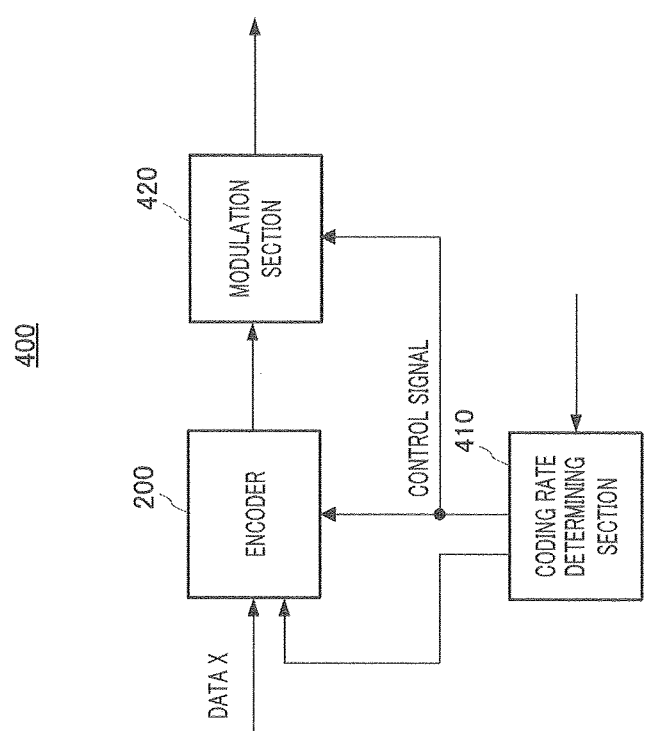
FIG. 18 is a diagram showing an example of the configuration of a communication apparatus equipped with an encoder according to Embodiment 3.

FIG. 18 shows the configuration of communication apparatus 400 that adaptively switches a coding rate. Coding rate determining section 410 of communication apparatus 400 in FIG. 18 receives as input a received signal transmitted from a communication apparatus of the communicating party (e.g. feedback information transmitted from the communicating party), and performs reception processing of the received signal. Further, coding rate determining section 410 acquires information of the communication condition with the communication apparatus of the communicating party, such as a bit error rate, packet error rate, frame error rate and reception field intensity (from feedback information, for example), and determines a coding rate and modulation scheme from the information of the communication condition with the communication apparatus of the communicating party. Further, coding rate determining section 410 outputs the determined coding rate and modulation scheme to encoder 200 and modulating section 420 as a control signal.

Figure 19:
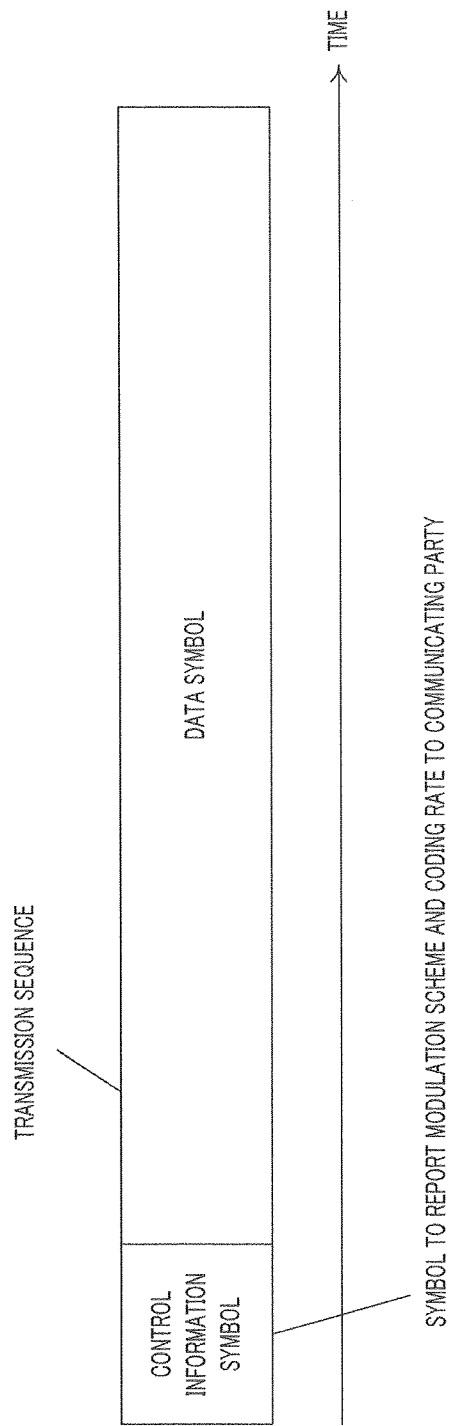
FIG. 19 shows an example of a transmission format.

Using, for example, the transmission format shown in FIG. 19, coding rate determining section 410 includes coding rate information in control information symbols and reports the coding rate used in encoder 200 to the communication apparatus of the communicating party. Here, as is not shown in FIG. 19, the communicating party includes, for example, known signals (such as a preamble, pilot symbol and reference symbol), which are necessary in demodulation or channel estimation.

In this way, coding rate determining section 410 receives a modulation signal transmitted from communication apparatus 500 of the communicating party, and, by determining the coding rate of a transmitted modulation signal based on the communication condition, switches the coding rate adaptively. Encoder 200 performs LDPC-CC coding in the above steps, based on the coding rate designated by the control signal. Modulating section 420 modulates the encoded sequence using the modulation scheme designated by the control signal.

Figure 20:
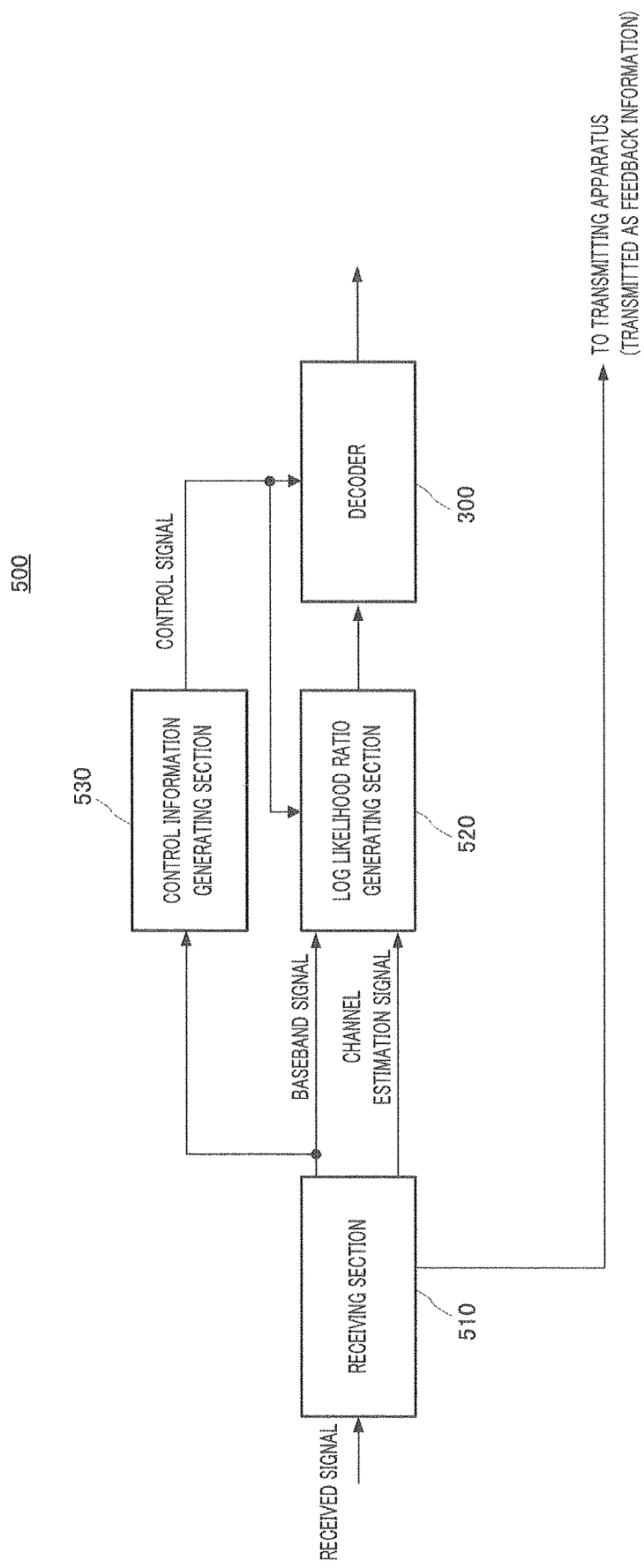
FIG. 20 shows an example of the configuration of a communication apparatus having a decoder according to Embodiment 3.

FIG. 20 shows a configuration example of a communication apparatus of the communicating party that communicates with communication apparatus 400. Control information generating section 530 of communication apparatus 500 in FIG. 20 extracts control information from a control information symbol included in a baseband signal. The control information symbol includes coding rate information. Control information generating section 530 outputs the extracted coding rate information to log likelihood ratio generating section 520 and decoder 300 as a control signal.

Receiving section 510 acquires a baseband signal by applying processing such as frequency conversion and quadrature demodulation to a received signal for a modulation signal transmitted from communication apparatus 400, and outputs the baseband signal to log likelihood ratio generating section 520. Also, using known signals included in the baseband signal, receiving section 510 estimates channel variation in a channel (e.g. radio channel) between communication apparatus 400 and communication apparatus 500, and outputs an estimated channel estimation signal to log likelihood ratio generating section 520.

Also, using known signals included in the baseband signal, receiving section 510 estimates channel variation in a channel (e.g. radio channel) between communication apparatus 400 and communication apparatus 500, and generates and outputs feedback information (such as channel variation itself, which refers to channel state information, for example) for deciding the channel condition. This feedback information is transmitted to the communicating party (i.e. communication apparatus 400) via a transmitting apparatus (not shown), as part of control information. Log likelihood ratio generating section 520 calculates the log likelihood ratio of each transmission sequence using the baseband signal, and outputs the resulting log likelihood ratios to decoder 300.

As described above, according to the coding rate (s−1)/s designated by a control signal, decoder 300 sets the log likelihood ratios for information from information $X_{s,i}$ to information $X_{s-1,i}$, to predetermined values, and performs BP decoding using the LDPC-CC parity check matrix based on the maximum coding rate among coding rates to share decoder circuits.

In this way, the coding rates of communication apparatus 400 and communication apparatus 500 of the communicating party to which the present invention is applied, are adaptively changed according to the communication condition.

Here, the method of changing the coding rate is not limited to the above, and communication apparatus 500 of the communicating party can include coding rate determining section 410 and designate a desired coding rate. Also, communication apparatus 400 can estimate channel variation from a modulation signal transmitted from communication apparatus 500 and determine the coding rate. In this case, the above feedback information is not necessary. In this case, the above-described feedback information is unnecessary.

Embodiment 4

An LDPC-CC having high error correction capability has been described in Embodiment 1. The present embodiment will provide supplemental explanation of an LDPC-CC of a time varying period of 3 having high error correction capability. In the case of an LDPC-CC of a time varying period of 3, when a regular LDPC code is generated, it is possible to create a code having high error correction capability.

The parity check polynomial of the LDPC-CC of a time varying period of 3 is presented again.

When coding rate is 1/2:

[42]

$$(D^{a1}+D^{a2}+D^{a3})X(D)+(D^{b1}+D^{b2}+D^{b3})P(D)=0 \quad \text{(Equation 42-1)}$$

$$(D^{A1}+D^{A2}+D^{A3})X(D)+(D^{B1}+D^{B2}+D^{B3})P(D)=0 \quad \text{(Equation 42-2)}$$

$$(D^{\alpha1}+D^{\alpha2}+D^{\alpha3})X(D)+(D^{\beta1}+D^{\beta2}+D^{\beta3})P(D)=0 \quad \text{(Equation 42-3)}$$

When coding rate is (n−1)/n:

[43]

$$(D^{a1,1}+D^{a1,2}+D^{a1,3})X_1(D)+(D^{a2,1}+D^{a2,2}+D^{a2,3})D_2(D)+\ldots+(D^{an-1,1}+D^{an-1,2}+D^{an-1,3})X_{n-1}(D)+(D^{b1}+D^{b2}+D^{b3})P(D)=0 \quad \text{(Equation 43-1)}$$

$$(D^{A1,1}+D^{A1,2}+D^{A1,3})X_1(D)+(D^{A2,1}+D^{A2,2}+D^{A2,3})D_2(D)+\ldots+(D^{An-1,1}+D^{An-1,2}+D^{An-1,3})X_{n-1}(D)+(D^{B1}+D^{B2}+D^{B3})P(D)=0 \quad \text{(Equation 43-2)}$$

$$(D^{\alpha1,1}+D^{\alpha1,2}+D^{\alpha1,3})X_1(D)+(D^{\alpha2,1}+D^{\alpha2,2}+D^{\alpha2,3})D_2(D)+\ldots+(D^{\alpha n-1,1}+D^{\alpha n-1,2}+D^{\alpha n-1,3})X_{n-1}(D)+(D^{\beta1}+D^{\beta2}+D^{\beta3})P(D)=0 \quad \text{(Equation 43-3)}$$

Here, to make sure that the parity check matrix becomes a full-rank matrix and parity bits are sequentially easily obtained, it is assumed that the following conditions hold true.

b3=0, that is, $D^{b3}=1$
B3=0, that is, $D^{B3}=1$
β3=0, that is, $D^{\beta}=1$ Furthermore, to make the relationship between information and parity easier to understand, the following conditions may preferably hold true.

ai, 3=0, that is, $D^{ai,3}=1$ (i=1, 2, ..., n−1)
Ai, 3=0, that is, $D^{A1,3}=1$ (i=1, 2, ..., n−1)
αi, 3=0, that is, $D^{\alpha i,3}=1$ (i=1, 2, ..., n−1)

where, ai,3%3=0, Ai,3%3=0, and αi,3%3=0 may hold true.

At this time, to generate a regular LDPC code having high error correction capability, the following conditions need to be satisfied by reducing the number of loops 6 in a Tanner graph.

That is, when attention is focused on the coefficient of information $X_k$ (k=1, 2, . . . , n-1), one of #Xk1 to #Xk14 needs to be satisfied.

Xk1: (ak,1%3, ak,2%3)=[0, 1], (Ak,1%3, Ak,2%3)=[0, 1], (αk,1%3, αk,2%3)=[0, 1]
Xk2: (ak,1%3, ak,2%3)=[0, 1], (Ak,1%3, Ak,2%3)=[0, 2], (αk,1%3, αk,2%3)=[1, 2]
Xk3: (ak,1%3, ak,2%3)=[0, 1], (Ak,1%3, Ak,2%3)=[1, 2], (αk,1%3, αk,2%3)=[1, 1]
Xk4: (ak,1%3, ak,2%3)=[0, 2], (Ak,1%3, Ak,2%3)=[1, 2], (αk,1%3, αk,2%3)=[0, 1]
Xk5: (ak,1%3, ak,2%3)=[0, 2], (Ak,1%3, Ak,2%3)=[0, 2], (αk,1%3, αk,2%3)=[0, 2]
Xk6: (ak,1%3, ak,2%3)=[0, 2], (Ak,1%3, Ak,2%3)=[2, 2], (αk,1%3, αk,2%3)=[1, 2]
Xk7: (ak,1%3, ak,2%3)=[1, 1], (Ak,1%3, Ak,2%3)=[0, 1], (αk,1%3, αk,2%3)=[1, 2]
Xk8: (ak,1%3, ak,2%3)=[1, 1], (Ak,1%3, Ak,2%3)=[1, 1], (αk,1%3, αk,2%3)=[1, 1]
Xk9: (ak,1%3, ak,2%3)=[1, 2], (Ak,1%3, Ak,2%3)=[0, 1], (αk,1%3, αk,2%3)=[0, 2]
Xk10: (ak,1%3, ak,2%3)=[1, 2], (Ak,1%3, Ak,2%3)=[0, 2], (αk,1%3, αk,2%3)=[2, 2]
Xk11: (ak,1%3, ak,2%3)=[1, 2], (Ak,1%3, Ak,2%3)=[1, 1], (αk,1%3, αk,2%3)=[0, 1]
Xk12: (ak,1%3, ak,2%3)=[1, 2], (Ak,1%3, Ak,2%3)=[1, 2], (αk,1%3, αk,2%3)=[1, 2]
Xk13: (ak,1%3, ak,2%3)=[2, 2], (Ak,1%3, Ak,2%3)=[1, 2], (αk,1%3, αk,2%3)=[0, 2]
Xk14: (ak,1%3, ak,2%3)=[2, 2], (Ak,1%3, Ak,2%3)=[2, 2], (αk,1%3, αk,2%3)=[2, 2]

When a=b in the above description, (x, y)=[a, b] represents x=y=a(=b) and when a≠b, (x, y)=[a, b] represents x=a, y=b or x=b, y=a (the same applies hereinafter).

Similarly, when attention is focused on the coefficient of parity, one of #P1 to #P14 needs to be satisfied.

P1: (b1%3, b2%3)=[0, 1], (B1%3, B2%3)=[0, 1], (β1%3, β2%3)=[0, 1]
P2: (b1%3, b2%3)=[0, 1], (B1%3, B2%3)=[0, 2], (β1%3, β2%3)=[1, 2]
P3: (b1%3, b2%3)=[0, 1], (B1%3, B2%3)=[1, 2], (β1%3, β2%3)=[1, 1]
P4: (b1%3, b2%3)=[0, 2], (B1%3, B2%3)=[1, 2], (β1%3, β2%3)=[0, 1]
P5: (b1%3, b2%3)=[0, 2], (B1%3, B2%3)=[0, 2], (β1%3, β2%3)=[0, 2]
P6: (b1%3, b2%3)=[0, 2], (B1%3, B2%3)=[2, 2], (β1%3, β2%3)=[1, 2]
P7: (b1%3, b2%3)=[1, 1], (B1%3, B2%3)=[0, 1], (β1%3, β2%3)=[1, 2]
P8: (b1%3, b2%3)=[1, 1], (B1%3, B2%3)=[1, 1], (β1%3, β2%3)=[1, 1]
P9: (b1%3, b2%3)=[1, 2], (B1%3, B2%3)=[0, 1], (β1%3, β2%3)=[0, 2]
P10: (b1%3, b2%3)=[1, 2], (B1%3, B2%3)=[0, 2], (β1%3, β2%3)=[2, 2]
P11: (b1%3, b2%3)=[1, 2], (B1%3, B2%3)=[1, 1], (β1%3, β2%3)=[0, 1]
P12: (b1%3, b2%3)=[1, 2], (B1%3, B2%3)=[1, 2], (β1%3, β2%3)=[1, 2]
P13: (b1%3, b2%3)=[2, 2], (B1%3, B2%3)=[1, 2], (β1%3, β2%3)=[0, 2]
P14: (b1%3, b2%3)=[2, 2], (B1%3, B2%3)=[2, 2], (β1%3, β2%3)=[2, 2]

The LDPC-CC with good characteristics described in Embodiment 1 is the LDPC-CC that satisfies the conditions of #Xk12 and #P12 among the above conditions. Furthermore, when used together with Embodiment 2, the present embodiment can reduce the circuit scale of the encoder and decoder when supporting a plurality of coding rates and obtain high error correction capability.

The following is an example of parity check polynomial of an LDPC-CC of a time varying period of 3 that satisfies the conditions of one of #Xk1 to #Xk14 and one of #P1 to #P14.

Coding rate R=1/2:

[44]

$$A_{X1,1}(D)X_1(D)+B_1(D)P(D)=(D^{286}+D^{164}+1)X_1(D)+(D^{92}+D^7+1)P(D)=0 \quad \text{(Equation 44-1)}$$

$$A_{X1,2}(D)X_1(D)+B_2(D)P(D)=(D^{370}+D^{317}+1)X_1(D)+(D^{95}+D^{22}+1)P(D)=0 \quad \text{(Equation 44-2)}$$

$$A_{X1,3}(D)X_1(D)+B_3(D)P(D)=(D^{346}+D^{86}+1)X_1(D)+(D^{88}+D^{26}+1)P(D)=0 \quad \text{(Equation 44-3)}$$

Coding rate R=2/3:

[45]

$$A_{X1,1}(D)X_1(D)+A_{X2,1}(D)X_2(D)+B_1(D)P(D)=(D^{286}+D^{164}+1)X_1(D)+(D^{385}+D^{242}+1)X_2(D)+)D^{92}+D^7+1)P(D)=0 \quad \text{(Equation 45-1)}$$

$$A_{X1,2}(D)X_1(D)+A_{X2,2}(D)X_2(D)+B_2(D)P(D)=(D^{370}+D^{317}+1)X_1(D)+(D^{125}+D^{103}+1)X_2(D)+)D^{95}+D^{22}+1)P(D)=0 \quad \text{(Equation 45-2)}$$

$$A_{X1,3}(D)X_1(D)+A_{X2,3}(D)X_2(D)+B_3(D)P(D)=(D^{346}+D^{86}+1)X_1(D)+(D^{319}+D^{290}+1)X_2(D)+)D^{88}+D^{26}+1)P(D)=0 \quad \text{(Equation 45-3)}$$

Coding rate R=3/4:

[46]

$$A_{X1,1}(D)+A_{X2,1}(D)+(D)X_2(D)+A_{X3,1}(D)X_3(D)+B_1(D)P(D)=(D^{286}+D^{164}+1)X_1(D)+(D^{385}+D^{242}+1)X_2(D)+(D^{343}+D^{284}+1)X_3(D)+(D^{92}+D^7+1)P(D)_0 \quad \text{(Equation 46-1)}$$

$$A_{X1,2}(D)X_1(D)+A_{X2,2}(D)X_2(D)+A_{X3,2}(D)X_3(D)+B_2(D)P(D)=(D^{370}+D^{317}+1)X_1(D)+(D^{125}+D^{103}+1)X_2(D)+(D^{259}+D^{14}+1)X_3(D)+(D^{95}+D^{22}+1)P(D)_0 \quad \text{(Equation 46-2)}$$

$$A_{X1,3}(D)X_1(D)+A_{X2,3}(D)X_2(D)+A_{X3,3}(D)X_3(D)+B_3(D)P(D)=(D^{346}+D^{86}+1)X_1(D)+(D^{319}+D^{290}+1)X_2(D)+(D^{145}+D^{11}+1)X_3(D)+(D^{88}+D^{26}+1)P(D)_0 \quad \text{(Equation 46-3)}$$

Coding rate R=4/5:

[47]

$$A_{X1,1}(D)X_1(D)+A_{X2,1}(D)X_2(D)+A_{X3,1}(D)X_3(D)+A_{X4,1}(D)X_4(D)+B_1(D)P(D)=(D^{286}+D^{164}+1)X_1(D)+(D^{385}+D^{242}+1)X_2(D)+(D^{343}+D^{284}+1)X_3(D)+(D^{283}+D^{68}+1)X_4(D)+(D^{92}+D^7+1)P(D)=0 \quad \text{(Equation 47-1)}$$

$$A_{X1,2}(D)X_1(D)+A_{X2,2}(D)X_2(D)+A_{X3,2}(D)X_3(D)+A_{X4,2}(D)X_4(D)+B_2(D)P(D)=(D^{370}+D^{317}+1)X_1(D)+(D^{125}+D^{103}+1)X_2(D)+(D^{259}+D^{14}+1)X_3(D)+(D^{256}+D^{188}+1)X_4(D)+(D^{95}+D^{22}+1)P(D)=0 \quad \text{(Equation 47-2)}$$

$$A_{X1,3}(D)X_1(D)+A_{X2,3}(D)X_2(D)+A_{X3,3}(D)X_3(D)+A_{X4,3}(D)X_4(D)+B_3(D)P(D)=(D^{346}+D^{86}+1)X_1(D)+(D^{319}+D^{290}+1)X_2(D)+(D^{145}+D^{11}+1)X_3(D)+(D^{287}+D^{73}+1)X_4(D)+(D^{88}+D^{26}+1)P(D)=0 \quad \text{(Equation 47-3)}$$

Since the parity check polynomial of the above LDPC-CC satisfies the conditions described in Embodiment 2, it is possible to realize the sharing of encoder and decoder circuits.

When the parity check polynomials of the LDPC-CC shown in equation 44-i, equation 45-i, equation 46-i and equation 47-i (i=1, 2, 3) are used, it has been confirmed that the termination number required varies depending on the number of bits of data (information) X (hereinafter referred to as "information size") as shown in FIG. 21. Here, the termination number refers to the number of parity bits generated by virtual known information bit "0" after performing the above-described information-zero-termination and is the number of redundant bits actually transmitted. In FIG. 21, Real R (effective coding rate) represents a coding rate when the termination sequence made up of redundant bits is taken into consideration.

The following is another example of parity check polynomial of an LDPC-CC of a time varying period of 3 that satisfies the conditions of one of #Xk1 to #Xk14 and one of #P1 to #P14.

Coding rate R=1/2:

[48]

$$A_{X1,1}(D)X_1(D)+B_1(D)P(D)=(D^{241}+D^{185}1)S_1(D)+\\(D^{215}+D^{145}+1)P(D)=0 \quad \text{(Equation 48-1)}$$

$$A_{X1,2}(D)X_1(D)+B_2(D)P(D)=(D^{160}+D^{62}1)X_1(D)+\\(D^{206}+D^{127}+1)P(D)=0 \quad \text{(Equation 48-2)}$$

$$A_{X1,3}(D)X_1(D)+B_3(D)P(D)=(D^{196}+D^{143}1)X_1(D)+\\(D^{211}+D^{119}+1)P(D)=0 \quad \text{(Equation 48-3)}$$

Coding rate R=2/3:

[49]

$$A_{X1,1}(D)X_1(D)+A_{X2,1}(D)X_2(D)+B_1(D)P(D)=(D^{214}+\\D^{185}+1)X_1(D)+(D^{194}+D^{67}+1)X_2(D)+(D^{215}+\\D^{145}+1)P(D)=0 \quad \text{(Equation 49-1)}$$

$$A_{X1,2}(D)X_1(D)+A_{X2,2}(D)X_2(D)+B_2(D)P(D)=(D^{160}+\\D^{62}+1)X_1(D)+(D^{226}+D^{209}+1)X_2(D)+(D^{206}+\\D^{127}+1)P(D)=0 \quad \text{(Equation 49-2)}$$

$$A_{X1,3}(D)X_1(D)+A_{X2,3}(D)X_2(D)+B_3(D)P(D)=(D^{196}+\\D^{143}+1)X_1(D)+(D^{115}+D^{104}+1)X_2(D)+(D^{211}+\\D^{119}+1)P(D)=0 \quad \text{(Equation 49-3)}$$

Coding rate R=3/4:

[50]

$$A_{X1,1}(D)X_1(D)+A_{X2,1}(D)X_2(D)+A_{X3,1}(D)X_3+B_1(D)P\\(D)=(D^{214}+D^{185}+1)X_1(D)+(D^{194}+D^{67}+1)X_2(D)+\\(D^{196}+D^{68}+1)X_3(D)+(D^{215}+D^{145}+1)P(D)=0 \quad \text{(Equation 50-1)}$$

$$A_{X1,2}(D)X_1(D)+A_{X2,2}(D)X_2(D)+A_{X3,2}(D)X_3+B_2(D)P\\(D)=(D^{160}+D^{62}+1)X_1(D)+(D^{226}+D^{209}+1)X_2(D)+\\(D^{98}+D^{37}+1)X_3(D)+(D^{206}+D^{127}+1)P(D)=0 \quad \text{(Equation 50-2)}$$

$$A_{X1,3}(D)X_1(D)+A_{X2,3}(D)X_2(D)+A_{X3,3}(D)X_3+B_3(D)P\\(D)=(D^{196}+D^{143}+1)X_1(D)+(D^{115}+D^{104}+1)X_2\\(D)+(D^{176}+D^{136}+1)X_3(D)+(D^{211}+D^{119}+1)P(D)\\=0 \quad \text{(Equation 50-3)}$$

Coding rate R=4/5:

[51]

$$A_{X1,1}(D)X_1(D)+A_{X2,1}(D)X_2(D)+A_{X3,1}(D)X_3(D)+A_{X4,1}\\(D)X_4(D)+B_1(D)P(D)=(D^{214}+D^{185}+1)X_1(D)+\\(D^{194}+D^{67}+1)X_2(D)+(D^{196}+D^{68}+1)X_3(D)+\\(D^{217}+D^{122}+1)X_4(D)+(D^{215}+D^{145}+1)P(D)=0 \quad \text{(Equation 51-1)}$$

$$A_{X1,2}(D)X_1(D)+A_{X2,2}(D)X_2(D)+A_{X3,2}(D)X_3(D)+A_{X4,2}\\(D)X_4(D)+B_2(D)P(D)=(D^{160}+D^{62}+1)X_1(D)+\\(D^{226}+D^{209}+1)X_2(D)+(D^{98}+D^{37}+1)X_3(D)+(D^{71}+\\D^{34}+1)X_4(D)+(D^{206}+D^{127}+1)P(D)=0 \quad \text{(Equation 51-2)}$$

$$A_{X1,3}(D)X_1(D)+A_{X2,3}(D)X_2(D)+A_{X3,3}(D)X_3(D)+A_{X4,3}\\(D)X_4(D)+B_3(D)P(D)=(D^{195}+D^{143}+1)X_1(D)+\\(D^{115}+D^{104}+1)X_2(D)+(D^{176}+D^{136}+1)X_3(D)+\\(D^{212}+D^{187}+1)X_4(D)+(D^{211}+D^{119}+1)P(D)=0 \quad \text{(Equation 51-3)}$$

FIG. 22 shows an example of termination number necessary to use parity check polynomials of the LDPC-CC shown in equation 48-i, equation 49-i, equation 50-i and equation 51-i (i=1, 2, 3).

FIG. 23 shows the relationship between information size Is and termination number me shown in equation 48-i, equation 49-i, equation 50-i and equation 51-i (i=1, 2, 3) at each coding rate. Assuming the number of virtual known information bits ("0") inserted to create a termination sequence is $m_z$, the following relationship holds true between $m_t$ and $m_z$ when the coding rate is (n−1)/n.

[52]

$$m_z=(n-1)m_t \quad (k=0) \quad \text{(Equation 52-1)}$$

$$m_z(n=1)m_t+(n-1)-k \quad (k\neq 0) \quad \text{(Equation 52-2)}$$

where $k=I_s\%(n-1)$.

Embodiment 5

The present embodiment will describe a communication apparatus and communication method when using the LDPC-CC with good characteristics described in Embodiment 4, which can prevent the error correction capability from deteriorating and prevent information transmission efficiency from deteriorating.

It has been confirmed from FIG. 21 and FIG. 22 that the termination number necessary to perform information-zero-termination varies depending on the information size. Therefore, to uniformly fix the termination number irrespective of the information size and prevent error correction capability from deteriorating, the termination number may have to be set to a large value, and therefore Real R (effective coding rate) may deteriorate and information transmission efficiency may deteriorate.

Thus, the present embodiment will describe a communication apparatus and communication method that change the termination number transmitted as redundant bits according to the information size. It is thereby possible to prevent error correction capability from deteriorating and prevent information transmission efficiency from deteriorating.

Figure 24:
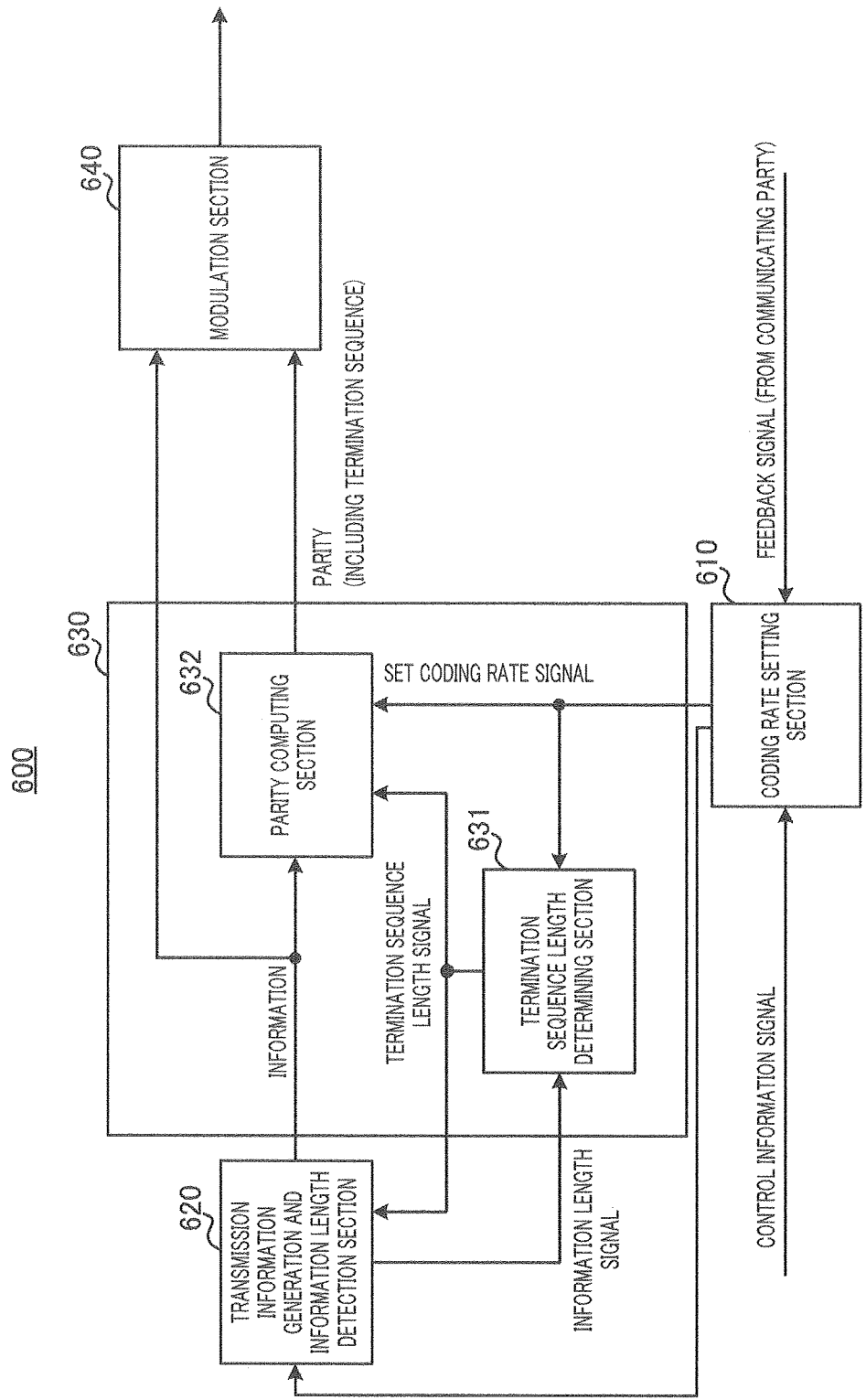
FIG. 24 is a block diagram showing the main configuration of a communication apparatus having an encoder according to Embodiment 5 of the present invention.

FIG. 24 is a block diagram showing the main configuration of communication apparatus 600 according to the present embodiment.

Coding rate setting section 610 receives a control information signal including information of a coding rate set by communication apparatus 600 or a feedback signal transmitted from the communication apparatus which is the communicating party as input. When the control information signal is inputted, coding rate setting section 610 sets a coding rate from the information of coding rates included in the control information signal.

Upon receiving a feedback signal, coding rate setting section 610 acquires information of the communication situation between the communication apparatus and the communication apparatus which is the communicating party included in the feedback signal, for example, information that allows communication quality such as bit error rate, packet error rate, frame error rate, reception electric field strength to be estimated, and sets the coding rate based on the information of the communication situation between the communication apparatus and the communication apparatus which is the communicating party. Coding rate setting section 610 includes the information of the set coding rate in the set coding rate signal and outputs the set coding rate signal to termination sequence length determining section 631 and parity computing section 632 in encoder 630. Furthermore, coding rate setting section 610 outputs the information of the set coding rate to transmission information generation and information length detection section 620.

Transmission information generation and information length detection section 620 generates or acquires transmission data (information) and outputs an information sequence made up of transmission data (information) to parity computing section 632. Furthermore, transmission information generation and information length detection section 620 detects the sequence length of transmission data (information) (hereinafter referred to as "information length"), that is, information size, includes the information of the detected information size in the information length signal and outputs an information length signal to termination sequence length determining section 631.

Furthermore, transmission information generation and information length detection section 620 adds a known information sequence made up of known information bits (e.g. "0") necessary to generate redundant bits corresponding to the termination sequence length reported from termination sequence length determining section 631 at the rearmost end of the information sequence.

Termination sequence length determining section 631 determines the termination sequence length (termination number) according to the information size indicated by an information length signal and the coding rate indicated by the set coding rate signal. A specific method of determining the termination sequence length will be described later. Termination sequence length determining section 631 includes the determined termination sequence length in the termination sequence length signal and outputs the termination sequence length signal to transmission information generation and information length detection section 620 and parity computing section 632.

Parity computing section 632 calculates parity corresponding to the information sequence and known information sequence and outputs the parity obtained to modulation section 640.

Modulation section 640 applies modulation processing to the information sequence and parity (including the termination sequence).

Although there is a description "information length signal" in FIG. 24, the signal is not limited to this, but any signal may be adopted if it is information that serves as an index to control the termination sequence length. For example, it may be possible to calculate a frame length of the transmission signal from information (length information) on the sum of the number of pieces of information except termination and parity, the number of pieces of information and modulation scheme, and designate the frame length a substitute for the information length signal.

Figure 25:
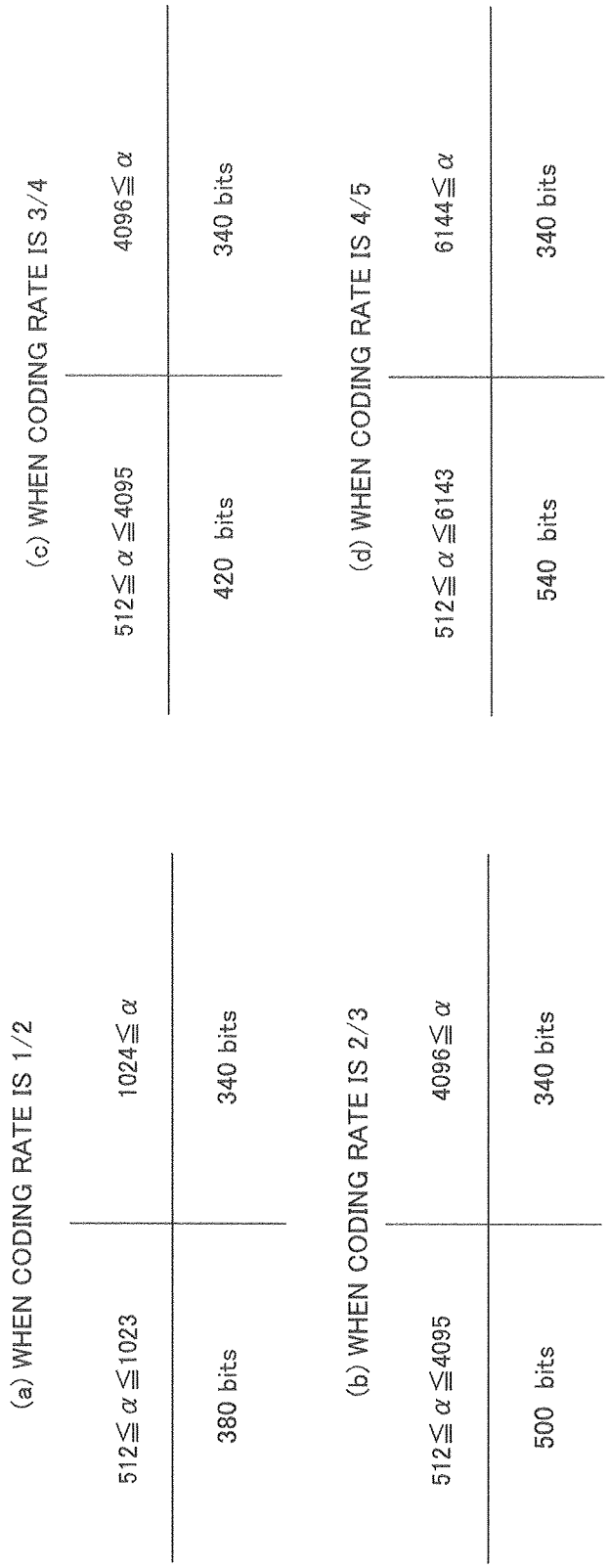
FIG. 25 is a diagram illustrating a method of determining a termination sequence length.

Next, a method of determining the termination sequence length by termination sequence length determining section 631 will be described using FIG. 25. FIG. 25 shows an example case where the termination sequence length is switched in two stages based on the information size and each coding rate. FIG. 25 presupposes that the minimum information size of communication apparatus 600 is set to 512 bits. However, the minimum size need not always be set.

In FIG. 25, a is the information length of transmission data (information) that should be transmitted. For example, when the coding rate is 1/2, termination sequence length determining section 631 sets the termination sequence length to 380 bits when $512 \leq \alpha \leq 1023$ and termination sequence length determining section 631 sets the termination sequence length to 340 bits when $1024 \leq \alpha$. When termination sequence length determining section 631 sets the termination sequence length based on information length a of transmission data (information) in this way, the termination sequence length can be set to a sequence length that does not cause deterioration of error correction capability and can prevent information transmission efficiency from deteriorating.

Figure 26:
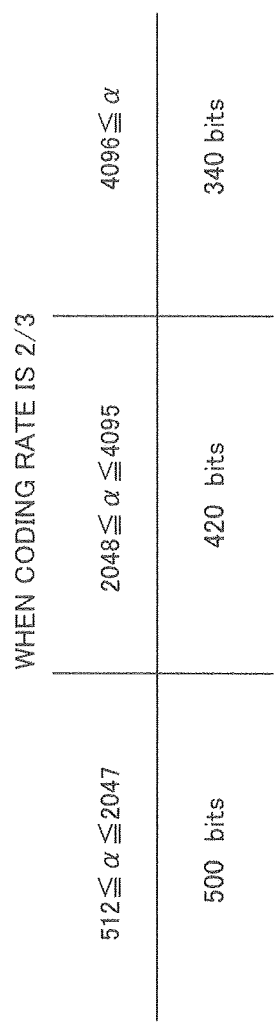
FIG. 26 is a diagram illustrating a method of determining a termination sequence length.

An example case has been described above where the termination sequence length is switched in two stages at each coding rate, but the present invention is not limited to this, and the termination sequence length may be switched in three stage as shown in FIG. 26 or more stages. Thus, by switching the termination sequence length (termination number) in a plurality of stages based on the information length (information size), it is possible to set the termination sequence length to a sequence length that does not cause deterioration of error correction capability and can prevent information transmission efficiency from deteriorating.

Figure 27:
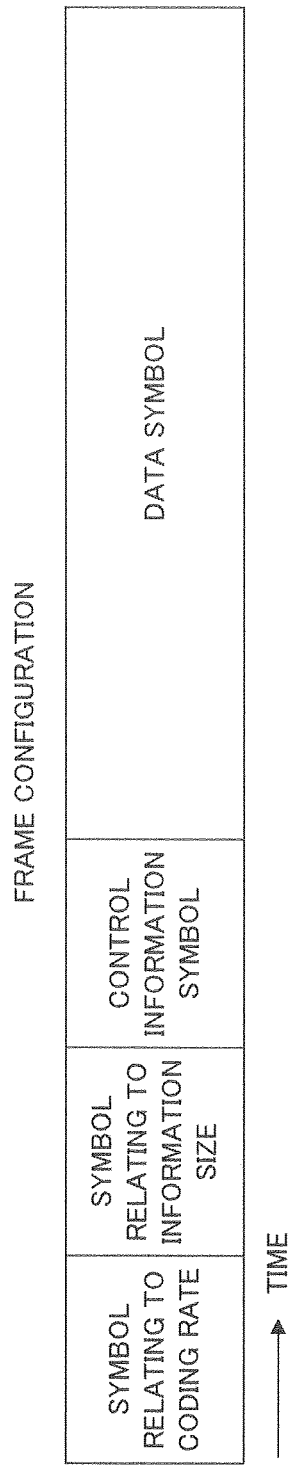
FIG. 27 shows an example of a transmission format.

Communication apparatus 600 includes the information of the coding rate in a symbol relating to the coding rate using a transmission format as shown, for example, in FIG. 27 and thereby reports the coding rate used by encoder 630 to the communication apparatus which is the communicating party. Furthermore, communication apparatus 600 includes information of the information length (information size) in a symbol relating to the information size and thereby reports the information of the information length (information size) to the communication apparatus which is the communicating party. Furthermore, communication apparatus 600 includes the modulation scheme, transmission method or information for identifying the communicating party in the control information symbols and reports the symbols to the communication apparatus which is the communicating party. Furthermore, communication apparatus 600 includes the information sequence and parity in data symbols and reports the data symbols to the communication apparatus which is the communicating party.

Figure 28:
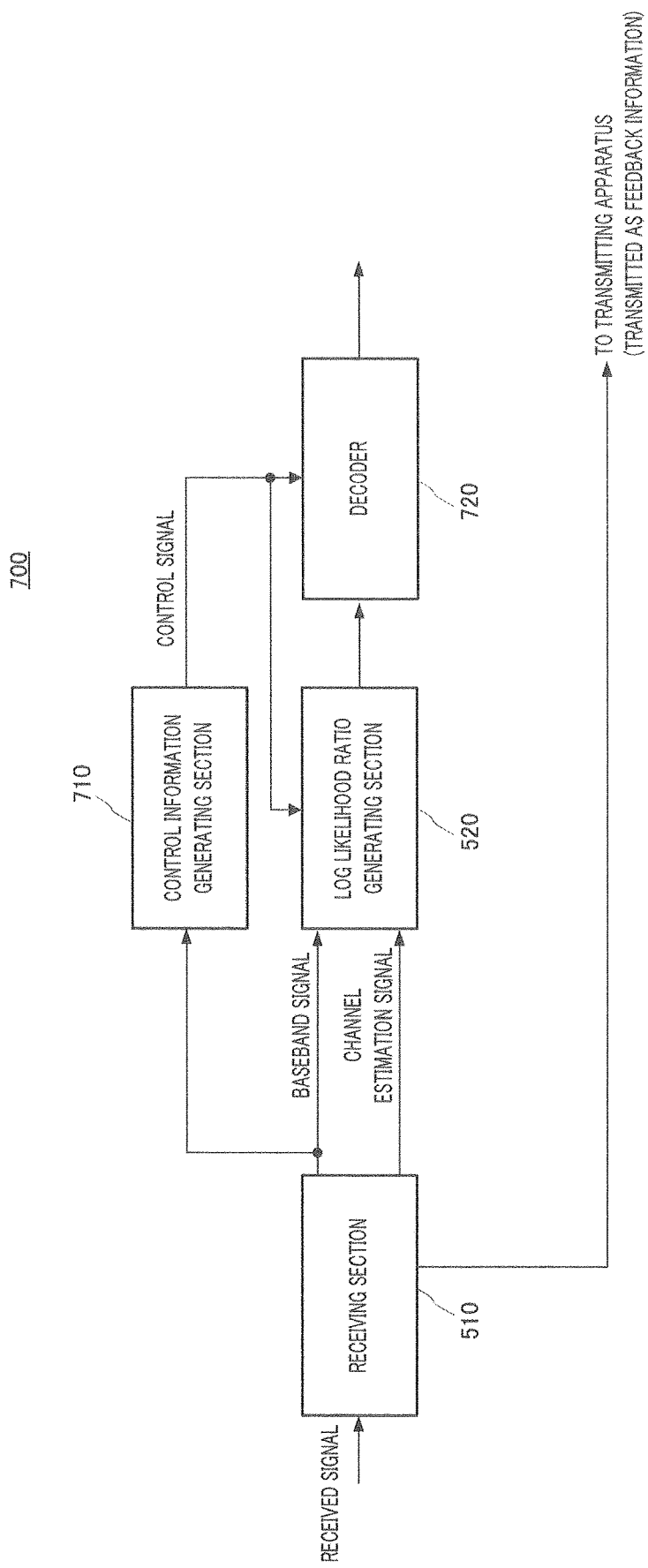
FIG. 28 is a block diagram showing the main configuration of a communication apparatus having a decoder according to Embodiment 5.

FIG. 28 shows a configuration example of communication apparatus 700 which is the communicating party communicating with communication apparatus 600. Components of communication apparatus 700 in FIG. 28 which are common to those of FIG. 20 are assigned the same reference numerals as those in FIG. 20 and descriptions thereof will be omitted. Communication apparatus 700 in FIG. 28 is provided with control information generating section 710 and decoder 720 instead of control information generating section 530 and decoder 300 of communication apparatus 500 in FIG. 20.

Control information generating section 710 extracts information of the coding rate from a symbol relating the coding rate obtained by demodulating (and decoding) a baseband signal. Furthermore, control information generating section 710 extracts information of the information length (information size) from a symbol relating to the information size obtained by demodulating (and decoding) the baseband signal. Furthermore, control information generating section 710 extracts the modulation scheme, transmission method or information for identifying the communicating party from the control information symbols. Control information generating section 710 outputs a control signal including the information of the extracted coding rate and the information of the information length (information size) to log likelihood ratio generating section 520 and decoder 720.

Decoder 720 stores a table showing the relationship between the information size and termination sequence length at each coding rate shown in FIG. 25 or FIG. 26, and determines the termination sequence length included in data symbols from this table, information of the coding rate and information of the information length (information size). Decoder 720 performs BP decoding based on the coding rate and the determined termination sequence length. This allows communication apparatus 700 to perform decoding with high error correction capability.

Figure 29:
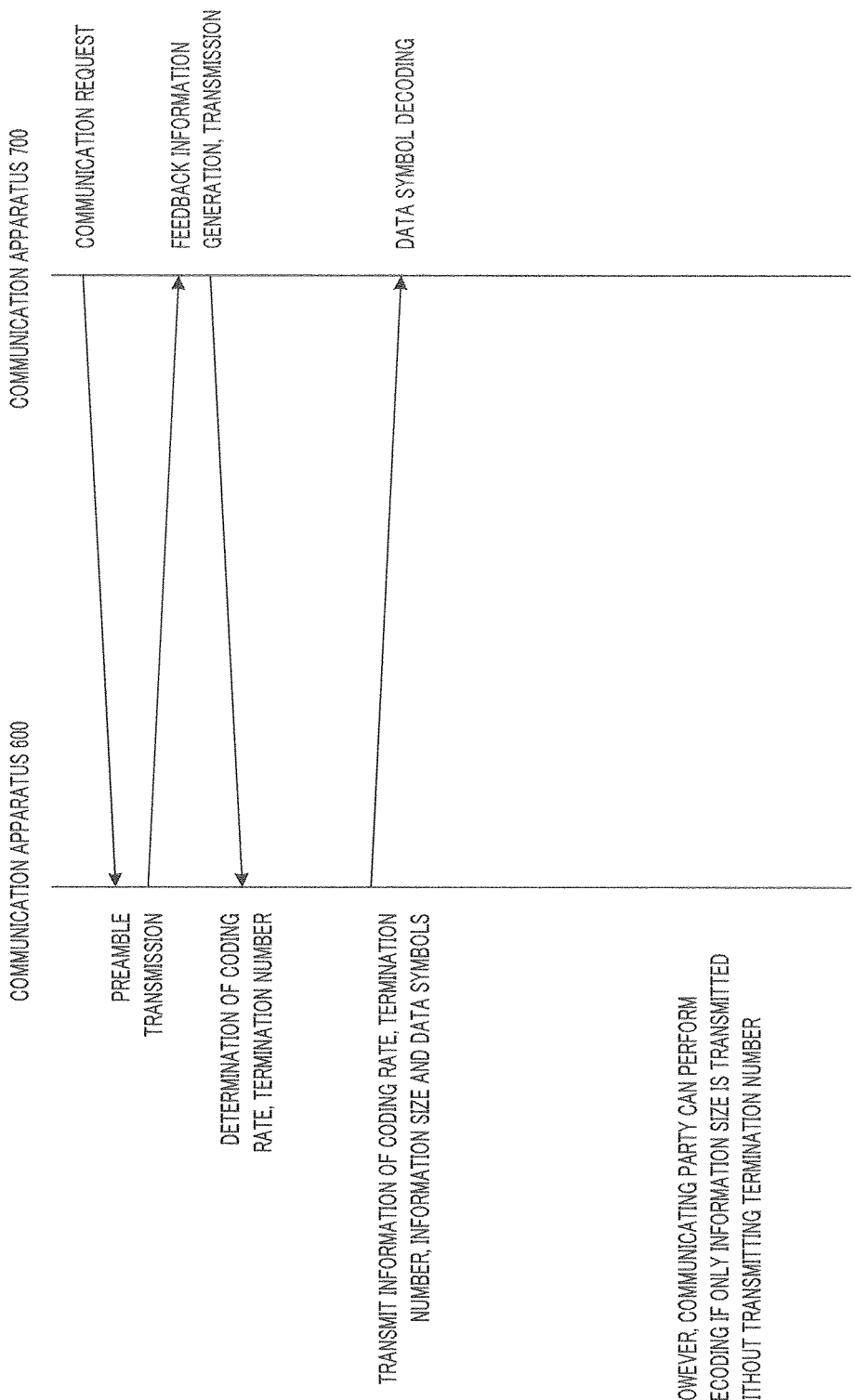
FIG. 29 is a diagram showing an example of information flow between the communication apparatus having an encoder and the communication apparatus having a decoder.
Figure 30:
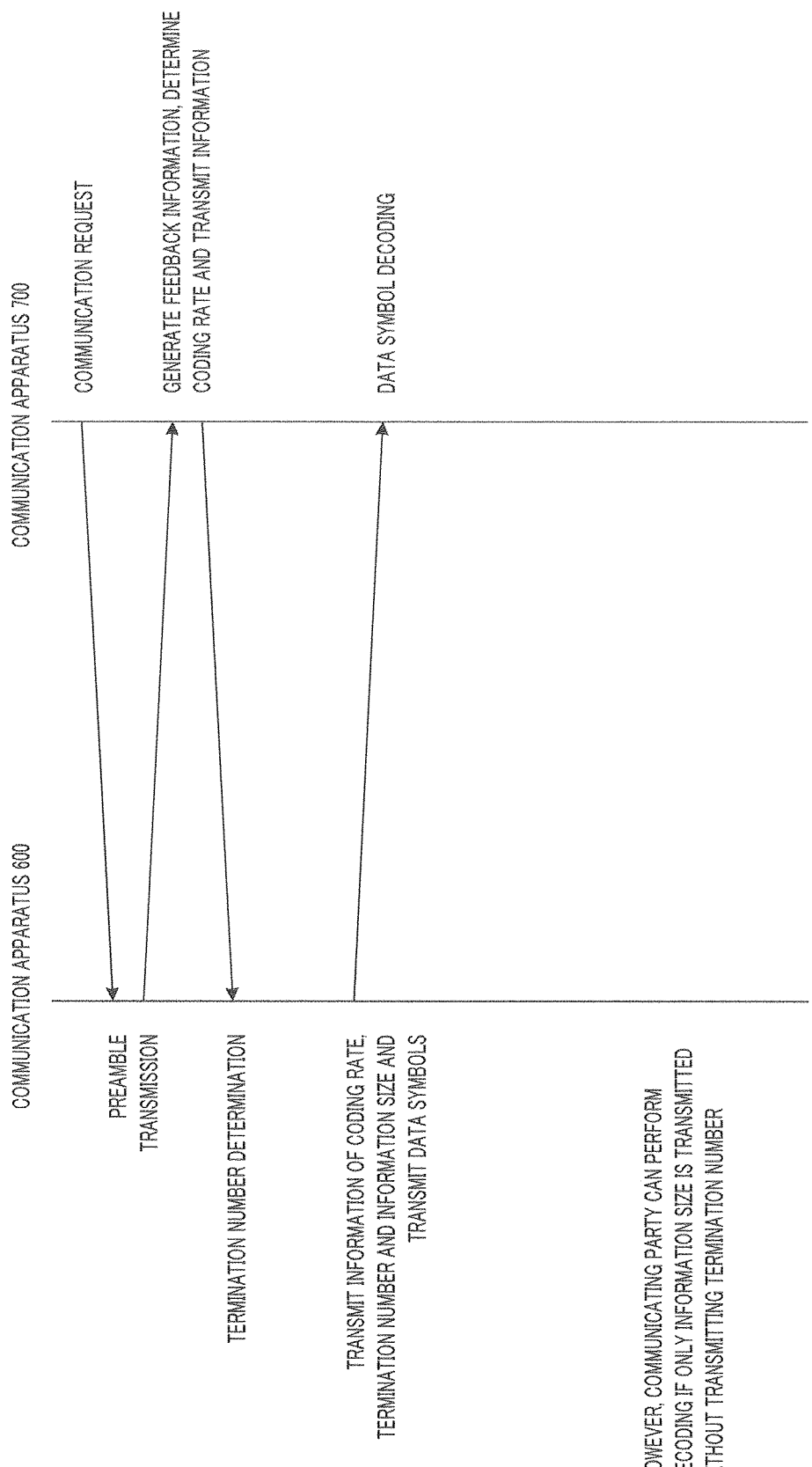
FIG. 30 is a diagram showing an example of information flow between the communication apparatus having an encoder and the communication apparatus having a decoder.

FIG. 29 and FIG. 30 are diagrams showing an example of information flow between communication apparatus 600 and communication apparatus 700. FIG. 29 is different from FIG. 30 as to which of communication apparatus 600 and communication apparatus 700 sets the coding rate. To be more specific, FIG. 29 shows the information flow when communication apparatus 600 determines the coding rate and FIG. 30 shows the information flow when communication apparatus 700 determines the coding rate.

As described so far, in the present embodiment, termination sequence length determining section 631 determines the sequence length of a termination sequence transmitted by being added at the rear end of an information sequence according to the information length (information size) and coding rate and parity computing section 632 applies LDPC-CC coding to the information sequence and a known information sequence necessary to generate a termination sequence corresponding to the determined termination sequence length and computes a parity sequence. This makes it possible to prevent deterioration of error correction capability and prevent deterioration of information transmission efficiency.

Embodiment 6

A case has been described in Embodiment 5 where a termination sequence length added at the rear end of an information sequence is determined (changed) according to the information length (information size) and coding rate. This makes it possible to prevent deterioration of error correction capability and avoid deterioration of information transmission efficiency.

The present embodiment will describe a case where a limit is set to available coding rates when the termination sequence length is changed according to the information length (information size) as in the case of Embodiment 5. This makes it possible to avoid deterioration of error correction capability.

As in the case of FIG. 21, FIG. 31 shows the relationship between the termination number and coding rate necessary to use parity check polynomials of the LDPC-CCs shown in equation 44-i, equation 45-i, equation 46-i and equation 47-i (i=1, 2, 3). As is clear from FIG. 31, when the information size is 512 bits, 1024 bits or 2048 bits, if the effective coding rate (Real R) of a coding rate of 3/4 is compared to the effective coding rate of a coding rate of 4/5, there is no significant difference between the two. When, for example, the information size is 1024 bits, the effective coding rate is 0.5735 for the coding rate of 3/4, while the effective coding rate is 0.5626 for the coding rate of 4/5, the difference being as small as 0.01. Furthermore, the effective coding rate of coding rate 3/4 is greater than the effective coding rate of coding rate 4/5, that is, the magnitude of the effective coding rate is inverted. Therefore, depending on the information size, use of coding rate 3/4 may not be suited to obtaining high error correction capability or improving transmission efficiency.

FIG. 32A, FIG. 32B, FIG. 32C and FIG. 32D show bit error rate (BER)/block error rate (BLER) characteristics when the termination sequences of the sequence lengths shown in FIG. 31 are added to information sequences having information sizes of 512 bits, 1024 bits, 2048 bits and 4096 bits. In FIG. 32A, FIG. 32B, FIG. 32C and FIG. 32D, the horizontal axis shows an SNR (Signal-to-Noise power ratio) [dB] and the vertical axis shows BER/BLER characteristics, and solid lines show bit error rate characteristics and broken lines show block error rate characteristics. Furthermore, in FIG. 32A, FIG. 32B, FIG. 32C and FIG. 32D, TMN represents a termination number.

As is clear from FIG. 32A, FIG. 32B, FIG. 32C and FIG. 32D, when the termination sequence is taken into consideration, the BER/BLER characteristics of coding rate R=3/4 are better than the BER/BLER characteristics of coding rate R=4/5 no matter what the information size may be.

From these two aspects, in order to realize improvement of error correction capability and improvement of information transmission efficiency simultaneously, coding rate R=4/5 is not supported when the information size is less than 4096 bits, that is, only coding rates R=1/2, 2/3 and 3/4 are supported when the information size is less than 4096 bits and coding rates R=1/2, 2/3, 3/4 and 4/5 are supported when the information size is equal to or greater than 4096 bits, and for this reason, coding rate R=4/5 having poorer transmission efficiency than coding rate R=3/4 is no longer used when the information size is less than 4096 bits, and it is thereby possible to realize improvement of error correction capability and improvement of information transmission efficiency simultaneously.

Furthermore, it is clear from FIG. 32A, FIG. 32B, FIG. 32C and FIG. 32D that the BER/BLER characteristics (see FIG. 32A) when the information size is 512 bits are notably better than the BER/BLER characteristics in other information sizes. When, for example, the information size is 512 bits, the BER characteristics of coding rate 2/3 are substantially the same as the BER/BLER characteristics of coding rate 1/2 when the information size is 1024 bits, and when the information size is 512 bits, the characteristics actually may not have to be as better as the BER/BLER characteristics of coding rate 1/2. Since the propagation efficiency decreases as the coding rate decreases, when, for example, the information size is 512 bits, a method of not supporting coding rate 1/2 may also be adopted taking these points into account.

FIG. 33 is a table of correspondence between information sizes and supported coding rates. As shown in FIG. 33, some coding rates are not supported for certain information sizes. If supported coding rates are constant irrespective of the information size, communication apparatus 600 and communication apparatus 700 can communicate with each other in both cases of FIG. 29 and FIG. 30. However, as shown in FIG. 33, since some coding rates are not supported for certain information sizes in the present embodiment, the designated coding rates need to be adjusted. The communication apparatus according to the present embodiment will be described below.

Figure 34:
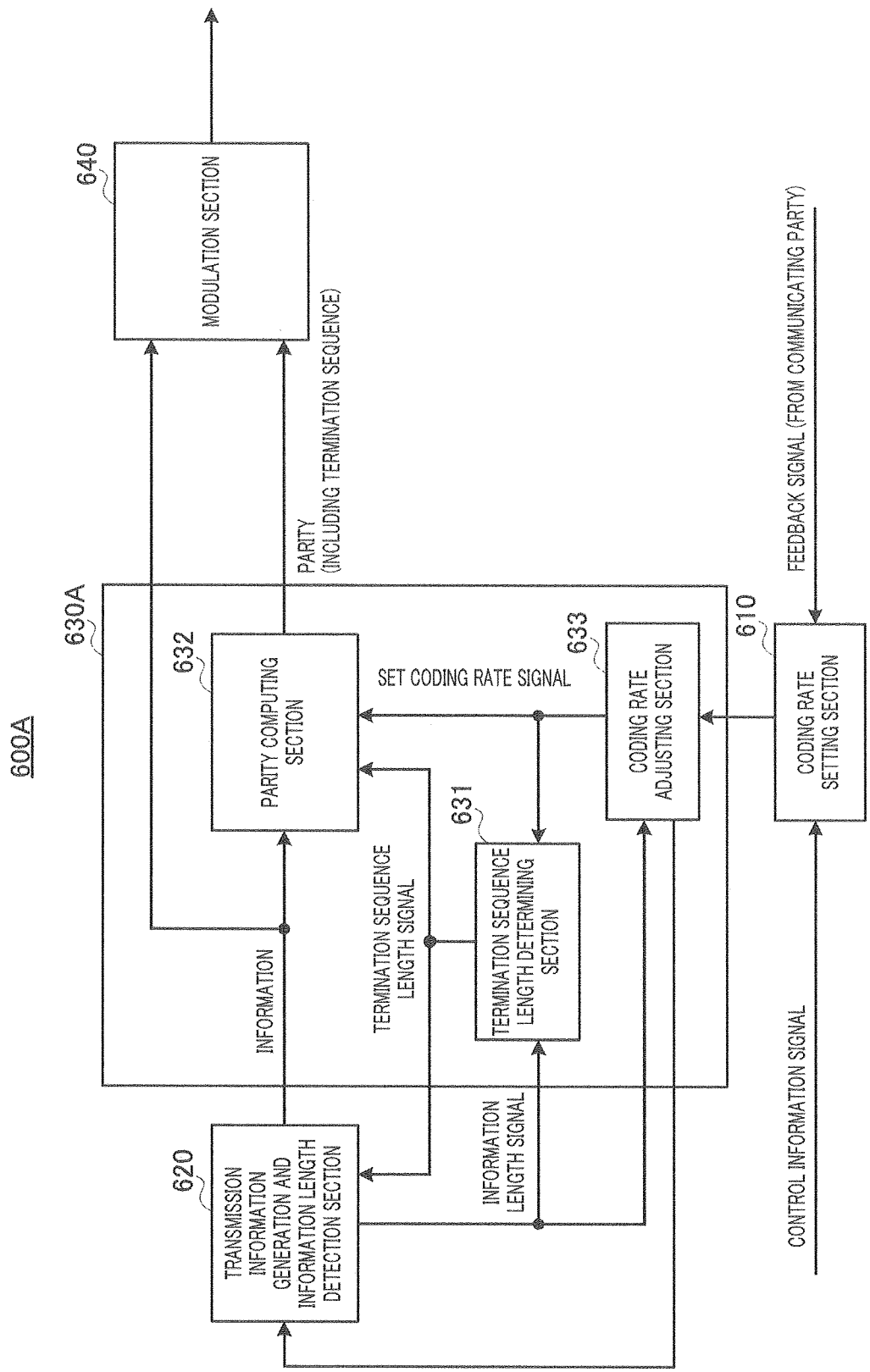
FIG. 34 is a block diagram showing the main configuration of a communication apparatus having an encoder according to Embodiment 6 of the present invention.

FIG. 34 is a block diagram showing the main configuration of communication apparatus 600A according to the present embodiment. In communication apparatus 600A in FIG. 34, components common to those in FIG. 24 are assigned the same reference numerals as those in FIG. 24 and descriptions thereof will be omitted. Communication apparatus 600A in FIG. 34 is provided with encoder 630A instead of encoder 630 in FIG. 24. Encoder 630A adopts a configuration with coding rate adjusting section 633 added to encoder 630.

Figure 32A:
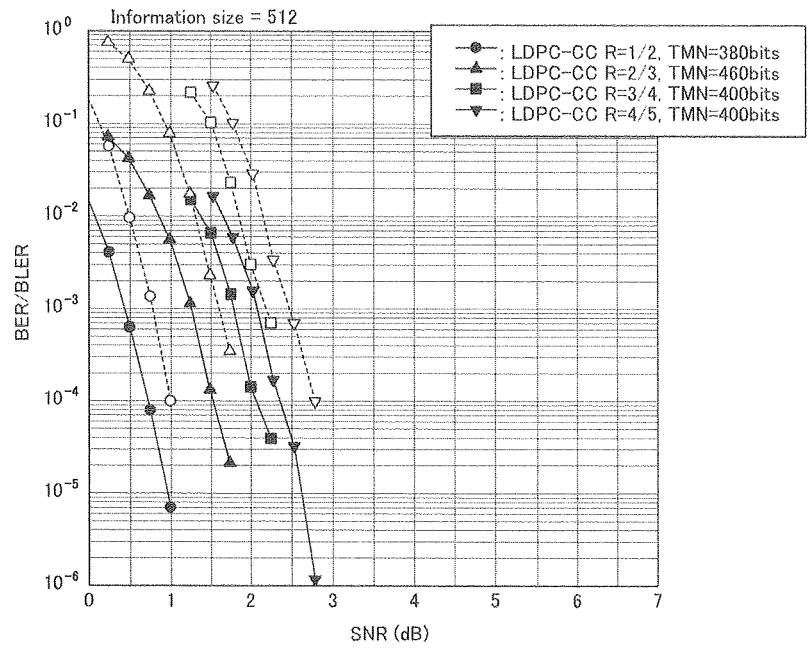
FIG. 32A is a diagram showing BER/BLER characteristics when a termination sequence is added to an information sequence having an information size of 512 bits.
Figure 32B:
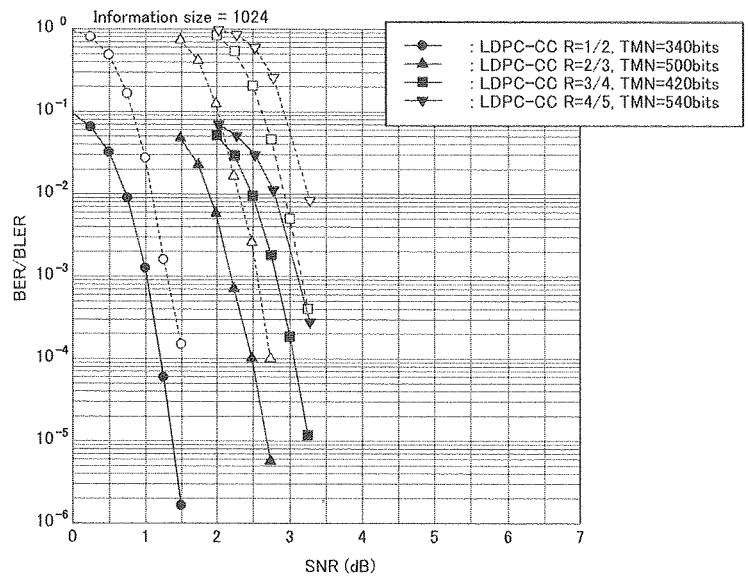
FIG. 32B is a diagram showing BER/BLER characteristics when a termination sequence is added to an information sequence having an information size of 1024 bits.
Figure 32C:
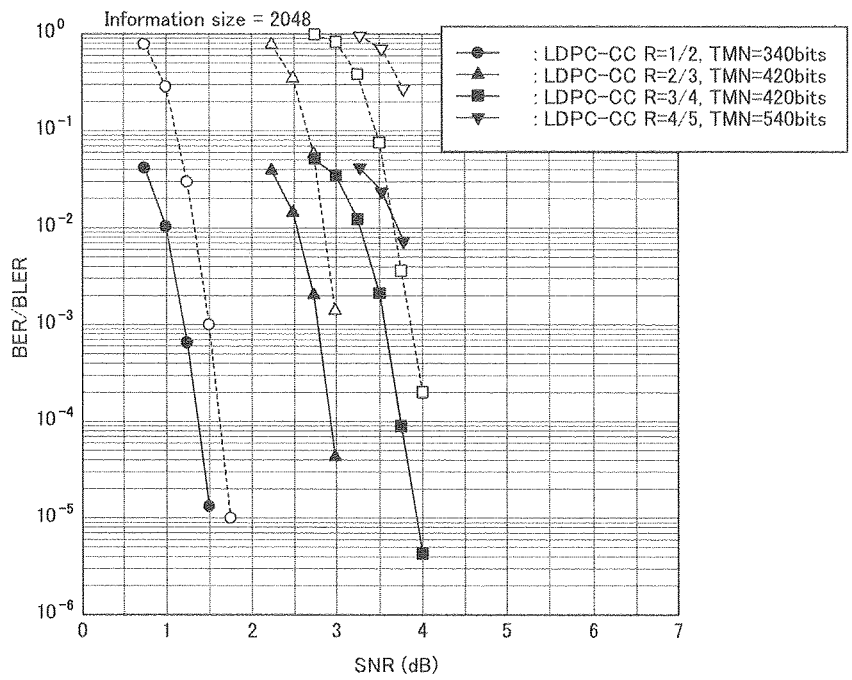
FIG. 32C is a diagram showing BER/BLER characteristics when a termination sequence is added to an information sequence having an information size of 2048 bits.
Figure 32D:
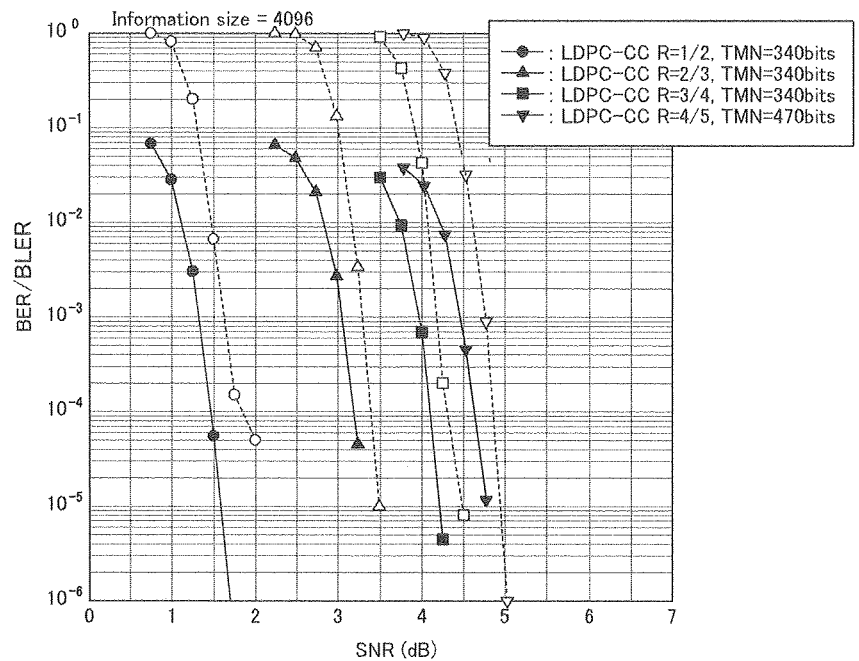
FIG. 32D is a diagram showing BER/BLER characteristics when a termination sequence is added to an information sequence having an information size of 4096 bits.

Coding rate adjusting section 633 adjusts a coding rate included in a set coding rate signal inputted from coding rate setting section 610 based on the information length (information size) included in the information length signal inputted from transmission information generation and information length detection section 620. To be more specific, coding rate adjusting section 633 stores the table of correspondence between information sizes and supported coding rates shown in FIG. 33 and adjusts the coding rate by checking the coding rate set based on a control information signal or feedback signal against the correspondence table. When, for example, the information length (information size) is 1024 bits and the set coding rate signal indicates a coding rate of 4/5, since a coding rate of 4/5 is not supported in the correspondence table, coding rate adjusting section 633 sets 3/4 which is the largest value among coding rates smaller than coding rate 4/5 as the coding rate. As shown in FIG. 31, when the information length (information size) is 1024 bits, Real R when the coding rate is 4/5 is 0.5626, which is smaller than Real R (0.5735) of coding rate 3/4, and as shown in FIG. 32B, coding rate 3/4 also has better BER/BLER characteristics. Therefore, when the information length (information size) is 1024, using coding rate 3/4 instead coding rate 4/5 makes it possible to prevent error correction capability from deteriorating and prevent information transmission efficiency from deteriorating.

In other words, when first coding rate (3/4)<second coding rate (4/5), if a first effective coding rate (0.5735) corresponding to the first coding rate (3/4) is equivalent to a second effective coding rate (0.5626) corresponding to the second coding rate (4/5) and if the second coding rate is designated, coding rate adjusting section 633 adjusts the coding rate to the first coding rate. This makes it possible to prevent error correction capability from deteriorating and prevent information transmission efficiency from deteriorating.

Furthermore, when, for example, the information length (information size) is 512 bits and the set coding rate signal indicates coding rate 1/2, since coding rate 1/2 is not supported in the correspondence table, coding rate adjusting section 633 sets 2/3 which is the smallest value among coding rates greater than coding rate 1/2 as the coding rate. As shown in FIG. 32A, since the BER/BLER characteristics at coding rate 1/2 are extremely good, setting the coding rate to 2/3 also makes it possible to prevent error correction capability from deteriorating and prevent information transmission efficiency from deteriorating.

In other words, when the first coding rate having extremely good BER/BLER characteristics is designated, coding rate adjusting section 633 adjusts the coding rate to the second coding rate which is greater than the first coding rate and can secure predetermined channel quality.

Thus, the present embodiment is designed to change the number of coding rates supported by communication apparatus 600A based on the information length (information size). For example, in the example shown in FIG. 33, communication apparatus 600A only supports two coding rates when the information length (information size) is less than 512 bits, supports three coding rates when the information length (information size) is equal to or greater than 512 bits and less than 4096 bits, and supports four coding rates when the information length (information size) is equal to or greater than 4096. By changing supported coding rates, it is possible to realize improvement of error correction capability and improvement of information transmission efficiency simultaneously.

As shown above, according to the present embodiment, coding rate adjusting section 633 changes the number of coding rates supported by communication apparatus 600A according to the information length (information size) and adjusts the coding rate to one of the supported coding rates. This makes it possible to prevent error correction capability from deteriorating and prevent information transmission efficiency from deteriorating.

Furthermore, communication apparatus 600A is designed to support coding rates of smaller values among coding rates of the same level of effective coding rates. Furthermore, communication apparatus 600A is also designed not to include coding rates of extremely good BER/BLER characteristics in the supported coding rates but to support only coding rates that allow predetermined channel quality to be secured. This makes it possible to secure predetermined channel quality and prevent deterioration of transmission efficiency at the same time.

As described above, by changing the number of coding rates supported according to the information length (information size), it is possible to realize improvement of error correction capability and improvement of information transmission efficiency simultaneously.

When the number of coding rates supported is changed according to the information length (information size), as shown in FIG. 29, if communication apparatus 600A adjusts the coding rate, sets the termination sequence length and transmits information of these coding rates and information of the information length (information size) (or information of termination sequence length) to communication apparatus 700 which is the communicating party simultaneously, communication apparatus 700 can perform decoding correctly.

The present embodiment may naturally be used together with Embodiment 5. That is, the termination number may be changed according to the coding rate and information size.

Figure 35:
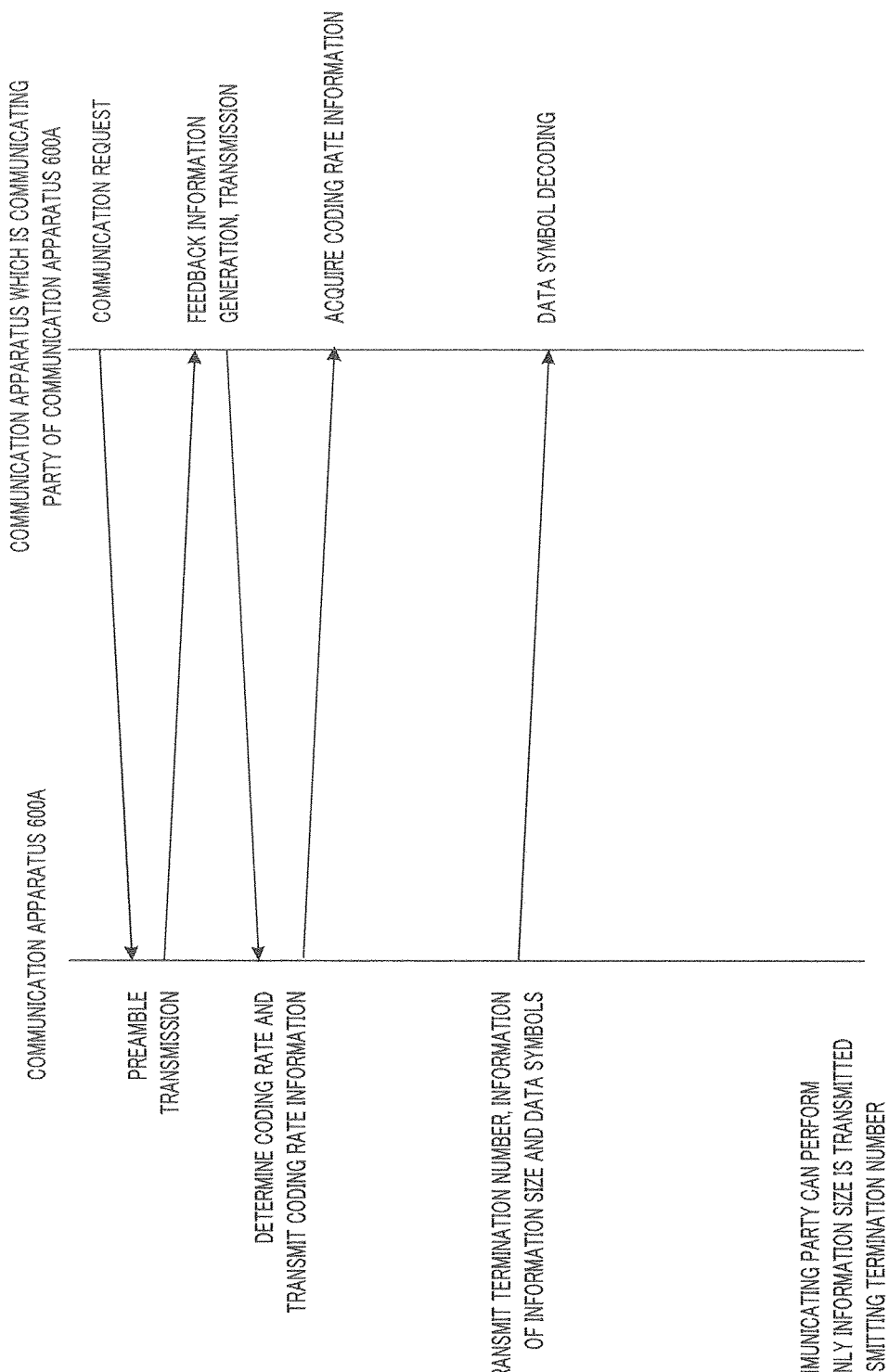
FIG. 35 is a diagram showing an example of information flow between the communication apparatus having an encoder and the communication apparatus having a decoder.
Figure 36:
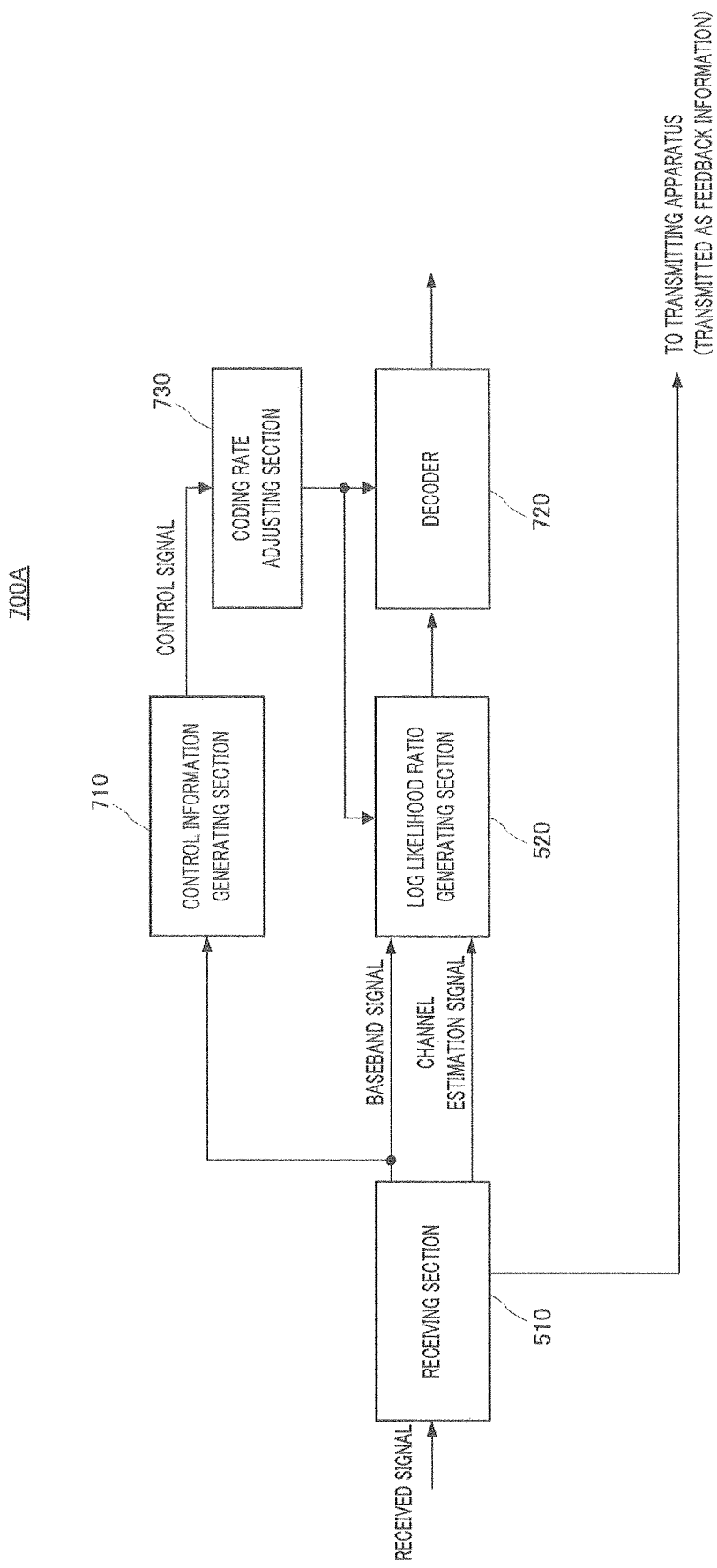
FIG. 36 is a block diagram showing the main configuration of a communication apparatus having a decoder according to Embodiment 6.

On the other hand, as shown in FIG. 30, if the communication apparatus which is the communicating party of communication apparatus 600 sets a coding rate before communication apparatus 600A determines an information length (information size) or if communication apparatus 600A sets a coding rate before communication apparatus 600A determines an information length (information size) as shown in FIG. 35, the communication apparatus which is the communicating party of communication apparatus 600A needs to adjust the coding rate based on the information length (information size). FIG. 36 is a block diagram showing the configuration of communication apparatus 700A in this case.

In communication apparatus 700A in FIG. 36, components common to those in FIG. 28 are assigned the same reference numerals and descriptions thereof will be omitted. Communication apparatus 700A in FIG. 36 adopts a configuration with coding rate adjusting section 730 added to communication apparatus 700 in FIG. 28.

A case will be described hereinafter where communication apparatus 600A supports coding rates 1/2, 2/3 and 3/4 when the information length (information size) is less than 4096 bits and supports coding rates 1/2, 2/3, 3/4 and 4/5 when the information length (information size) is 4097 bits.

At this time, it is assumed that the coding rate of an information sequence to transmit is determined to be 4/5 before the information length (information size) is determined and communication apparatus 600A and communication apparatus 700A share the information of this coding rate. When the information length (information size) is 512 bits, coding rate adjusting section 633 of communication apparatus 600A adjusts the coding rate to 3/4 as described above. If this rule is determined beforehand between communication apparatus 600A and communication apparatus 700A, communication apparatus 600A and communication apparatus 700A can communicate with each other correctly.

To be more specific, as in the case of coding rate adjusting section 633, coding rate adjusting section 730 receives a control signal including the information of the coding rate and information of the information length (information size) as input and adjusts the coding rate based on the information length (information size). For example, when the information length (information size) is 512 bits and the coding rate is 4/5, coding rate adjusting section 730 adjusts the coding rate to 3/4. This makes it possible to prevent error correction capability from deteriorating and prevent information transmission efficiency from deteriorating.

As another coding rate adjusting method, a method of fixing the termination number irrespective of coding rates can be considered. In the example in FIG. 21, when the information length (information size) is equal to or greater than 6144, the termination number is uniformly 340 bits. Therefore, when the information length (information size) is equal to or greater than 6144 bits, coding rate adjusting section 633 and coding rate adjusting section 730 may be adapted so as to fix the termination number irrespective of coding rates. Furthermore, when the information length (information size) is less than 6144, coding rate adjusting section 633 and coding rate adjusting section 730 may also be adapted so as to support each coding rate using another parity check polynomial to which a termination number of 340 bits is fitted. Alternatively, a completely different code may be used. For example, block codes may be used.

Embodiment 7

The above embodiments have described an LDPC-CC for which circuits supporting a plurality of coding rates equal to or greater than 1/2 can be shared between an encoder and a decoder. To be more specific, an LDPC-CC supporting a coding rate of (n−1)/n (n=2, 3, 4, 5) for which circuits can be shared has been described. The present embodiment will describe a method of supporting a coding rate of 1/3.

Figure 37:
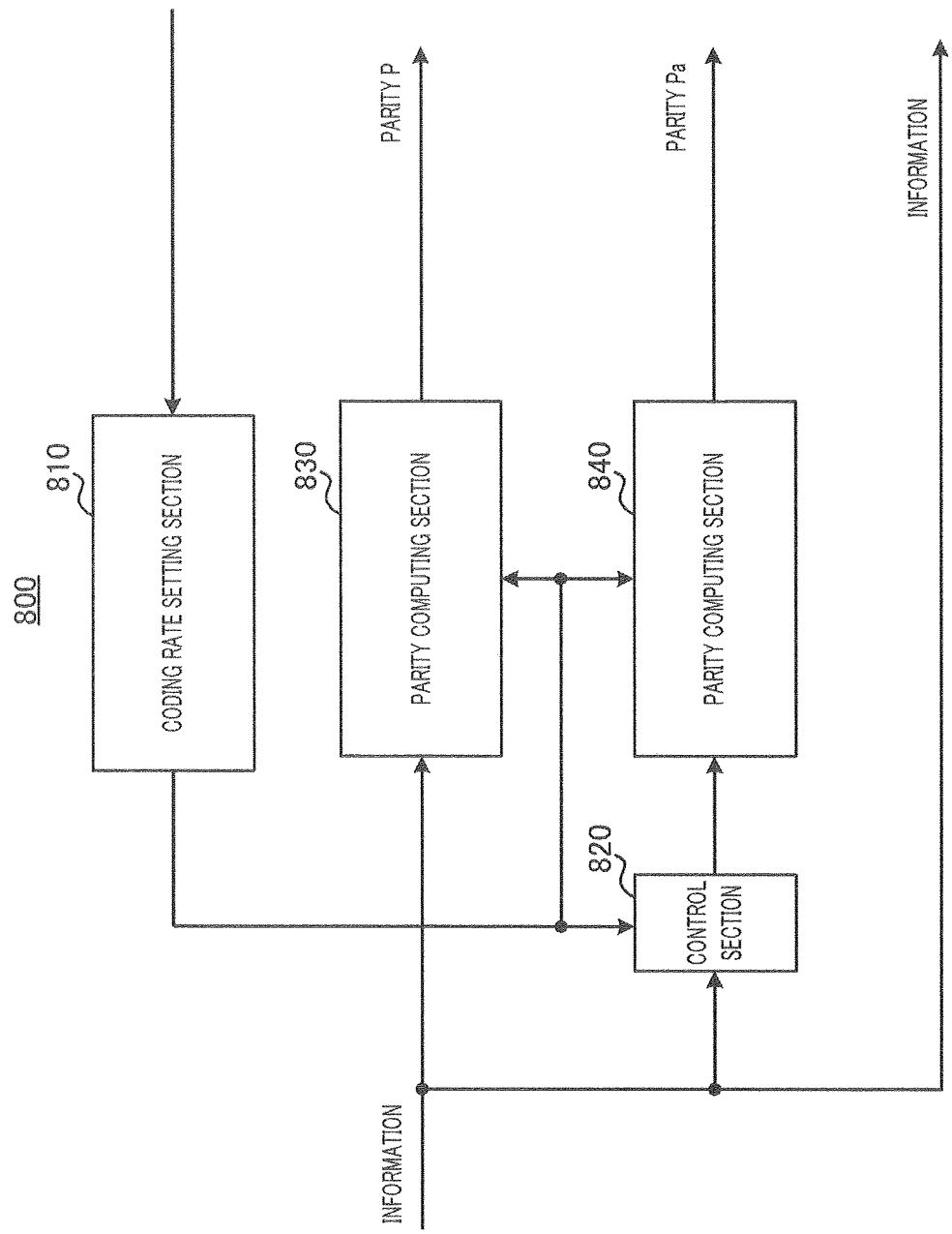
FIG. 37 is a block diagram showing the main configuration of an encoder according to Embodiment 7 of the present invention.

FIG. 37 is a block diagram showing an example of the configuration of an encoder according to the present embodiment. In encoder 800 in FIG. 37, coding rate setting section 810 outputs a coding rate to control section 820, parity computing section 830 and parity computing section 840.

When coding rate setting section 810 designates coding rates 1/2, 2/3, 3/4 and 4/5, control section 820 performs control so that information is not inputted to parity computing section 840. Furthermore, when coding rate 1/3 is set, control section 820 performs control so that the same information as the information inputted to parity computing section 830 is inputted to parity computing section 840.

Parity computing section 830 is an encoder that obtains parity of coding rates 1/2, 2/3, 3/4 and 4/5 defined by equation 44-i, equation 45-i, equation 46-i and equation 47-i (i=1, 2, 3).

When coding rate setting section 810 designates coding rates 1/2, 2/3, 3/4 and 4/5, parity computing section 830 performs encoding based on the corresponding parity check polynomials and outputs parity.

When coding rate setting section 810 designates coding rate 1/3, parity computing section 830 performs encoding based on the parity check polynomials of an LDPC-CC of a coding rate of 1/2 (defined by equation 44-1, equation 44-2, equation 44-3) and of a time varying period of 3 and outputs parity P.

Parity computing section 840 is an encoder that obtains parity of a coding rate of 1/2. When coding rate setting section 810 designates coding rates 1/2, 2/3, 3/4 and 4/5, parity computing section 840 does not output parity.

When coding rate setting section 810 designates coding rate 1/3, parity computing section 840 receives the same information as the information inputted to parity computing section 830 as input, performs encoding based on the parity check polynomials of an LDPC-CC of a coding rate of 1/2 and a time varying period of 3 and outputs parity Pa.

Thus, since encoder 800 outputs information, parity P and parity Pa, encoder 800 can support coding rate 1/3.

Figure 38:
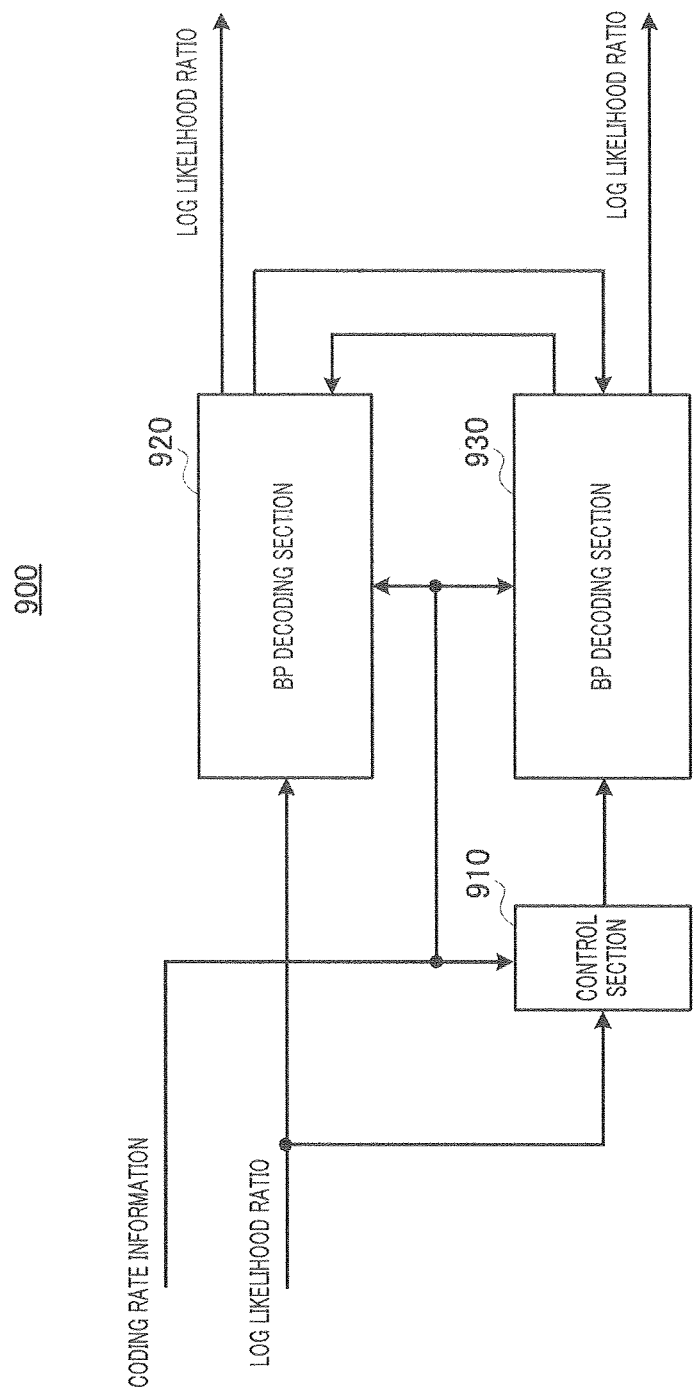
FIG. 38 is a block diagram showing the main configuration of a decoder according to Embodiment 7.

FIG. 38 is a block diagram showing an example of the configuration of a decoder according to the present embodiment. Decoder 900 in FIG. 38 is a decoder corresponding to encoder 800 in FIG. 37.

Control section 910 receives coding rate information indicating a coding rate and a log likelihood ratio as input and performs control so that when the coding rate is 1/2, 2/3, 3/4 or 4/5, the log likelihood ratio is not inputted to BP decoding section 930. Furthermore, when the coding rate is 1/3, control section 910 performs control so that the same log likelihood ratio as the log likelihood ratio inputted to BP decoding section 920 is inputted to BP decoding section 930.

BP decoding section 920 operates at all coding rates. To be more specific, when the coding rate is 1/3, BP decoding section 920 performs BP decoding using the parity check polynomial of a coding rate of 1/2 used in parity computing section 830. Furthermore, when the coding rate is 1/3, BP decoding section 920 outputs a log likelihood ratio corresponding to each bit obtained by BP decoding to BP decoding section 930. On the other hand, when the coding rate is 1/2, 2/3, 3/4 or 4/5, BP decoding section 920 performs BP decoding using the parity check polynomial of coding rate 1/2, 2/3, 3/4 or 4/5 used in parity computing section 830. BP decoding section 920 performs iterative decoding a predetermined number of times and then outputs the log likelihood ratio obtained.

BP decoding section 930 operates only when the coding rate is 1/3. To be more specific, BP decoding section 930 performs BP decoding using the parity check polynomial of a coding rate of 1/2 used in parity computing section 840, outputs a log likelihood ratio corresponding to each bit obtained by performing BP decoding to BP decoding section 920, performs iterative decoding a predetermined number of times and then outputs a log likelihood ratio obtained.

Thus, decoder 900 performs iterative decoding while switching between log likelihood ratios, performs decoding such as turbo decoding and performs decoding at a coding rate of 1/3.

Embodiment 8

Embodiment 2 has described an encoder that creates an LDPC-CC of a time varying period of g (g is a natural number) supporting a plurality of coding rates of (r−1)/r (r is an integer equal to or greater than 2 and less than q). The present embodiment shows a configuration example of another encoder that creates an LDPC-CC of a time varying period of g (g is a natural number) supporting a plurality of coding rates of (r−1)/r (r is an integer equal to or greater than 2 and less than q).

Figure 39:
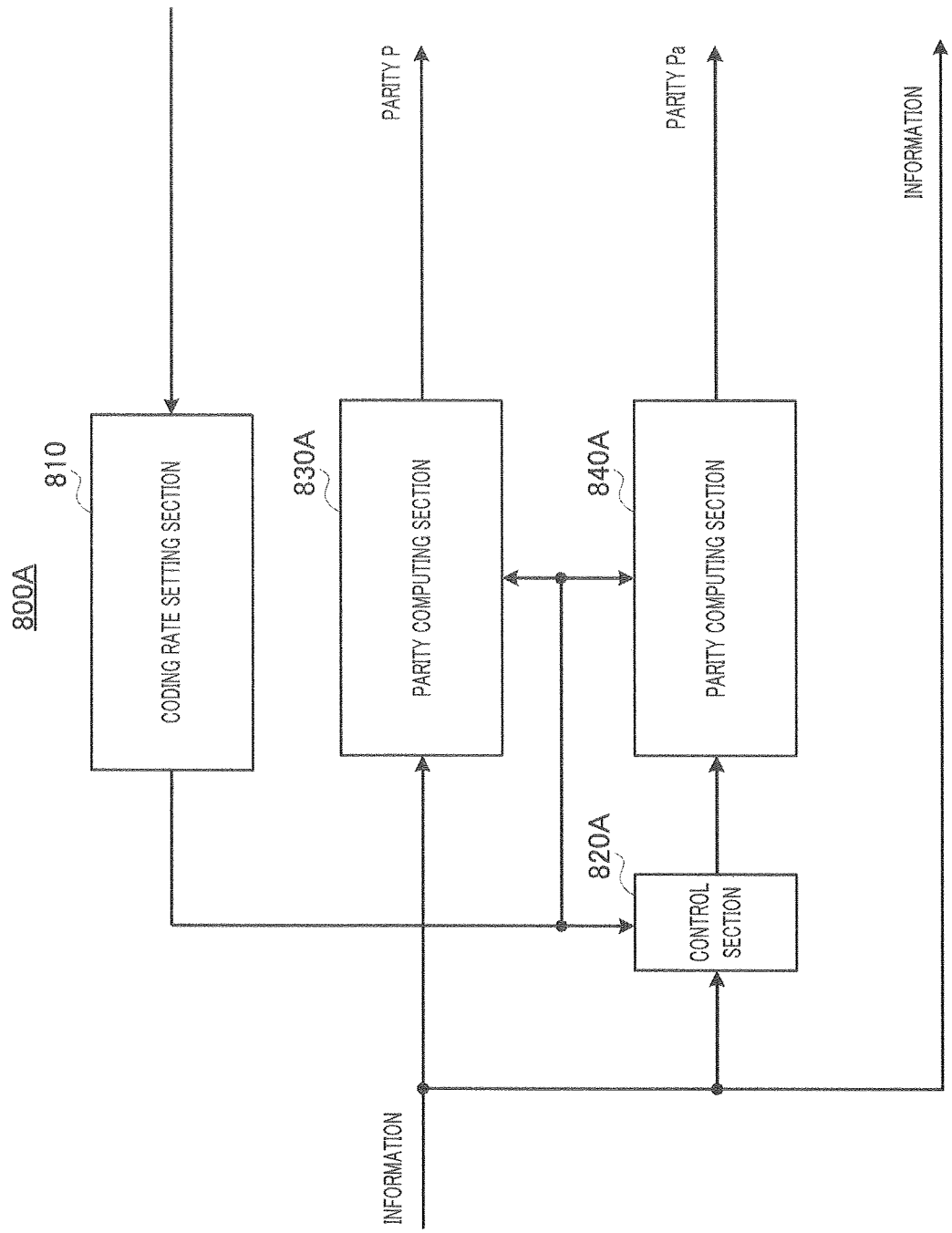
FIG. 39 is a block diagram showing the main configuration of an encoder according to Embodiment 8 of the present invention.

FIG. 39 is a configuration example of an encoder according to the present embodiment. In the encoder in FIG. 39, components common to those in FIG. 37 are assigned the same reference numerals as those in FIG. 37 and descriptions thereof will be omitted.

In encoder 800 in FIG. 37, parity computing section 830 is an encoder that obtains parity of a coding rate of 1/2, 2/3, 3/4 or 4/5 and parity computing section 840 is an encoder that obtains parity of a coding rate of 1/2, while in encoder 800A in FIG. 39, both parity computing section 830A and parity computing section 840A perform encoding of an LDPC-CC of a coding rate of 2/3 and a time varying period of 3, and parity computing section 830A and parity computing section 840A are codes defined by different parity check polynomials.

When coding rate setting section 810 designates coding rate 2/3, control section 820A performs control so that information is not inputted to parity computing section 840A. Furthermore, when coding rate 1/2 is set, control section 820A performs control so that the same information as the information inputted to parity computing section 830A is inputted to parity computing section 840A.

Parity computing section 830A is an encoder that obtains parity of a coding rate of 2/3 defined, for example, by equation 45-1, equation 45-2 and equation 45-3. When coding rate setting section 810 designates coding rates 1/2 and 2/3, parity computing section 830A outputs parity P.

Parity computing section 840A is an encoder that obtains parity of a coding rate of 2/3 defined by a parity check polynomial different from that of parity computing section 830A. Parity computing section 840A outputs parity Pa only when coding rate setting section 810 designates coding rate 1/2.

Thus, when coding rate 1/2 is designated, encoder 800A outputs parity P and parity Pa for two information bits, and therefore encoder 800A can realize coding rate 1/2.

It goes without saying that in FIG. 39, the coding rates of parity computing section 830A and parity computing section 840A are not limited to 2/3, but the coding rates can also be 3/4, 4/5, . . . , as long as parity computing section 830A and parity computing section 840A have the same coding rate.

The embodiments of the present invention have been described so far. The invention relating to the LDPC-CC described in Embodiment 1 to Embodiment 4 and the invention relating to the relationship between the information size and termination size described in the embodiments from Embodiment 5 onward hold true independently of each other.

Furthermore, the present invention is not limited to the above-described embodiments, and can be implemented with various changes. For example, although cases have been mainly described above with embodiments where the present invention is implemented with an encoder and decoder, the present invention is not limited to this, and is applicable to cases of implementation by means of a power line communication apparatus.

It is also possible to implement the encoding method and decoding method as software. For example, provision may be made for a program that executes the above-described encoding method and communication method to be stored in ROM (Read Only Memory) beforehand, and for this program to be run by a CPU (Central Processing Unit).

Provision may also be made for a program that executes the above-described encoding method and decoding method to be stored in a computer-readable storage medium, for the program stored in the storage medium to be recorded in RAM (Random Access Memory) of a computer, and for the computer to be operated in accordance with that program.

It goes without saying that the present invention is not limited to radio communication, and is also useful in power line communication (PLC), visible light communication, and optical communication.

The disclosure of Japanese Patent Application No. 2009-048535, filed on Mar. 2, 2009, including the specification, drawings and abstract, is incorporated herein by reference in its entirety.

INDUSTRIAL APPLICABILITY

The encoder, decoder and encoding method according to the present invention allow, even when performing termination, the encoder and decoder using an LDPC-CC to prevent deterioration of error correction capability and avoid deterioration of information transmission efficiency.

REFERENCE SIGNS LIST

| | |
|---|---|
| 100 | LDPC-CC encoder |
| 110 | Data computing section |
| 120, 230, 632, 830, 830A, 840, 840A | Parity computing section |
| 130, 260 | Weight control section |
| 140 | mod 2 adder |
| 111-1 to 111-M, 121-1 to 121-M, 221-1 to 221-M, 231-1 to 231-M | Shift register |
| 112-0 to 112-M, 122-0 to 122-M, 222-0 to 222-M, 232-0 to 232-M | Weight multiplier |
| 200, 630, 630A, 800, 800A | Encoder |
| 210 | Information generating section |
| 220-1 | First information computing section |
| 220-2 | Second information computing section |
| 220-3 | Third information computing section |
| 240 | Adder |
| 250, 610, 810 | Coding rate setting section |
| 300, 720, 900 | Decoder |
| 310 | Log likelihood ratio setting section |
| 320 | Matrix processing computing section |
| 321 | Storage section |
| 322 | Row processing computing section |
| 323 | Column processing computing section |
| 400, 500, 600, 600A, 700, 700A | Communication apparatus |
| 410 | Coding rate determining section |
| 420, 640 | Modulating section |
| 510 | Receiving section |
| 520 | Log likelihood ratio generating section |
| 530, 710 | Control information generating section |
| 620 | Transmission information generation and information length detection section |
| 631 | Termination sequence length determining section |
| 633, 730 | Coding rate adjusting section |
| 820, 820A, 910 | Control section |
| 920, 930 | BP decoding section |

The invention claimed is:

1. A transmission apparatus that generates parity bits by an encoding operation using a low density parity check convolutional code (LDPC-CC) on an information sequence made up of a plurality of bits and first known information to be added to the information sequence, the transmission apparatus comprising:

a memory that stores a program; and a processor that, when executing the program stored in the memory, performs processes including:

receiving a signal from a communication apparatus;

when the received signal includes a communication request from the communication apparatus, transmitting second known information;

when the received signal includes information with respect to the communication apparatus, determining, based on a sequence length of the information sequence and the information with respect to the communication apparatus, a sequence length of a first parity sequence generated using the first known information, of the parity bits;

adding the first known information to the information sequence based on the determined sequence length of the first parity sequence;

generating the parity bits by the encoding operation using the LDPC-CC; and transmitting a transmission frame including the information sequence, the parity bits generated by the encoding operation, and a coding rate used for the encoding operation, wherein the determined sequence length of the first parity sequence has a different sequence length for each predetermined range of the sequence length of the information sequence.

2. The transmission apparatus according to claim 1, wherein the first known information comprises zero information.

3. The transmission apparatus according to claim 1, wherein said determining the sequence length of the first parity sequence includes determining one sequence length as the sequence length of the first parity sequence, is determined for each predetermined range of the sequence length of the information sequence.

4. The transmission apparatus according to claim 1, wherein said determining the sequence length of the first parity sequence includes determining a shorter sequence length as the sequence length of the first parity sequence, as the sequence length of the information sequence is longer.

5. A transmission method that generates parity bits by an encoding operation using a low density parity check convolutional code (LDPC-CC) on an information sequence made up of a plurality of bits and first known information to be added to the information sequence, the transmission method comprising:

receiving a signal from a communication apparatus;

when the received signal includes a communication request from the communication apparatus, transmitting second known information;

when the received signal includes information with respect to the communication apparatus, determining, based on a sequence length of the information sequence and the information with respect to the communication apparatus, a sequence length of a first parity sequence generated using the first known information, of the parity bits;

adding the first known information to the information sequence based on the determined sequence length of the first parity sequence;

generating the parity bits by the encoding operation using the LDPC-CC; and transmitting a transmission frame including the information sequence, the parity bits generated by the encoding operation, and a coding rate used for the encoding operation, wherein the determined sequence length of the first parity sequence has a different sequence length for each predetermined range of the sequence length of the information sequence.

6. The transmission method according to claim 5, wherein the first known information comprises zero information.

7. The transmission method according to claim 5, wherein said determining the sequence length of the first parity sequence includes determining one sequence length as the sequence length of the first parity sequence, for each predetermined range of the sequence length of the information sequence.

8. The transmission method according to claim 5, wherein said determining the sequence length of the first parity sequence includes determining a shorter sequence length as the sequence length of the first parity sequence, as the sequence length of the information sequence is longer.

* * * * *